(12) United States Patent
Ng et al.

(10) Patent No.: US 11,398,476 B2
(45) Date of Patent: Jul. 26, 2022

(54) STRUCTURE AND FORMATION METHOD OF SEMICONDUCTOR DEVICE WITH HYBRID FINS

(71) Applicant: TAIWAN SEMICONDUCTOR MANUFACTURING CO., LTD., Hsinchu (TW)

(72) Inventors: Jin-Aun Ng, Hsinchu (TW); Kuo-Cheng Chiang, Hsinchu (TW); Hung-Li Chiang, Hsinchu (TW); Tzu-Chiang Chen, Hsinchu (TW); I-Sheng Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 178 days.

(21) Appl. No.: 16/728,719

(22) Filed: Dec. 27, 2019

(65) Prior Publication Data

US 2020/0135729 A1   Apr. 30, 2020

Related U.S. Application Data

(63) Continuation-in-part of application No. 15/981,167, filed on May 16, 2018, now Pat. No. 10,756,089.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823412* (2013.01); *H01L 21/823431* (2013.01);
(Continued)

(58) Field of Classification Search
CPC ..... H01L 21/823412; H01L 21/823431; H01L 21/823807; H01L 21/823814;
(Continued)

(56) References Cited

U.S. PATENT DOCUMENTS 8,580,624 B2   11/2013   Bangsaruntip et al.
8,722,472 B2   5/2014   Chang et al.
(Continued)

FOREIGN PATENT DOCUMENTS

TW   I539499 B   6/2016

OTHER PUBLICATIONS

US Office Action for U.S. Appl. No. 15/981,167, dated Mar. 26, 2020.
(Continued)

*Primary Examiner* — Matthew G Landau
*Assistant Examiner* — Dmitriy Yemelyanov
(74) *Attorney, Agent, or Firm* — Birch, Stewart, Kolasch & Birch, LLP

(57) ABSTRACT

A structure and a formation method of a semiconductor device are provided. The semiconductor device structure includes a semiconductor substrate and an isolation structure over the semiconductor substrate. The semiconductor device structure also includes a first fin structure over the semiconductor substrate and surrounded by the isolation structure and a stack of nanostructures over the first fin structure. The nanostructures are separated from each other. The semiconductor device structure further includes a second fin structure over the semiconductor substrate. The second fin structure has an embedded portion surrounded by the isolation structure and a protruding portion over the isolation structure. The embedded portion is separated from the protruding portion by a distance.

20 Claims, 37 Drawing Sheets

(51) Int. Cl.
*H01L 27/092* (2006.01)
*H01L 21/8238* (2006.01)

(52) U.S. Cl.
CPC ........... *H01L 21/823807* (2013.01); *H01L 21/823814* (2013.01); *H01L 21/823821* (2013.01); *H01L 27/0924* (2013.01)

(58) Field of Classification Search
CPC ......... H01L 21/823821; H01L 27/0886; H01L 27/0924; H01L 29/42392; H01L 29/78696
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,209,247 B2 | 12/2015 | Colinge et al. |
| 9,214,555 B2 | 12/2015 | Oxland et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,576,814 B2 | 2/2017 | Wu et al. |
| 9,608,116 B2 | 3/2017 | Ching et al. |
| 10,297,667 B1* | 5/2019 | Yeung ................ H01L 29/0665 |
| 2009/0289304 A1 | 11/2009 | Pouydebasque et al. |
| 2013/0043512 A1 | 2/2013 | Huang et al. |
| 2013/0153993 A1 | 6/2013 | Chang et al. |
| 2015/0340438 A1 | 11/2015 | Zhu |
| 2016/0005738 A1 | 1/2016 | Liu et al. |
| 2016/0204131 A1 | 7/2016 | Cheng et al. |
| 2016/0204195 A1* | 7/2016 | Wen ................... H01L 29/66439 257/347 |
| 2017/0011969 A1 | 1/2017 | Leobandung et al. |
| 2017/0104061 A1 | 4/2017 | Peng et al. |
| 2018/0366375 A1* | 12/2018 | Chen ................ H01L 29/66439 |

OTHER PUBLICATIONS

U.S. Office Action for U.S. Appl. No. 16/688,047, dated Oct. 6, 2021.

* cited by examiner

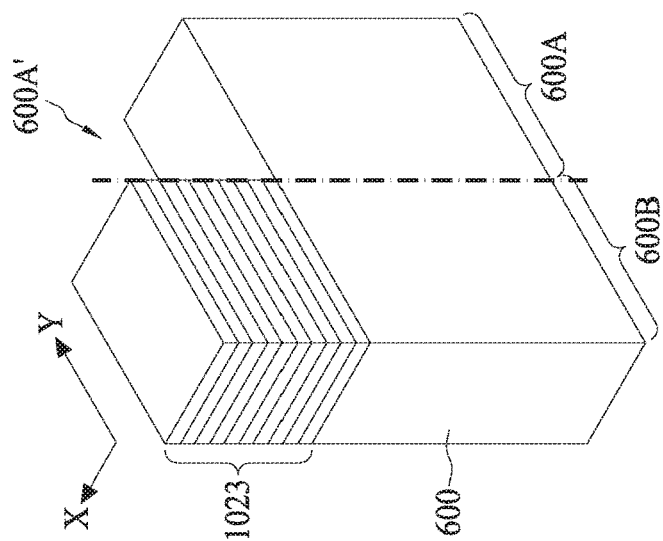
FIG. 7A
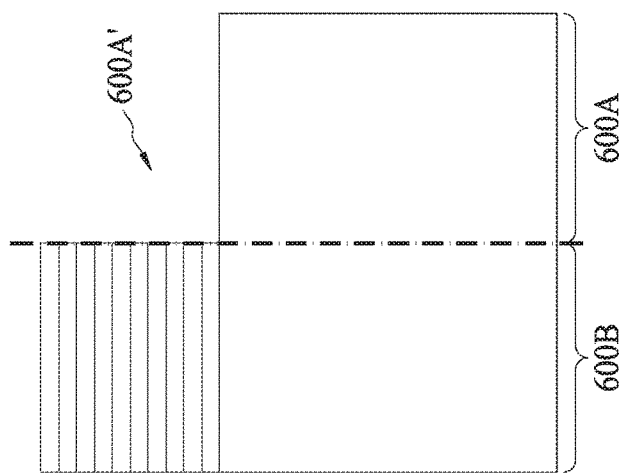
FIG. 7B
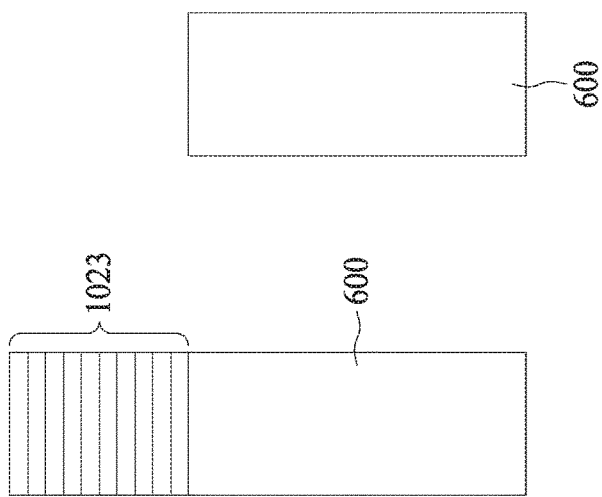
FIG. 7C
FIG. 7D

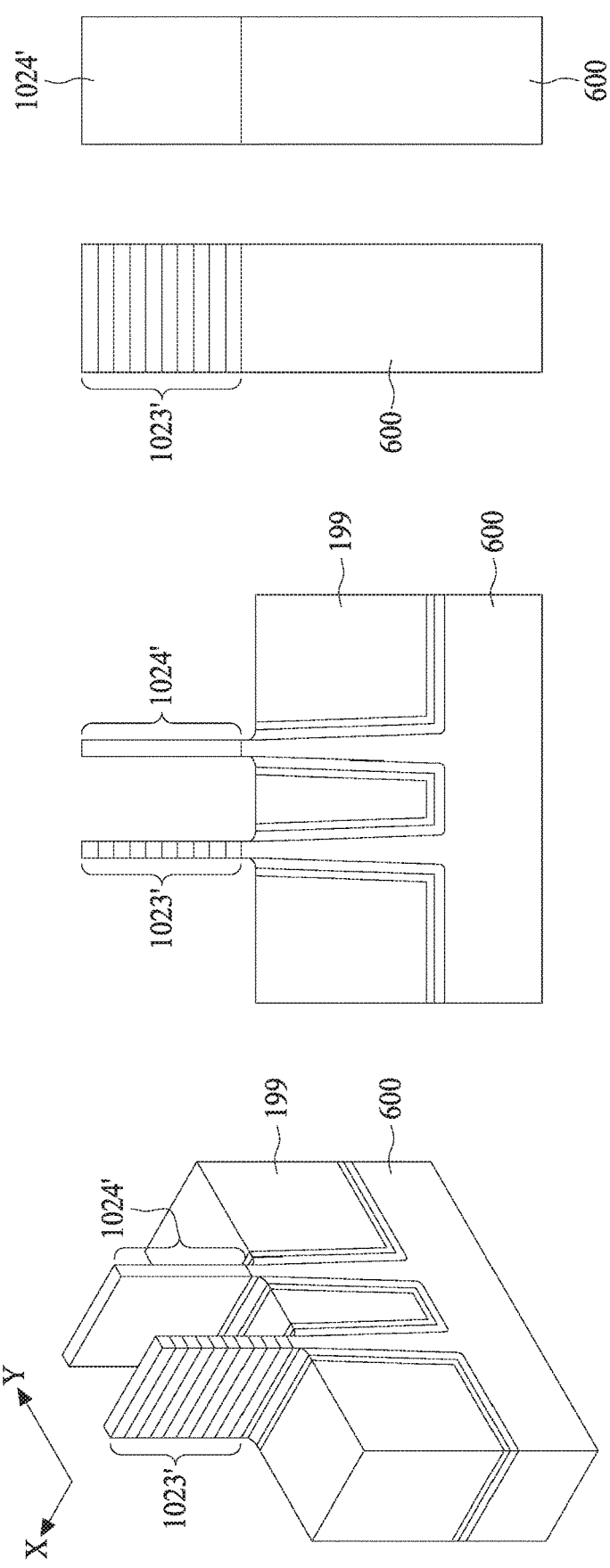

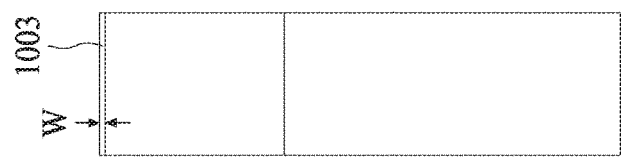
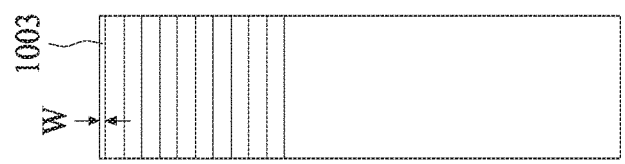
FIG. 10C  FIG. 10D
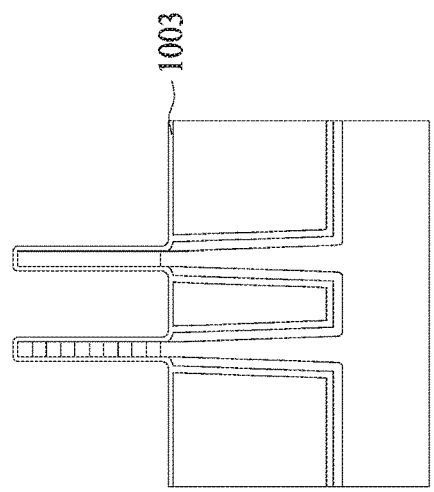
FIG. 10B
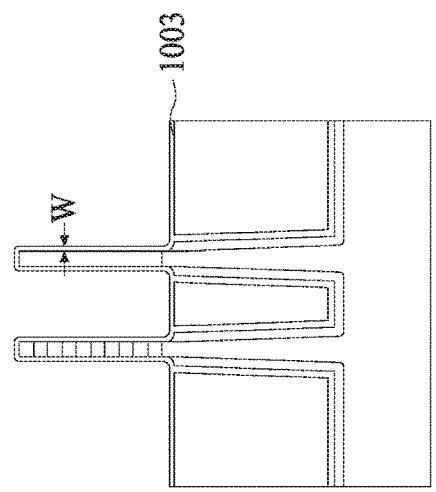
FIG. 10B'
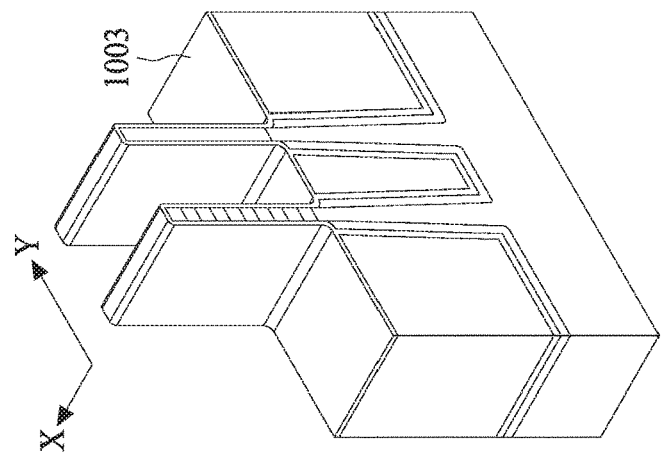
FIG. 10A

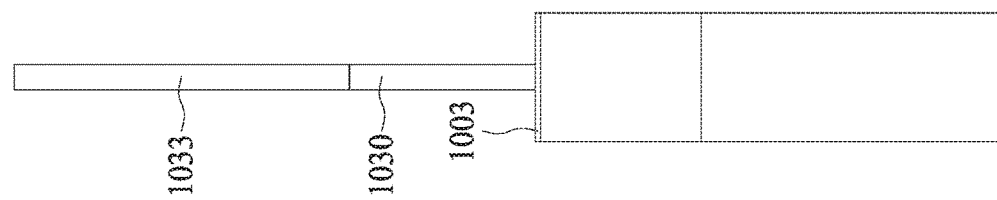
FIG. 11D
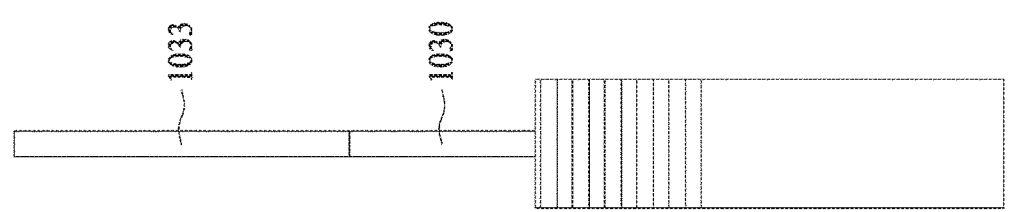
FIG. 11C
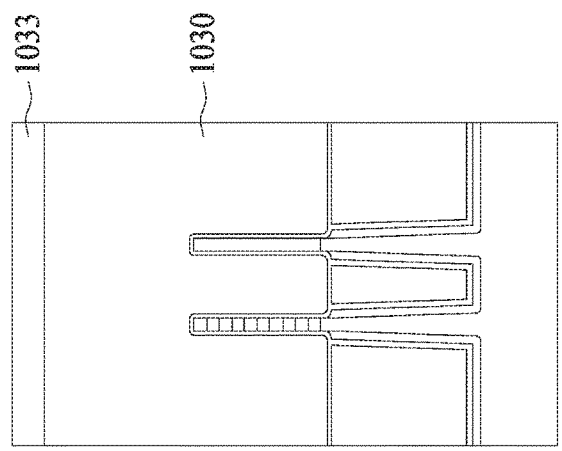
FIG. 11B          FIG. 11B'
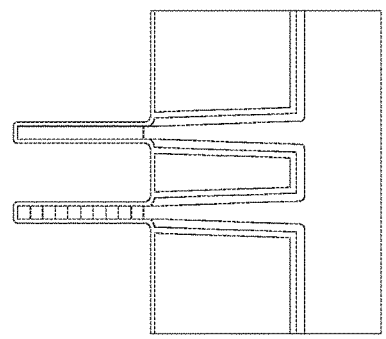
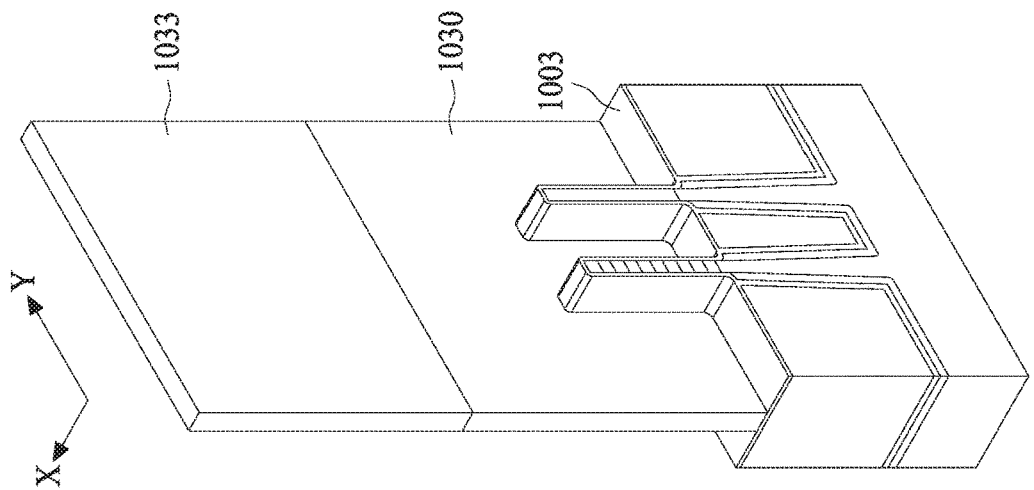
FIG. 11A

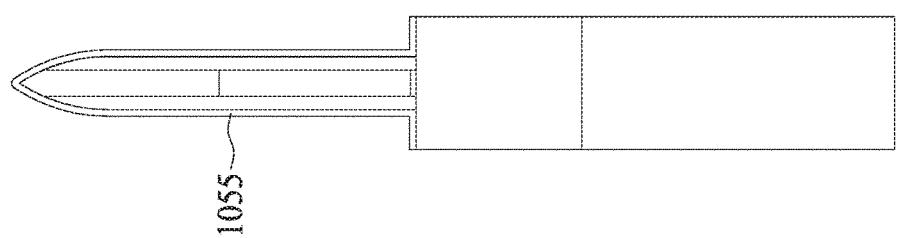
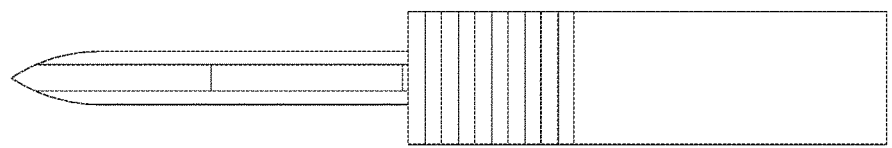
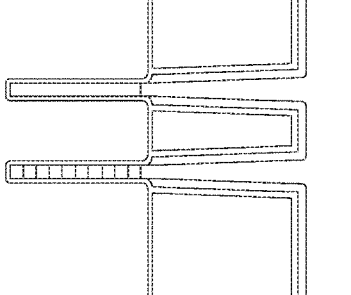 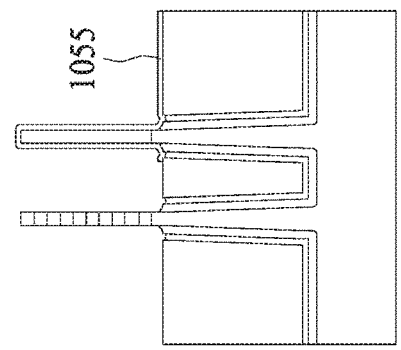
FIG. 13B  FIG. 13B'
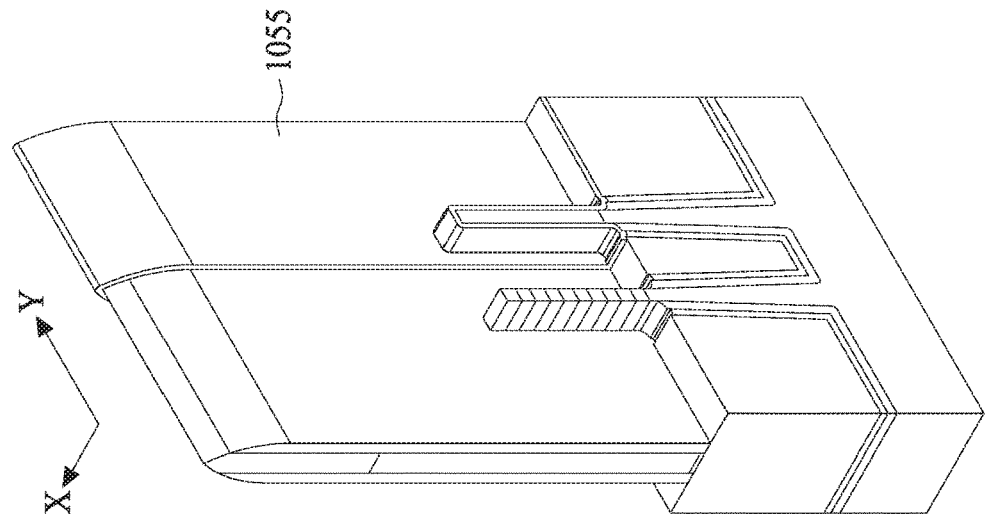
FIG. 13A

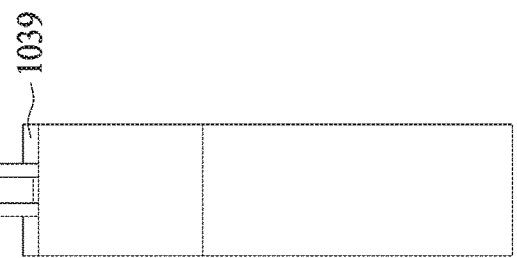
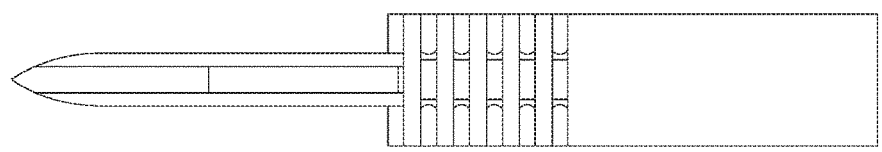
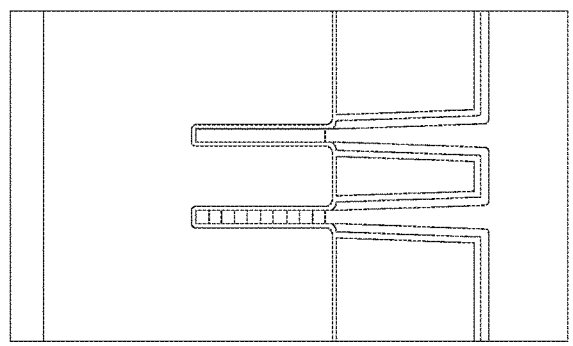
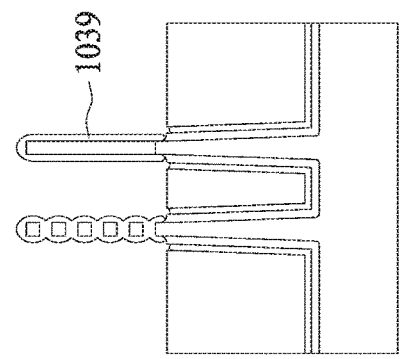
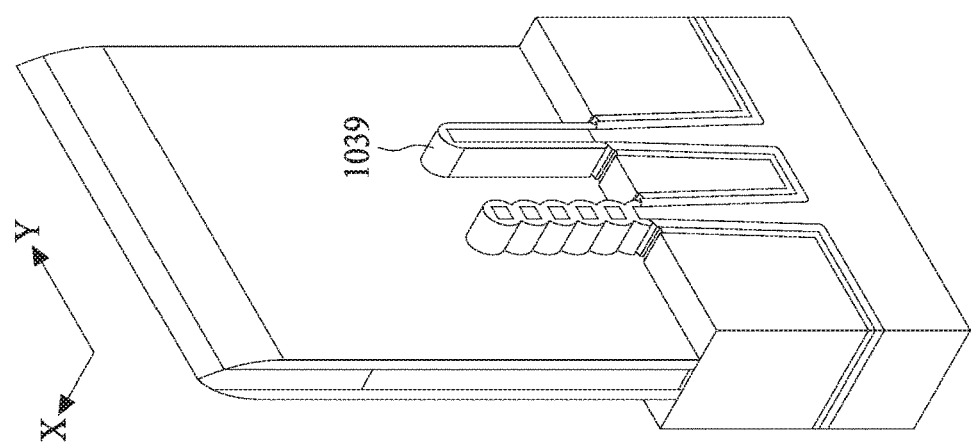
FIG. 17A  FIG. 17B  FIG. 17B'  FIG. 17C  FIG. 17D

FIG. 24D
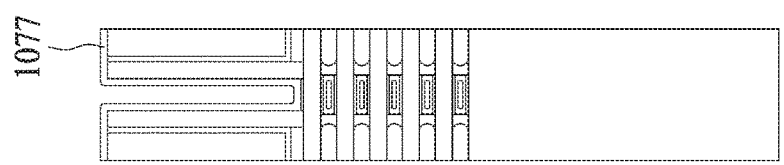
FIG. 24C
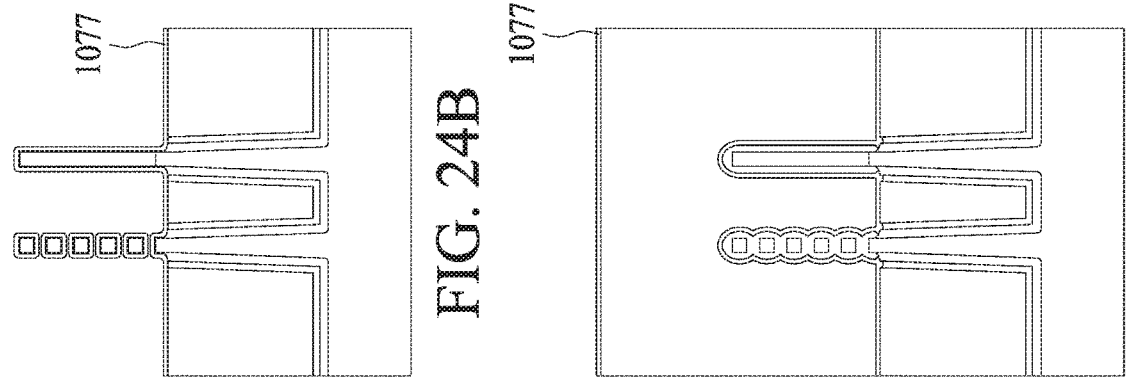
FIG. 24B
FIG. 24B'
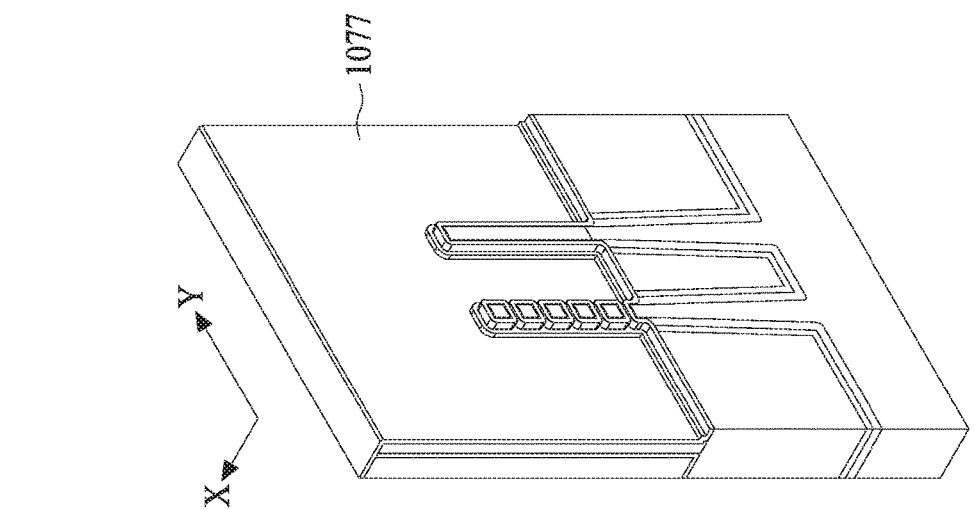
FIG. 24A

US 11,398,476 B2

STRUCTURE AND FORMATION METHOD OF SEMICONDUCTOR DEVICE WITH HYBRID FINS

PRIORITY CLAIM AND CROSS-REFERENCE

This Application is a Continuation-In-Part of U.S. patent application Ser. No. 15/981,167, filed on May 16, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7A-7D are various views of a type of hybrid semiconductor structure during an intermediate stage of manufacturing operations, in accordance with some embodiments of the present disclosure.

FIG. 9A-9D are various views of a type of hybrid semiconductor structure during an intermediate stage of manufacturing operations, in accordance with some embodiments of the present disclosure.

FIG. 10A-10D are various views of a type of hybrid semiconductor structure during an intermediate stage of manufacturing operations, in accordance with some embodiments of the present disclosure.

FIG. 11A-11D are various views of a type of hybrid semiconductor structure during an intermediate stage of manufacturing operations, in accordance with some embodiments of the present disclosure.

FIG. 13A-13D are various views of a type of hybrid semiconductor structure during an intermediate stage of manufacturing operations, in accordance with some embodiments of the present disclosure.

FIG. 17A-17D are various views of a type of hybrid semiconductor structure during an intermediate stage of manufacturing operations, in accordance with some embodiments of the present disclosure.

FIG. 24A-24D are various views of a type of hybrid semiconductor structure during an intermediate stage of manufacturing operations, in accordance with some embodiments of the present disclosure.

DETAILED DESCRIPTION

Figure 1:
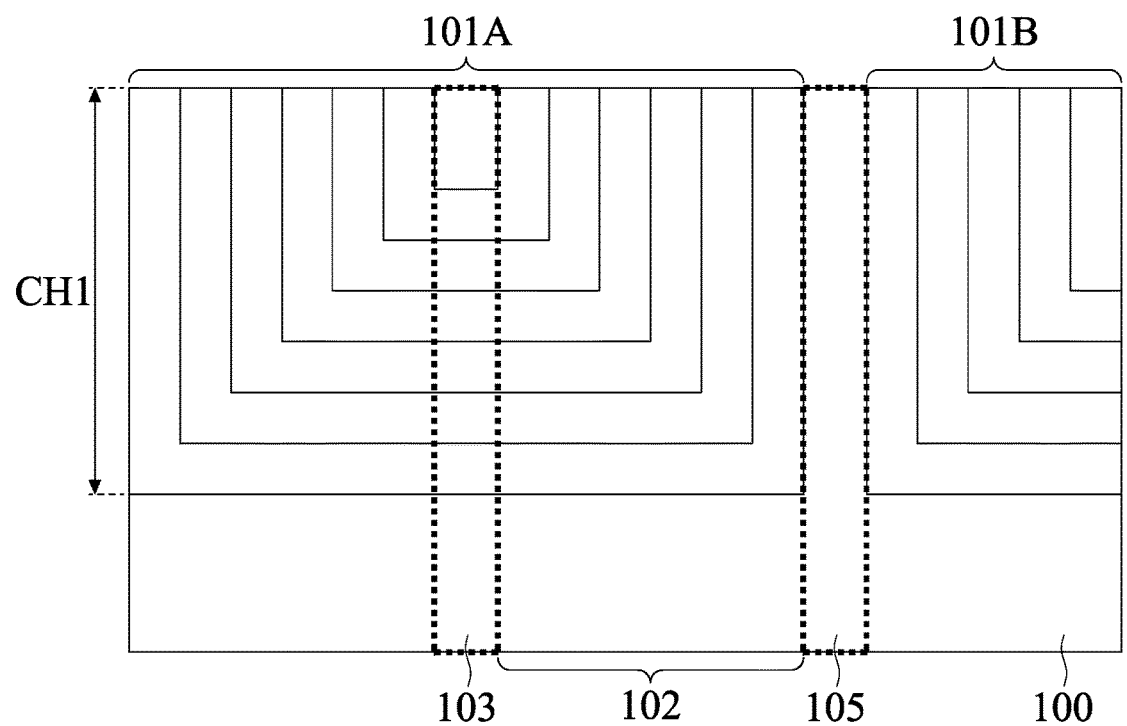
FIG. 1 is a cross section view showing a type of the hybrid design at an intermediate manufacturing stage.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned by any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers may be formed alongside the patterned sacrificial layer using a self-aligned process. The sacrificial layer is then removed, and the remaining spacers may then be used to pattern the GAA structure.

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

Multiple gate field-effect transistors (MuGFETs) are a recent development in semiconductor technology which typically is metal oxide semiconductor FETs (MOSFETs) that incorporate more than one gate into a single device. One type of MuGFET is referred to as a FinFET, which is a transistor structure with a fin-like semiconductor channel that is raised vertically away from a substrate of an integrated circuit. A recent design for FinFETs is a gate all around (GAA) FinFET, which has a gate material that surrounds a channel region on all sides.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

A hybrid design of the MuGFETs includes a FET of a first conductive type being a FinFET, and at least another FET of a second conductive type being a GATE-ALL-AROUND structure. Referring to FIG. 1, FIG. 1 shows a type of the hybrid design at an intermediate manufacturing stage. A stacked epitaxy region 101A is spaced from an adjacent stacked epitaxy region 101B. Due to the fact that any of the stacked epitaxy region 101A and 101B is formed in a trench recessed from a substrate 100, the deposited epitaxy films would take on the contour of the trench and appear to be a U-shaped stack. For example, the region 103 surrounded by the dotted line turns out to be an n-FET and the region 105 surrounded by the dotted line turns out to be a p-FET in subsequent operations. It is observed that the spacing between the n-FET and the p-FET, which is called an n/p boundary 102, is occupied by the vertical stacks of the epitaxy films or the epitaxy films grown on the sidewall of the trench. The hybrid structure illustrated in FIG. 1 faces a problem of area penalty caused by the existence of n/p boundary 102. For example, the n/p boundary 102 of FIG. 1 can be about the same magnitude as the channel height CH1, such as from about 50 nm to about 80 nm. The n/p boundary 102 reduction cannot be alleviated by advanced alignment or lithography techniques because it is limited by the geometry of the trench.

Figure 2A:
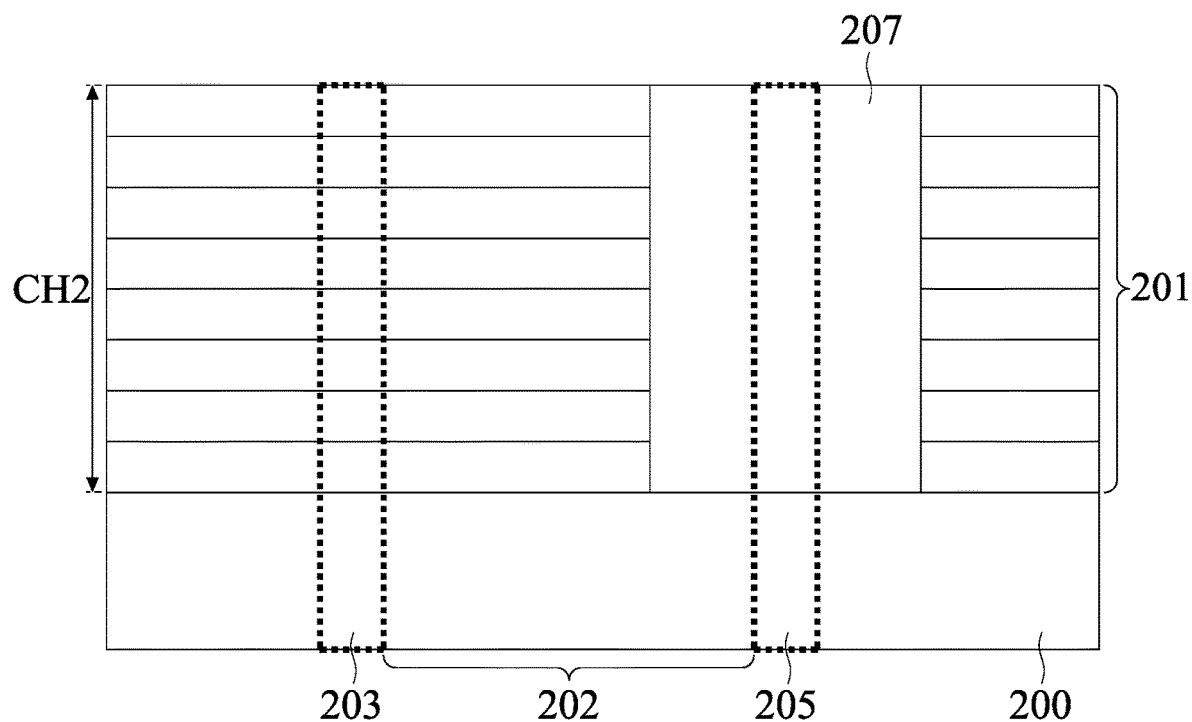
FIG. 2A is a cross sectional view showing a type of hybrid design semiconductor structure during an intermediate stage of manufacturing operations, in accordance with some embodiments of the present disclosure.

Present disclosure provides a new hybrid design of the MuGFET which solves the area penalty caused by the n/p boundary. Referring to FIG. 2A, FIG. 2A shows a type of the hybrid design at an intermediate manufacturing stage, according to some embodiments of present disclosure. In FIG. 2A, no recess is formed in the substrate 200 prior to the formation of the stacked epitaxy 201, hence a horizontal profile of the stacked epitaxy 201 can be obtained. A FinFET well 207 having substantial equal width from top to bottom is regrown in the stacked epitaxy 201. For example, region 203 surrounded by the dotted line turns out to be an n-FET and the region 205 surrounded by the dotted line turns out to be a p-FET in subsequent operations. The spacing between the n-FET and the p-FET, or the n/p boundary 202, can be reduced to an extent dictated by photolithography limit. For example, in the present embodiment, the n/p boundary 202 can be about one-fourth to one-fifth of the channel height CH2, such as from about 10 nm to about 20 nm. In some embodiments, the regrown FinFET well can be disposed in an n-FET of a hybrid design.

Figure 3:
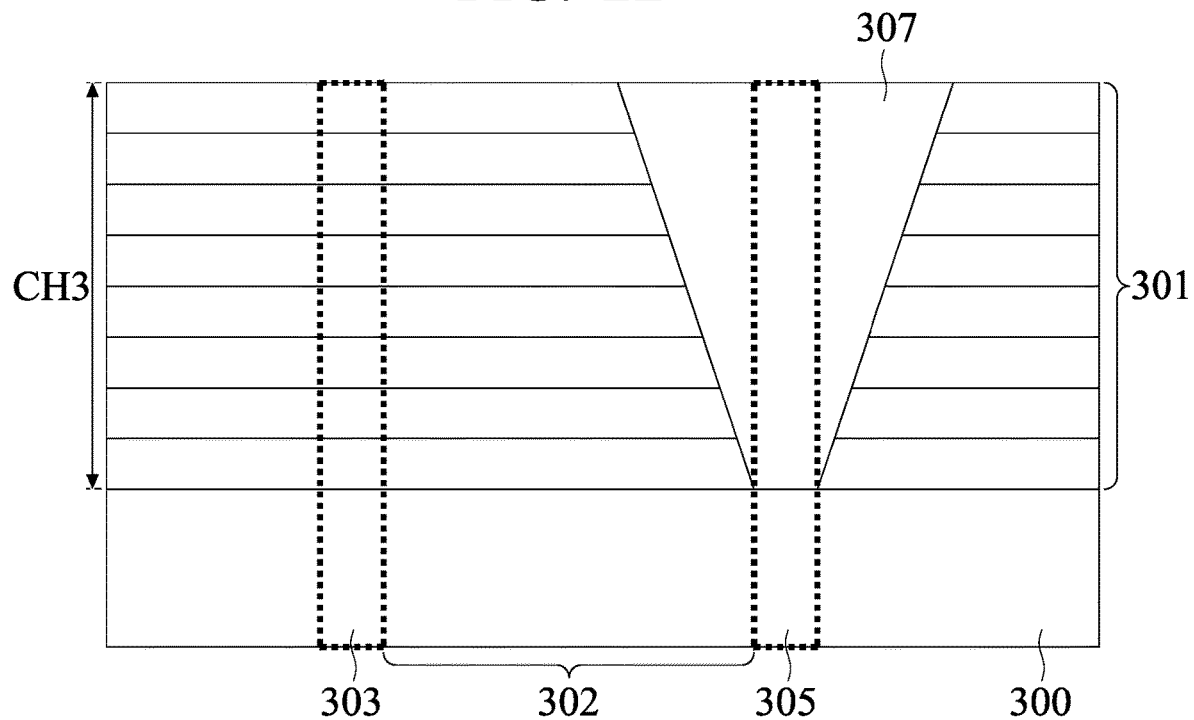
FIG. 3 is a cross sectional view showing a type of hybrid design semiconductor structure during an intermediate stage of manufacturing operations, in accordance with some embodiments of the present disclosure.

Referring to FIG. 3, FIG. 3 shows a type of the hybrid design at an intermediate manufacturing stage, according to some embodiments of present disclosure. In FIG. 3, no recess is formed in the substrate 300 prior to the formation of the stacked epitaxy 301, hence a horizontal profile of the stacked epitaxy 301 can be obtained. A FinFET well 307 having a shape tapering toward the substrate 300, that is, having a wider top and a narrower bottom, is regrown in the stacked epitaxy 301. The tapering shape of the FinFET well 307 can be adopted when the material of the FinFET well 307 and the underlying substrate 300 having different lattice constants and thus inducing mismatch stress. The tapering shape of the FinFET well 307 can foster the relaxation at the lattice mismatch interface and thus obtaining a strain free FinFET well 307. Region 303 surrounded by the dotted line turns out to be an n-FET and the region 305 surrounded by the dotted line turns out to be a p-FET in subsequent operations. The spacing between the n-FET and the p-FET, or the n/p boundary 302, can be reduced to an extent dictated by photolithography limit. For example, in the present embodiment, the n/p boundary 302 can be about one-fourth to one-fifth of the channel height CH3, such as from about 10 nm to about 20 nm. In some embodiments, the regrown FinFET well can be disposed in an n-FET of a hybrid design.

Figure 2B:
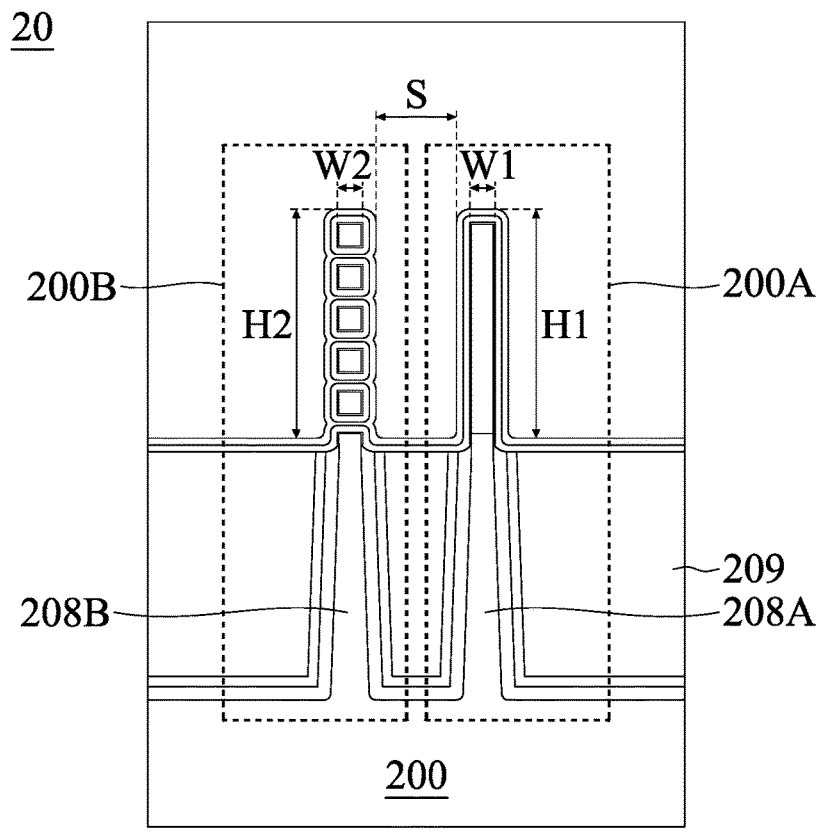
FIG. 2B is a cross sectional view of a gate region of a hybrid semiconductor transistor region, in accordance with some embodiments of the present disclosure.

Referring to FIG. 2B, FIG. 2B is a cross section dissecting at a gate region of a hybrid semiconductor transistor structure 20, according to some embodiments of the present disclosure. As shown in FIG. 2B, the structure 20 includes a substrate 200, and at least a first transistor 200A and a second transistor 200B. The first transistor 200A has a first channel height H1 measured at a portion of a first fin 208A protruding from an isolation 209. The second transistor 200B has a second channel height H2 measured at a nanowire portion of a second fin 208B. A separation S laterally spacing the portion of a first fin 208A protruding from an isolation 209 from the nanowire portion of a second fin 208B can be observed in the cross section illustrated in FIG. 2B. In some embodiments, the first channel height H1 is greater than 2 times, 3 times, or 4 times of the separation S. In some embodiments, the second channel height H2 is substantially identical to the first channel height and being greater than the separation S. In some embodiments, for example, under 5 nm technology node and beyond, the first channel height H1 is at least about 50 nm to about 80 nm, and the separation S is less than about 10 to 20 nm.

As shown in FIG. 2B, the portion of the first fin 208A protruding from the isolation 209 can be composed of material different from that of the portion of the first fin 208A surrounded by the isolation 209. Similarly, the portion of the first fin 208A protruding from the isolation 209 can be composed of material different from that of the substrate 200. In some embodiments, the substrate 200 and the first fin 208A surrounded by the isolation 209 are composed of silicon, whereas the portion of the first fin 208A protruding from the isolation 209 can be composed of silicon germanium or other III-V compounds, depending on the performance requirement of the device. In some embodiments, the portion of the first fin 208A protruding from the isolation 209 is composed of $Si_xGe_{1-x}$, where the X being less than 0.6. Such high germanium content can be obtained by a germanium condensation operation subsequently depicted in FIG. 10A to FIG. 10D or FIG. 20A to FIG. 20D of present disclosure.

In FIG. 2B, the nanowire portion of the second fin 208B can be composed of material identical to the portion of the second fin 208B surrounded by the isolation 209 or material identical to the substrate 200.

In some embodiments, first transistor 200A is a p-FET since hole mobility does not degrade with the reduction of lateral dimension, and the channel region of the p-FET can remain a fin shape with reduced fin width W1. In contrast, the second transistor 200B is an n-FET with gate-all-around channel because the electron mobility being more sensitive to the reduction of lateral dimension, and the channel region of the n-FET is replaced by nanowires having a diameter W2 greater than the fin width W1. Possessing a nanowire channel having a diameter of W2 greatly reduces the leakage current and alleviates short channel effect compared to possessing a fin channel having a fin width of W2. In some embodiments, the fin width W1 can be less than 6 nm and the diameter W2 can be greater than or equal to 6 nm. In some embodiments, the fin width W1 is about 4 nm and the diameter W2 is about 6 nm.

Figure 4:
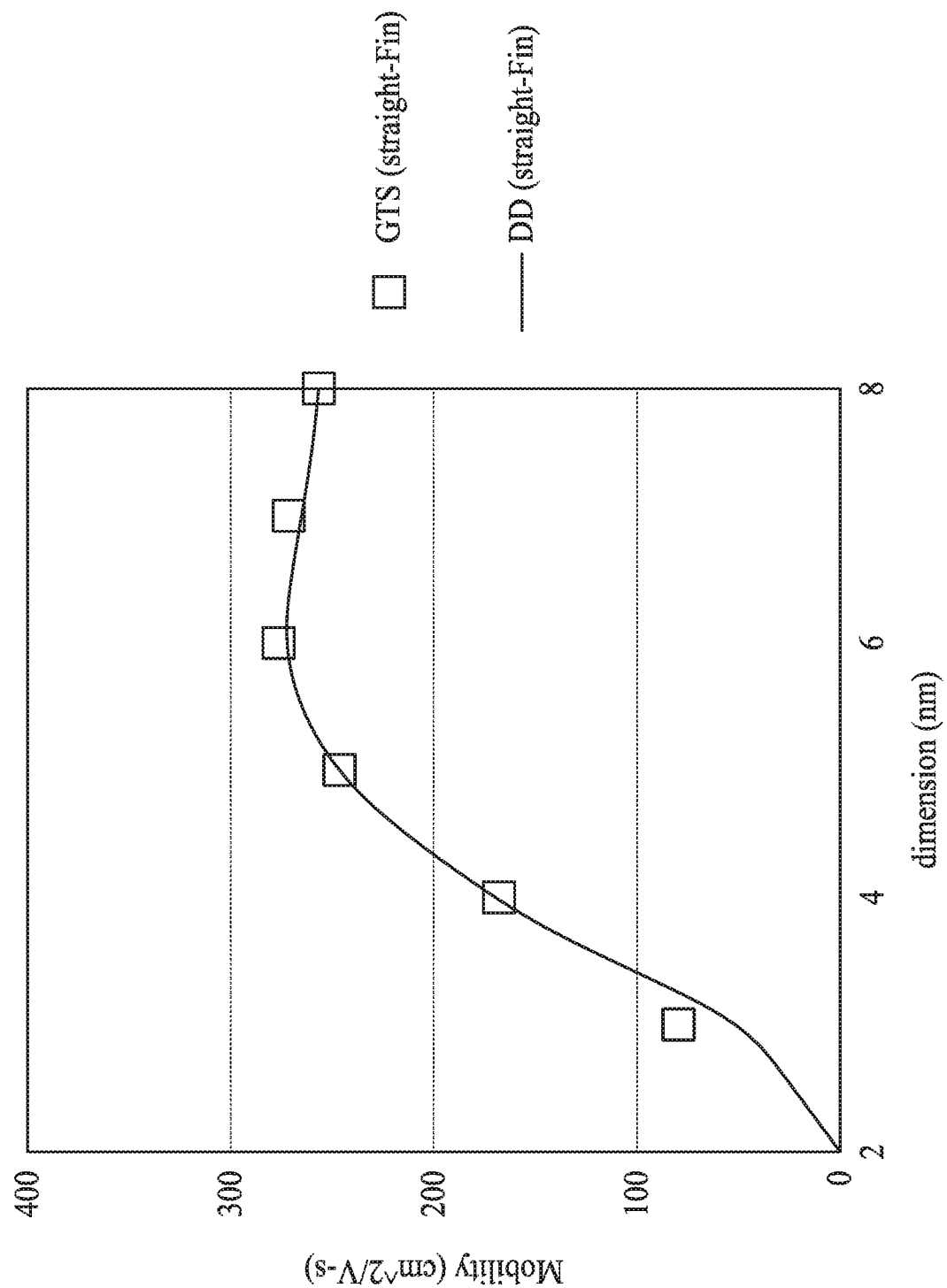
FIG. 4 is a diagram showing a relationship between electron mobility and silicon fin width, in accordance with some embodiments of the present disclosure.

Referring to FIG. 4, FIG. 4 shows a relation between electron mobility and silicon fin width. It is clear that an optimal value for preserving electron mobility is having a fin width of about 6 nm. As previously discussed, the leakage current can be reduced by changing a fin geometry to a nanowire geometry, weighting of the leakage current is reduced when determining the optimal fin width for an n-FET.

Figure 5:
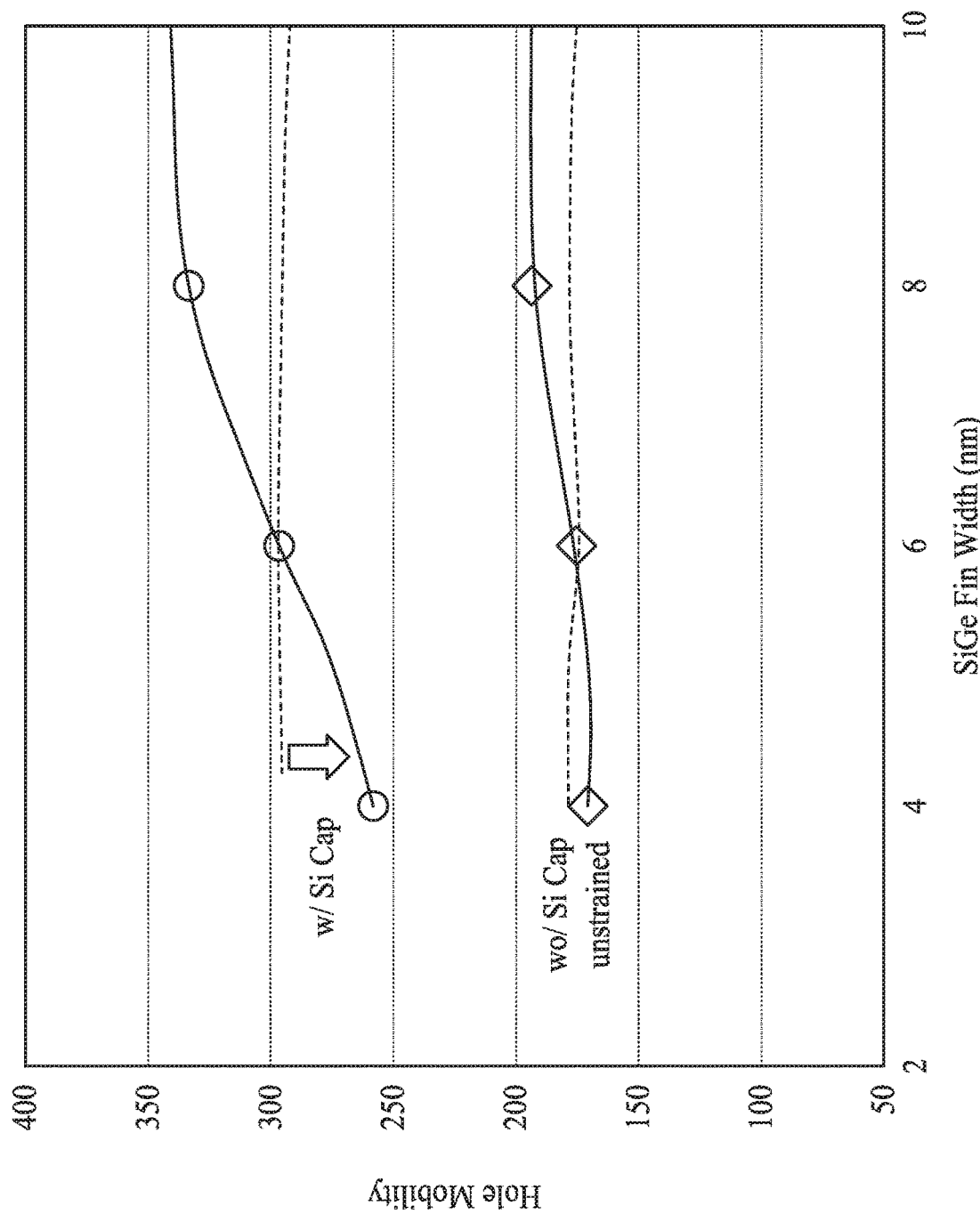
FIG. 5 is a diagram showing a relationship between hole mobility and silicon fin width, in accordance with some embodiments of the present disclosure.

Referring to FIG. 5, FIG. 5 shows a relation between hole mobility and silicon germanium fin width. Under the condition of no silicon cap, which refers to an unstrained status, hole mobility, sits at an average of about 180 cm2/V-s, slightly decreases when the fin width reduces from 8 nm to 4 nm. Under the condition with silicon cap, which refers to a strained status, hole mobility, sits at an average of about 300 cm2/V-s, decreases when the fin width reduces from 8 nm to 4 nm. The strained status better describe the final product of the FinFET because passivation layer over the fin generates moderate amount of stress. Considering preservation of high enough hole mobility as well as reducing leakage current, optimal fin width sits at about 4 nm for a p-FET.

Note that in the art of MuGFET, several material systems including Group III and Group V materials are currently known and shall be encompassed within the contemplated scope of present disclosure. For example, on a silicon substrate, Si nanowire for n-FET and SiGe nanowire for p-FET are normally adopted. On a GaAs substrate, GaAs nanowire for n-FET and InGaAs nanowire for p-FET are normally adopted. On a Ge/GaAs substrate, Ge nanowire for n-FET and GaAs nanowire for p-FET are normally adopted. For brevity purpose, present disclosure provides illustration and the following detailed description in Si nanowire and SiGe nanowire material system only. The same inventive concept can be applied on different semiconductor material systems are addressed.

FIG. 6A to FIG. 25D illustrate different perspectives in intermediate stages of manufacturing of the hybrid semiconductor structure described herein.

Figure 6C:
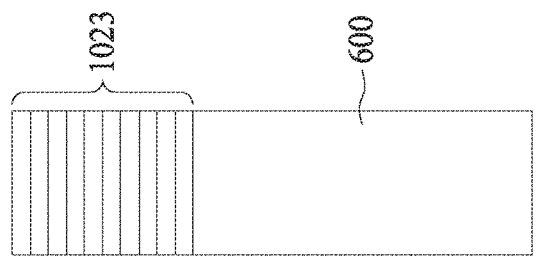
FIG. 6A-6C are various views of a type of hybrid semiconductor structure during an intermediate stage of manufacturing operations, in accordance with some embodiments of the present disclosure.
Figure 6B:
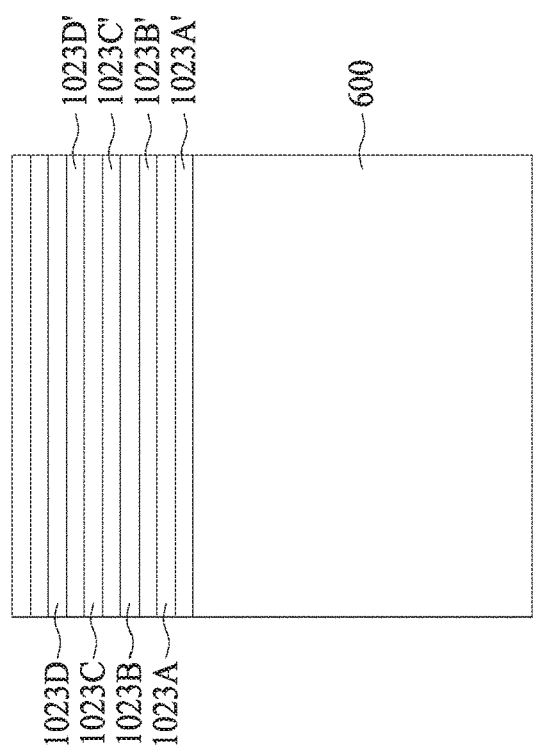
Figure 6A:
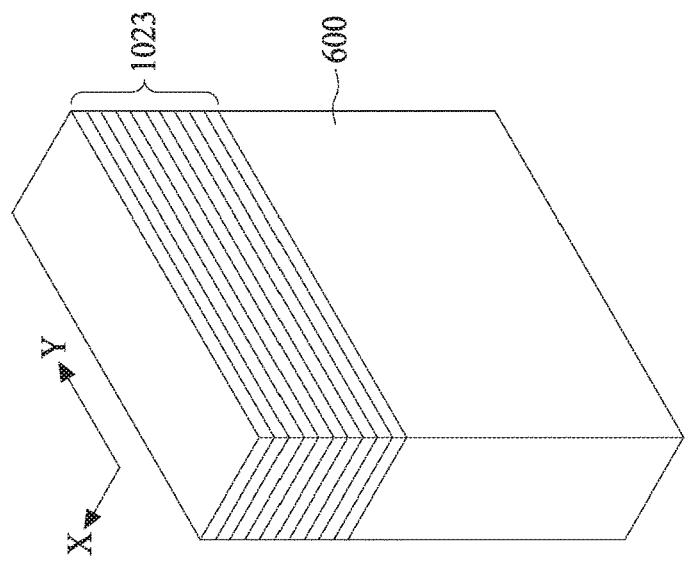

Referring to FIG. 6A to FIG. 6C, a stacked epitaxy 1023 is formed over the substrate 600. In some embodiments, the stacked epitaxy 1023 includes one or more silicon (Si) layers and one or more silicon germanium (SiGe) layers alternatingly disposed above the substrate 600. FIG. 6A is a perspective view, FIG. 6B is a Y-cut cross sectional view, and FIG. 6C is an X-cut cross sectional view. For example, the stacked epitaxy 1023 includes a first silicon germanium layer 1023A', a first silicon layer 1023A, a second silicon germanium layer 1023B', a second silicon layer 1023B, a third silicon germanium layer 1023C', a third silicon layer 1023C, a fourth silicon germanium layer 1023D', and a fourth silicon layer 1023D. It is appreciated that any number of silicon layers or silicon germanium layers can be formed.

Referring to FIG. 7A to FIG. 7D, the substrate 600 includes a first transistor region 600A and a second transistor region 600B. The stacked epitaxy 1023 within the first transistor region 600A is removed, thence a trench 600A' is formed in the stacked epitaxy 1023 and the underlying substrate 600 is exposed. In some embodiments, the trench 600A' may have a vertical sidewall as previously described in FIG. 2A. In some other embodiments, the trench 600A' may have a sidewall tapering toward the substrate 600 as previously described in FIG. 3. In some embodiments, the first transistor region 600A is p-type transistor region, and the second transistor region 600B is n-type transistor region. FIG. 7A is a perspective view, FIG. 7B is a Y-cut cross sectional view, FIG. 7C is an X-cut cross sectional view at the second transistor region 600B, and FIG. 7D is an X-cut cross sectional view at the first transistor region 600A.

Figure 8A:
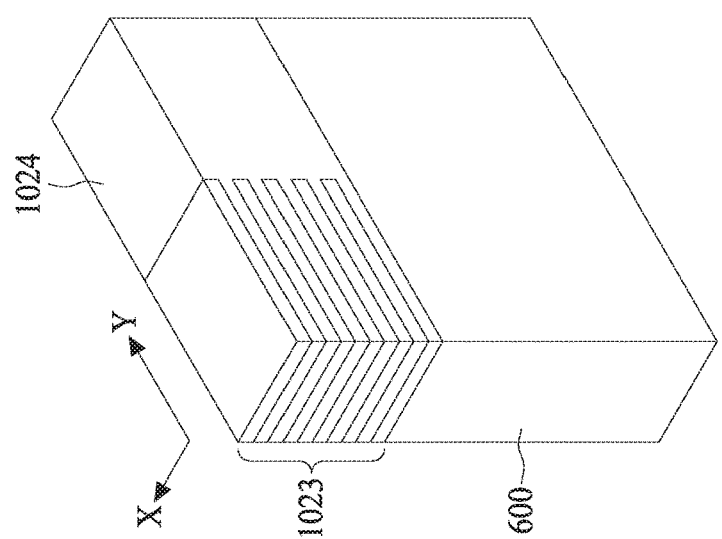
FIG. 8A-8D are various views of a type of hybrid semiconductor structure during an intermediate stage of manufacturing operations, in accordance with some embodiments of the present disclosure.
Figure 8B:
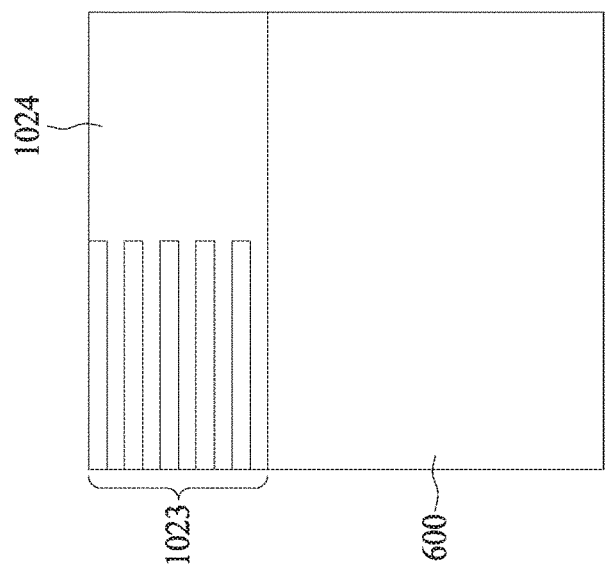
Figure 8C:
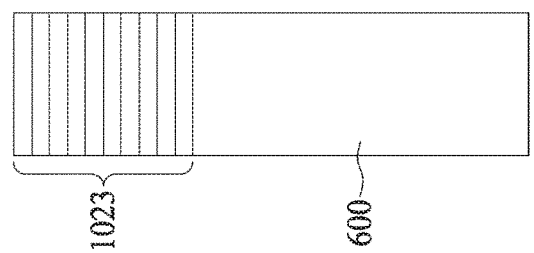
Figure 8D:
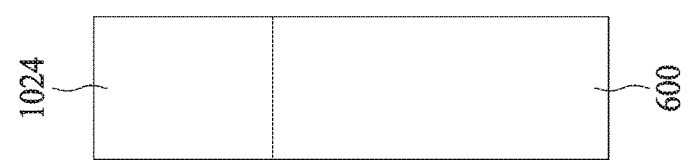

In FIG. 8A to FIG. 8D, a first layer 1024 is filled into the trench 600A' of the stacked epitaxy 1023. FIG. 8A is a perspective view, FIG. 8B is a Y-cut cross sectional view, FIG. 8C is an X-cut cross sectional view at the second transistor region 600B, and FIG. 8D is an X-cut cross sectional view at the first transistor region 600A. A material of the first layer 1024 is different from the material of the substrate 600. For example, the substrate 600 may be composed of silicon, and the first layer 1024 may be composed of silicon germanium (SiGe). In some embodiments, the stacked epitaxy 1023 may include a material of the first layer 1024, however, the material composition, for example, atomic percentage in a compound material, of the first layer 1024 may or may not be identical to that in the stacked epitaxy 1023.

In FIG. 9A to FIG. 9D, the first layer 1024 and a portion of the substrate 600 are patterned to form a first fin protruding from the substrate 600. An upper portion of the first fin is a first layer fin 1024'. The stacked epitaxy 1023 and a portion of the substrate 600 are patterned to form a second fin protruding from the substrate 600. An upper portion of the second fin is a stacked fin 1023'. FIG. 9A is a perspective view, FIG. 9B is a Y-cut cross sectional view, FIG. 9C is an X-cut cross sectional view at the second transistor region 600B, and FIG. 9D is an X-cut cross sectional view at the first transistor region 600A. In some embodiments, the first layer fin 1024' and the stacked fin 1023' are concurrently patterned under one lithography operation. A width of the first layer fin 1024' and a width of the stacked fin 1023', as patterned, may be identical. In some embodiments, the first layer fin 1024' can be a silicon germanium fin. In some embodiments, the first layer fin 1024' may subsequently form a channel for a P-type transistor. In some embodiments, the stacked fin 1023' may be composed of silicon and silicon germanium. In some embodiments, the stacked fin 1023' may form a channel for an N-type transistor. A shallow trench isolation (STI) 199 is subsequently formed between the lower portion of the first fin and the second fin.

In FIG. 10A to FIG. 10D, a first dummy oxide layer 1003 is blanket formed over the first layer fin 1024' and the stacked fin 1023'. FIG. 10A is a perspective view, FIG. 10B is a Y-cut cross sectional view, FIG. 10C is an X-cut cross sectional view at the second transistor region 600B, and FIG. 10D is an X-cut cross sectional view at the first transistor region 600A. An annealing operation is optionally performed to transform the first dummy oxide layer 1003 having an as-deposited thickness to a second dummy oxide layer 1003' having an annealed thickness W. During the annealing operation, the first dummy oxide layer 1003 reacts with the first layer fin 1024' and the stacked fin 1023', oxidizing materials of the first layer fin 1024' and the stacked fin 1023'. As a result, annealed thickness W of the second dummy oxide layer 1003' is greater than the as-deposited thickness of the first dummy oxide layer 1003. In subsequent operations illustrated in FIG. 21A to FIG. 21D, the second dummy oxide layer 1003' is removed, exposing a post-annealed first layer fin 1024' and a post-annealed stacked fin 1023' having narrower widths compared to the as-patterned counterparts.

In some embodiments, when the as-patterned first layer fin 1024' composing silicon germanium is having a first germanium concentration, the annealed first layer fin 1024' would then compose silicon germanium which has a second germanium concentration greater than the first germanium concentration due to the fact that the oxidation process consumes silicon in a faster rate than that to germanium, germanium at the surface of first layer fin 1024' is then expelled and concentrated in the portion of the first layer fin 1024' not being oxidized. The aforesaid germanium condensation operation can be optionally performed to increase the germanium concentration in the first layer fin 1024' as-patterned.

Referring to FIG. 11A to FIG. 11D, a dummy gate 1030 is orthogonally formed over a channel region of the first layer fin 1024' and the stacked fin 1023', by a subsequent patterning operation using a hardmask 1033, after the formation of the first dummy oxide layer 1003. FIG. 11A is a perspective view, FIG. 11B is a Y-cut cross sectional view, FIG. 11C is an X-cut cross sectional view at the second transistor region 600B, and FIG. 11D is an X-cut cross sectional view at the first transistor region 600A. In the illustration of FIG. 11A to FIG. 11D, the germanium condensation operations previously discussed is not performed. The dummy gate 1030 is a sacrificial gate, such as a polygate formed by a patterning technique. As shown in FIG. 11A, the dummy gate 1030 is not directly contacting the first layer fin 1024' and the stacked fin 1023' but is in direct contact with the first dummy oxide layer 1003.

Figure 12D:
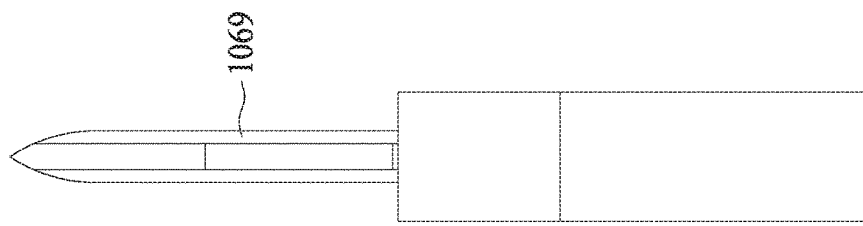
FIG. 12A-12D are various views of a type of hybrid semiconductor structure during an intermediate stage of manufacturing operations, in accordance with some embodiments of the present disclosure.
Figure 12C:
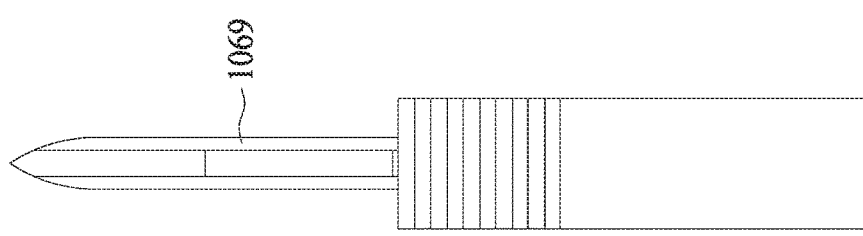
Figure 12B:
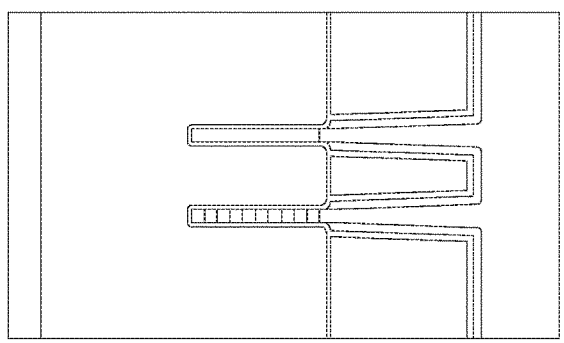
Figure 12B:
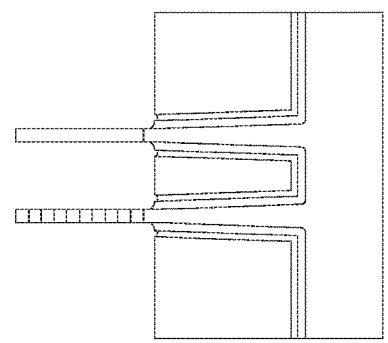
Figure 12A:
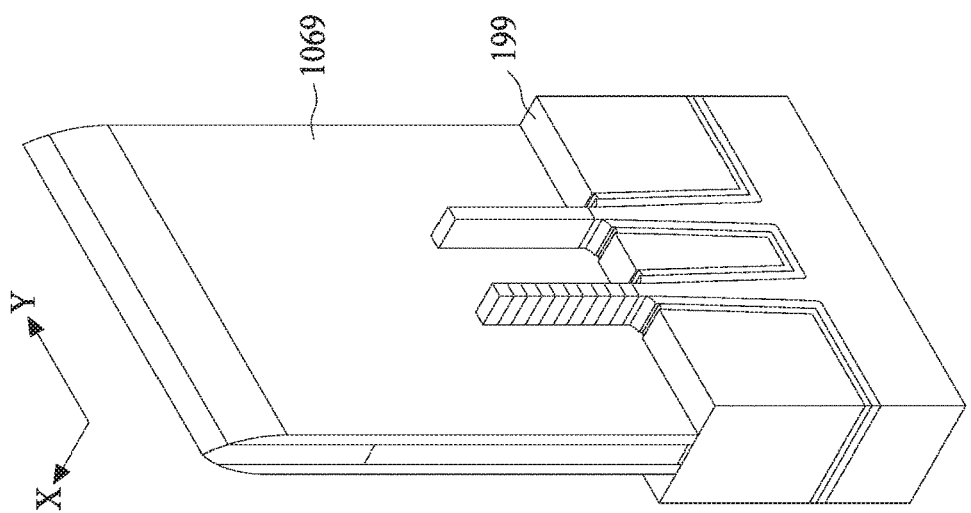

In FIG. 12A to FIG. 12D, a dummy gate spacer 1069 is conformably deposited over the hardmask 1033, the first dummy oxide layer 1003, as well as onto the sidewall of the dummy gate 1030 and the hardmask 1033. FIG. 12A is a perspective view, FIG. 12B is a Y-cut cross sectional view, FIG. 12C is an X-cut cross sectional view at the second transistor region 600B, and FIG. 12D is an X-cut cross sectional view at the first transistor region 600A. In some embodiments, the dummy gate spacer 1069 over top surfaces of the hardmask 1033 and the top surface of the first dummy oxide layer 1003 is removed by an etch operation. In some embodiments, the first dummy oxide layer 1003 not masked by the dummy gate 1030 is subsequently removed, while only the portion of the first dummy oxide layer 1003 under the dummy gate 103 is remained after the oxide etching operation.

Referring to FIG. 13A to FIG. 13D, a masking layer 1055 is patterned over the first transistor region 600A to cover the first layer fin 1024' while exposing the second transistor region 600A and the staked fin 1023'. FIG. 13A is a perspective view, FIG. 13B is a Y-cut cross sectional view, FIG. 13C is an X-cut cross sectional view at the second transistor region 600B, and FIG. 13D is an X-cut cross sectional view at the first transistor region 600A. The masking layer 1055 may protect the first layer fin 1024' in the subsequent nanowire release operation in the source/drain region.

In FIG. 14A to FIG. 14D, a selective etch is performed to partially remove, for example, germanium layers 1023A', 1023B', 1023C', and 1023D' in the stacked fin 1023', while maintaining little to no removal of the silicon layers 1023A, 1023B, 1023C, and 1023D. As a result, a Si nanowire structure 1023" is released from the stacked fin 1023' at the source/drain region, while the SiGe stacks at the channel region of the stacked fin is protected under the dummy gate 1030 and the dummy gate spacer 1069.

Figure 14A:
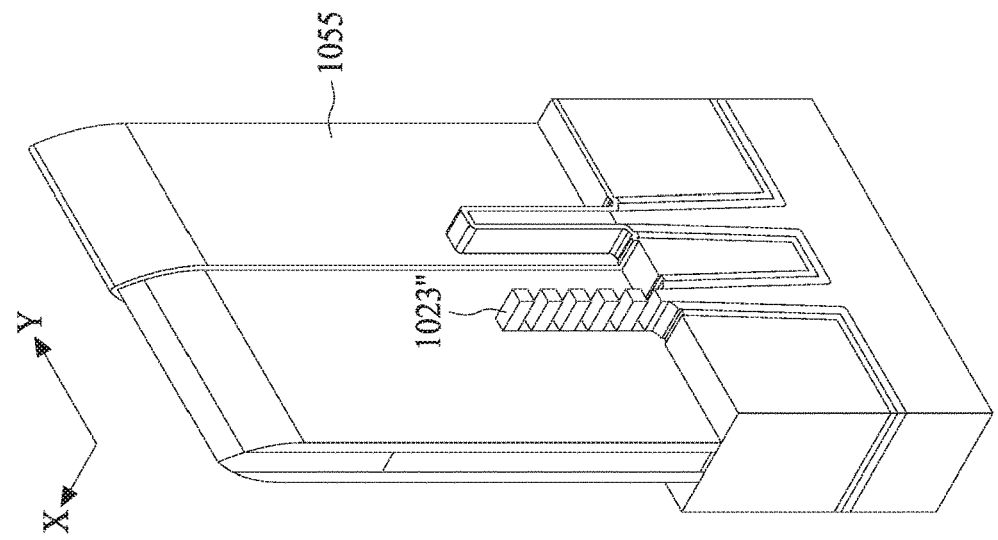
FIG. 14A-14D are various views of a type of hybrid semiconductor structure during an intermediate stage of manufacturing operations, in accordance with some embodiments of the present disclosure.
Figure 14B:
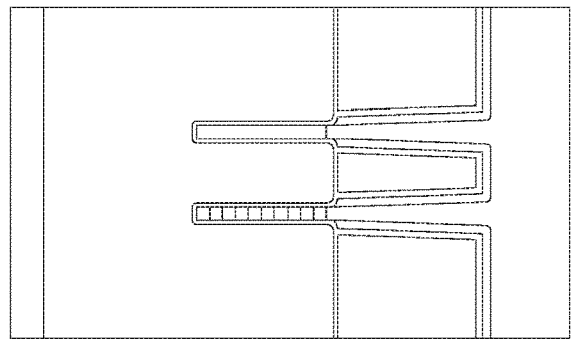
Figure 14B:
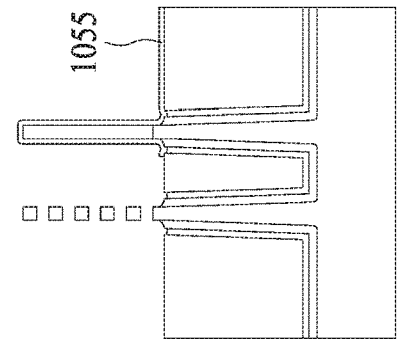
Figure 14C:
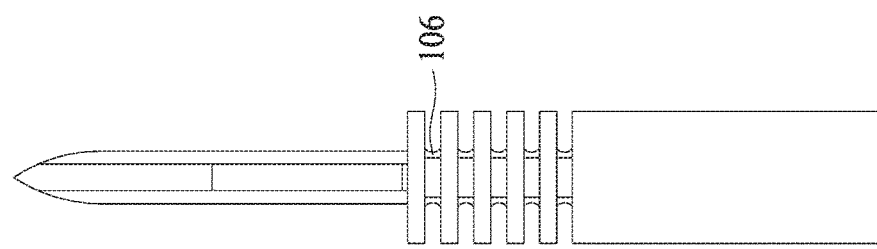
Figure 14D:
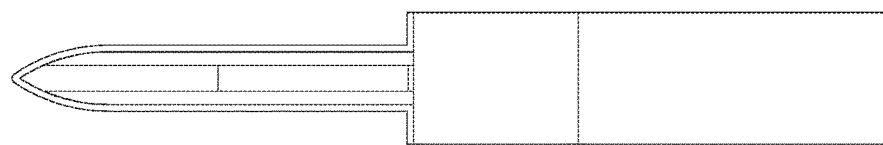
Figure 15D:
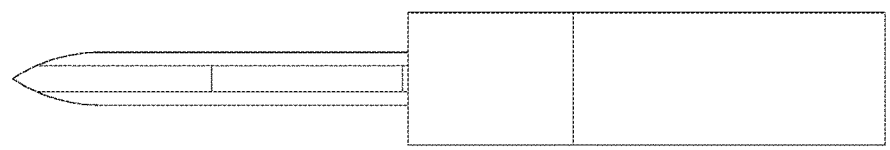
FIG. 15A-15D are various views of a type of hybrid semiconductor structure during an intermediate stage of manufacturing operations, in accordance with some embodiments of the present disclosure.
Figure 15C:
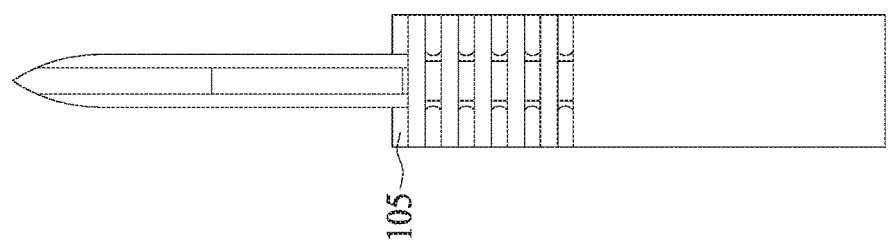
Figure 15B:
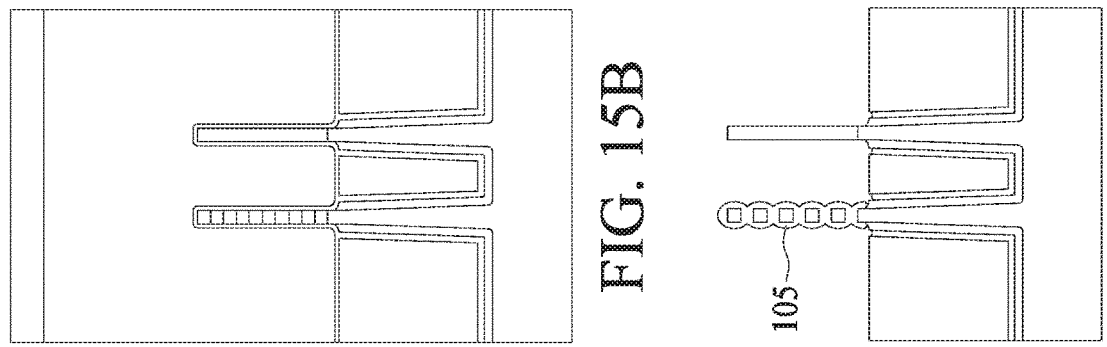
Figure 15A:
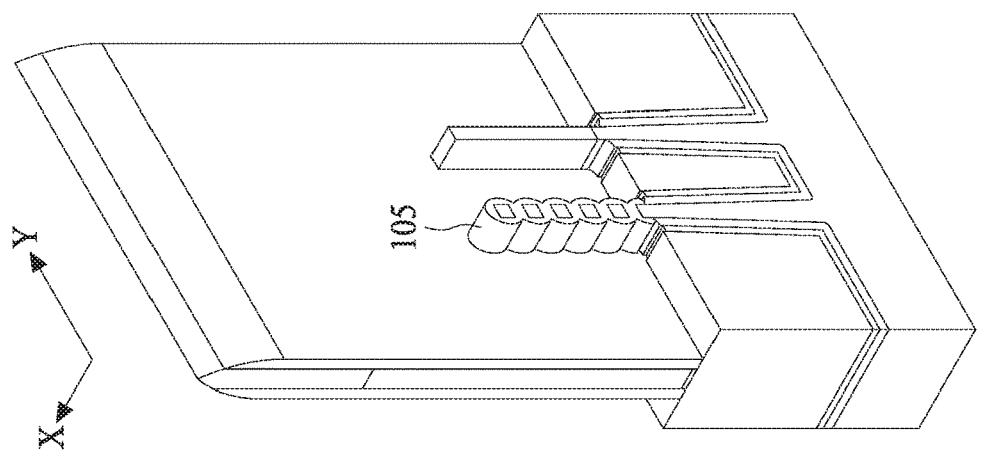
Figure 16D:
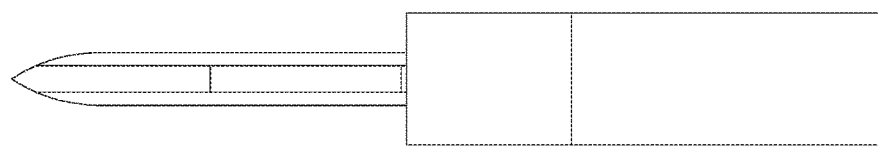
FIG. 16A-16D are various views of a type of hybrid semiconductor structure during an intermediate stage of manufacturing operations, in accordance with some embodiments of the present disclosure.
Figure 16C:
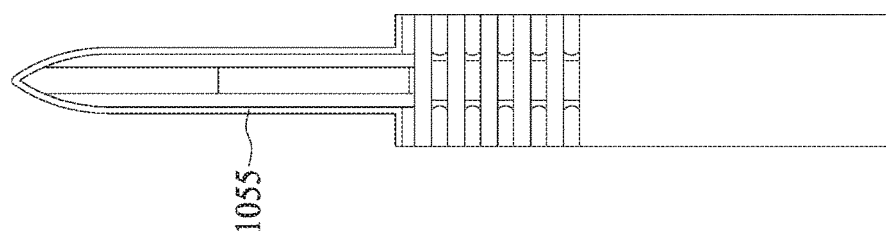
Figure 16B:
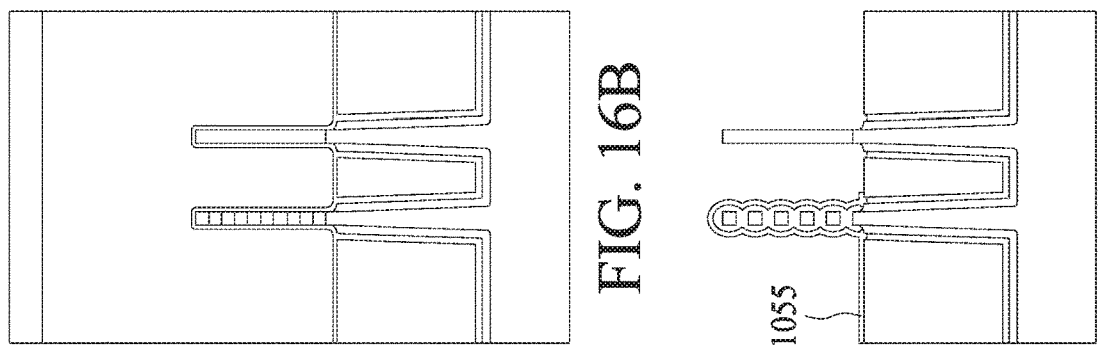
Figure 16A:
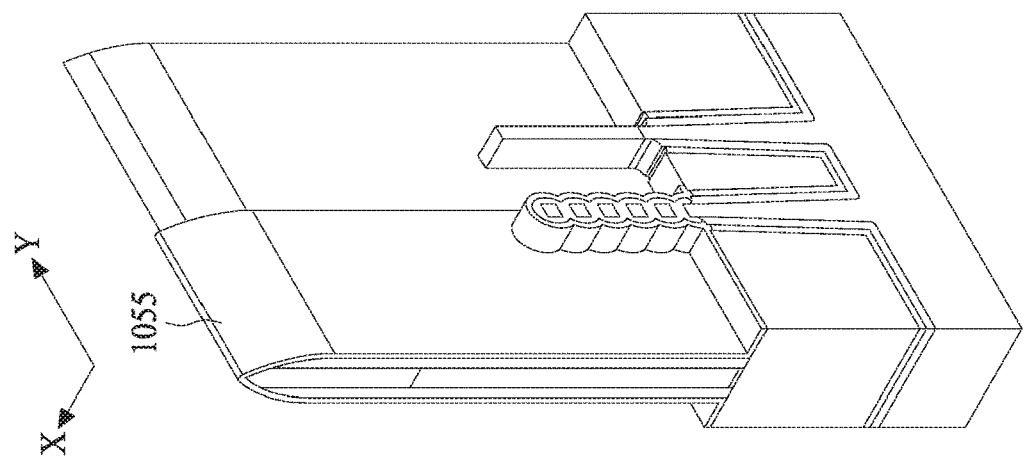
Figure 18D:
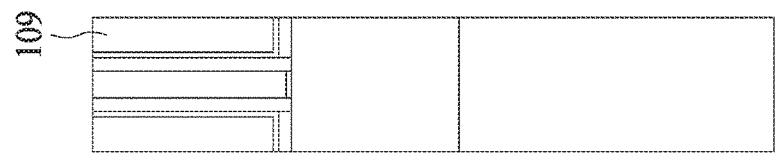
FIG. 18A-18D are various views of a type of hybrid semiconductor structure during an intermediate stage of manufacturing operations, in accordance with some embodiments of the present disclosure.
Figure 18C:
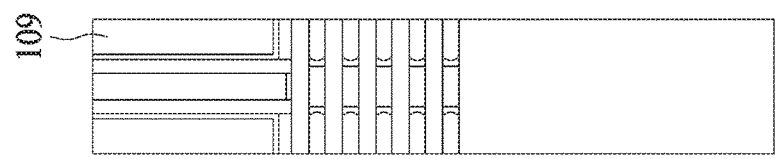
Figure 18B:
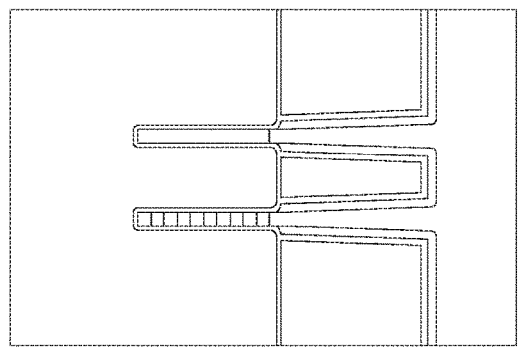
Figure 18B:
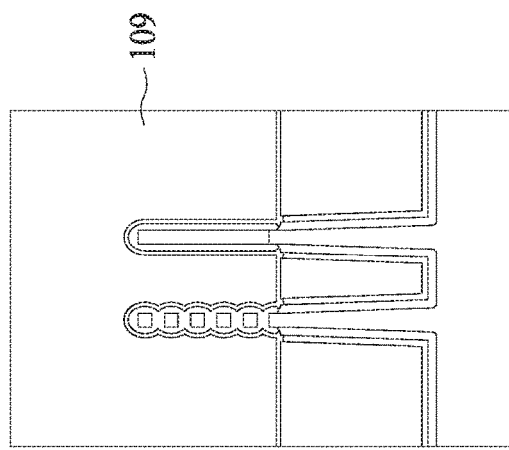
Figure 18A:
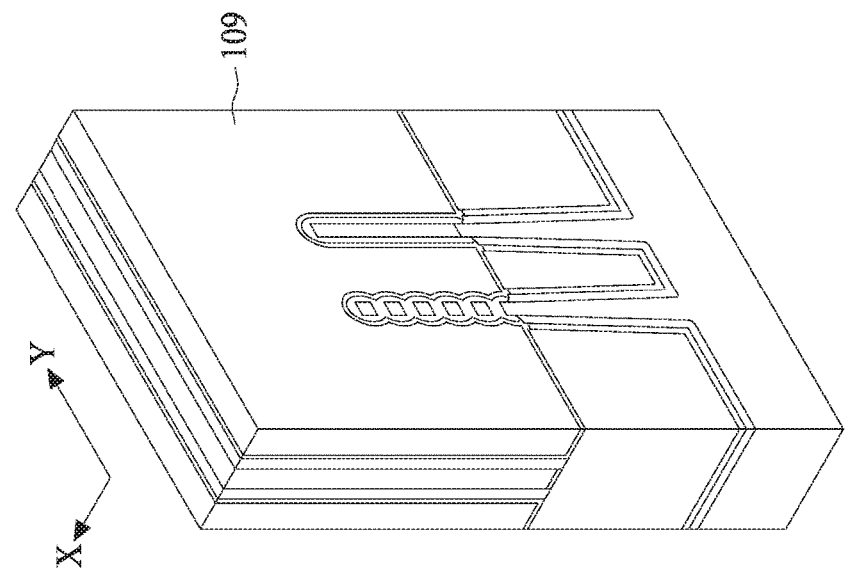
Figure 19D:
FIG. 19A-19D are various views of a type of hybrid semiconductor structure during an intermediate stage of manufacturing operations, in accordance with some embodiments of the present disclosure.
Figure 19C:
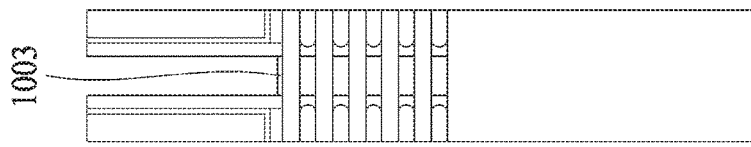
Figure 19B:
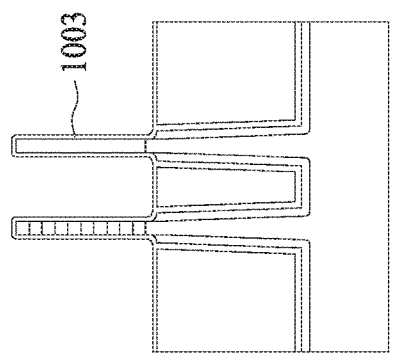
Figure 19B:
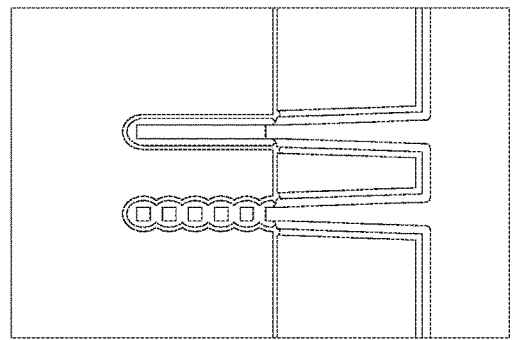
Figure 19A:
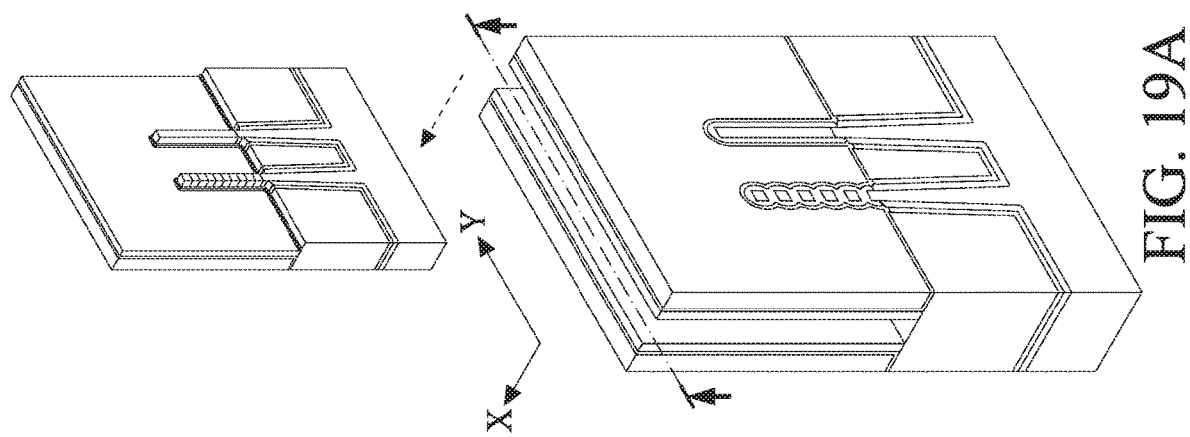

FIG. 14A is a perspective view, FIG. 14B is a Y-cut cross sectional view, FIG. 14C is an X-cut cross sectional view at the second transistor region 600B, and FIG. 14D is an X-cut cross sectional view at the first transistor region 600A. The released portions of the silicon stacks within the Si nanowire structure 1023" are thence free standing with respect to each other. Subsequently, an inner spacer 106 is laterally deposited onto a faceted surface of the remaining SiGe stacks within the channel region. In FIG. 15A to FIG. 15D, a first source/drain 105 is formed through an epitaxial growth technique around as well as over the exposed Si nanowire structure 1023". FIG. 15A is a perspective view, FIG. 15B is a Y-cut cross sectional view, FIG. 15C is an X-cut cross sectional view at the second transistor region 600B, and FIG. 15D is an X-cut cross sectional view at the first transistor region 600A. In some embodiments, the first source/drain 105 is formed to create a Si nanowire NFET. In some embodiments, the first source/drain 105 is composed of SiP, or the like. The masking layer 1055 is removed to expose the first layer fin 1024' for subsequent operations.

Referring to FIG. 16A to FIG. 16D, a masking layer 1055 is patterned over the second transistor region 600B to cover the Si nanowire structure at the source/drain region. The masking layer 1055 may protect the exposed Si nanowire structure 1023" at the source/drain region in the subsequent source/drain formation at the first layer fin 1024'. In FIG. 17A to FIG. 17D, a second source/drain 1039 is conformably formed over the first layer fin 1024'. In some embodiments, the second source/drain 1039 is formed through an epitaxial growth technique to create a silicon germanium nanowire PFET. In some embodiments, the second source/drain 1039 is composed of boron-doped SiGe (SiGeB).

Referring to FIG. 18A to FIG. 18D, an interlayer dialectic (ILD) 109 is formed over the first transistor region 600A and the second transistor region 600B to cover the first source/drain 105 and the second source/drain 1039. A chemical mechanical planarization (CMP) operation is subsequently performed to remove the hardmask 1033 and co-planarize the dummy gate 1030, the dummy gate spacer 1069, and the ILD 109. In some embodiments, the CMP operation stops at a position above both first source/drain 105 and second source drain 1039. In FIG. 19A to FIG. 19D, the dummy gate 1030 is removed, exposing the first dummy oxide layer 1003 deposited previously as illustrated in FIG. 10A to FIG. 10D.

Figure 20D:
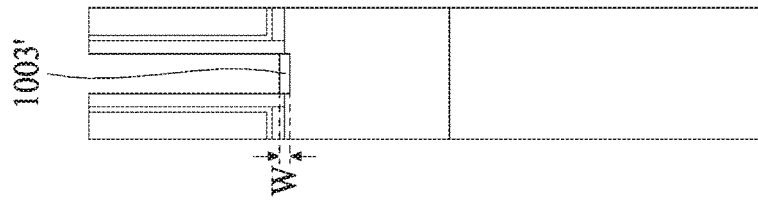
FIG. 20A-20D are various views of a type of hybrid semiconductor structure during an intermediate stage of manufacturing operations, in accordance with some embodiments of the present disclosure.
Figure 20C:
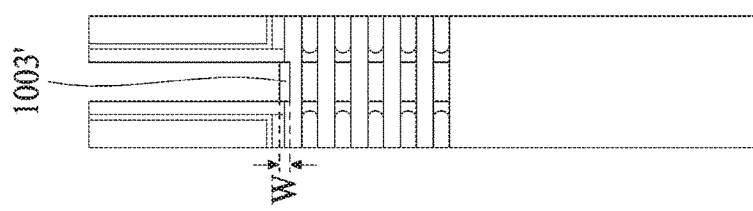
Figure 20B:
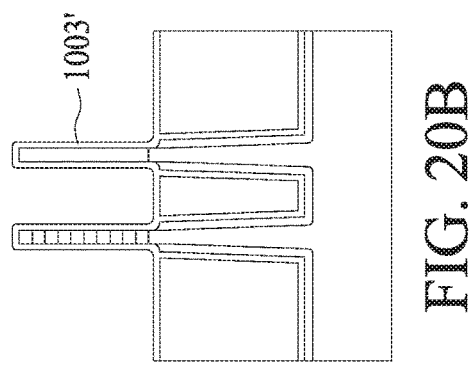
Figure 20B:
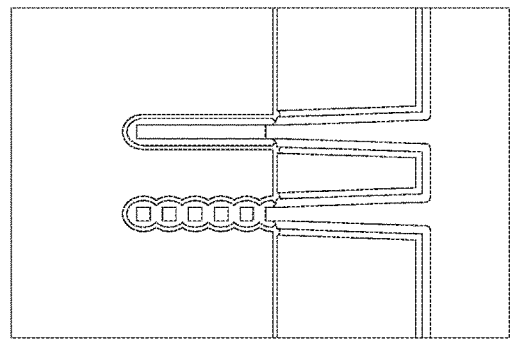

In FIG. 20A to FIG. 20D, FIG. 20A is a perspective view, FIG. 20B is a Y-cut cross sectional view, FIG. 20C is an X-cut cross sectional view at the second transistor region 600B, and FIG. 20D is an X-cut cross sectional view at the first transistor region 600A. An annealing operation is optionally performed to transform the first dummy oxide layer 1003 having an as-deposited thickness to a second dummy oxide layer 1003' having an annealed thickness W. During the annealing operation, the first dummy oxide layer 1003 reacts with the first layer fin 1024' and the stacked fin 1023', oxidizing materials of the first layer fin 1024' and the stacked fin 1023'. As a result, annealed thickness W of the second dummy oxide layer 1003' is greater than the as-deposited thickness of the first dummy oxide layer 1003. In subsequent operations illustrated in FIG. 21A to FIG. 21D, the second dummy oxide layer 1003' is removed, exposing a post-annealed first layer fin 1024' and a post-annealed stacked fin 1023' having narrower widths compared to the as-patterned counterparts.

In some embodiments, when the as-patterned first layer fin 1024' composing silicon germanium is having a first germanium concentration, the annealed first layer fin 1024' would then compose silicon germanium which has a second germanium concentration greater than the first germanium concentration due to the fact that the oxidation process consumes silicon in a faster rate than that to germanium, germanium at the surface of first layer fin 1024' is then expelled and concentrated in the portion of the first layer fin 1024' not being oxidized. The aforesaid germanium condensation operation can be optionally performed to increase the germanium concentration in the first layer fin 1024' as-patterned.

Figure 20A:
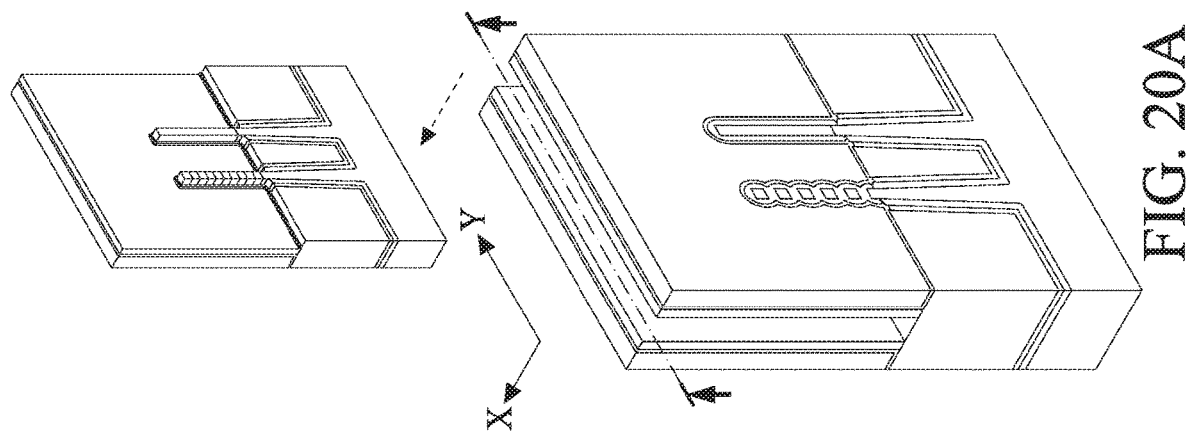
Figure 21D:
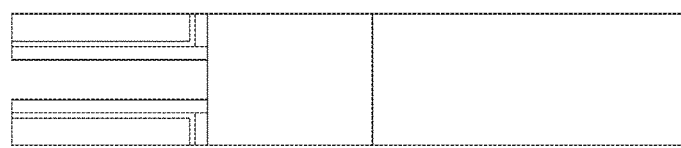
FIG. 21A-21D are various views of a type of hybrid semiconductor structure during an intermediate stage of manufacturing operations, in accordance with some embodiments of the present disclosure.
Figure 21C:
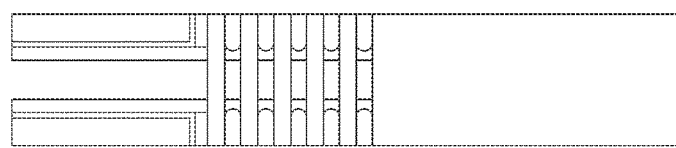
Figure 21B:
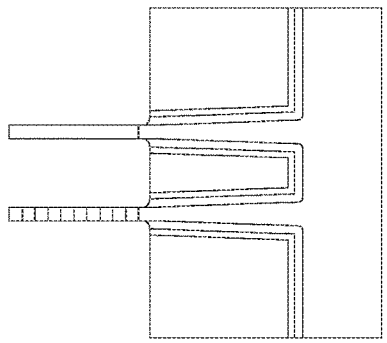
Figure 21B:
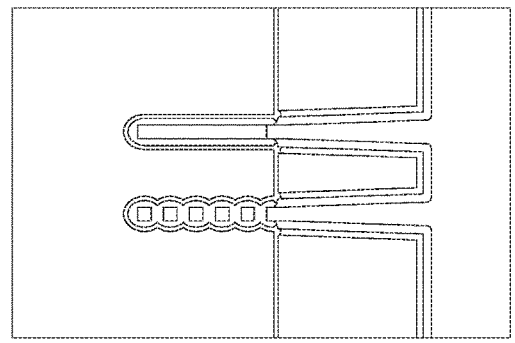
Figure 21A:
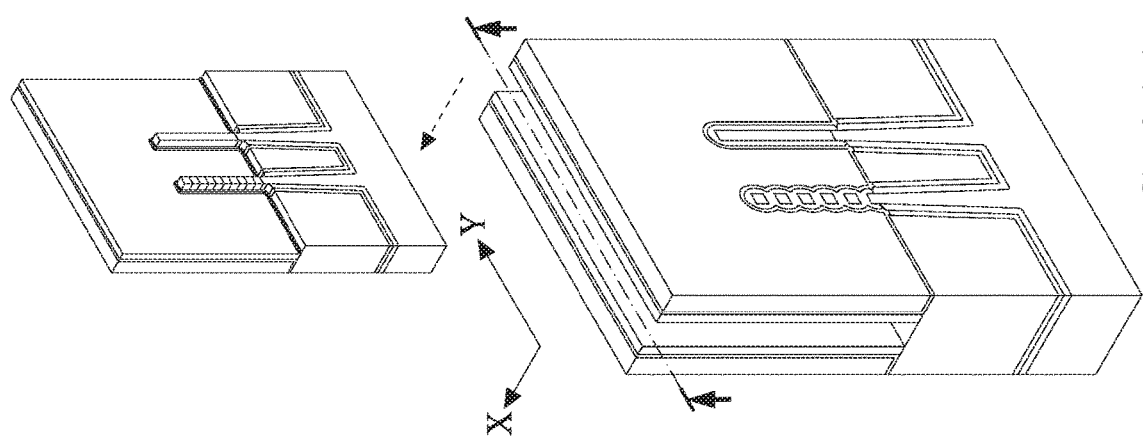
Figure 22D:
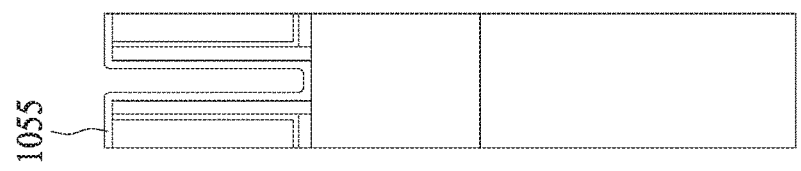
FIG. 22A-22D are various views of a type of hybrid semiconductor structure during an intermediate stage of manufacturing operations, in accordance with some embodiments of the present disclosure.
Figure 22C:
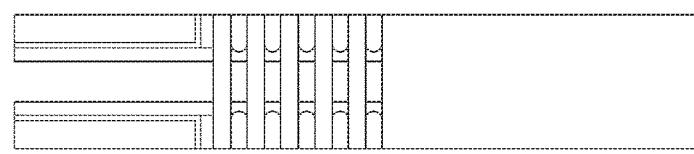
Figure 22B:
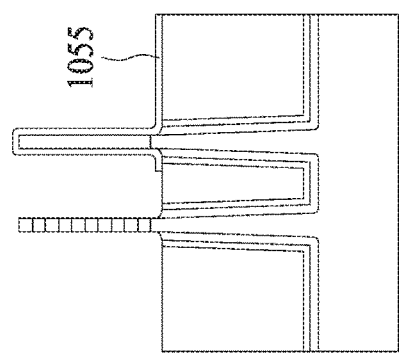
Figure 22B:
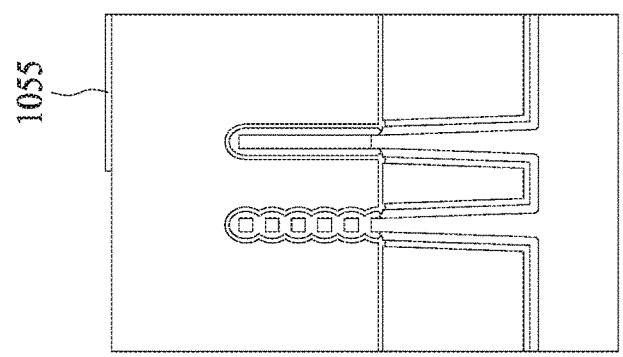
Figure 22A:
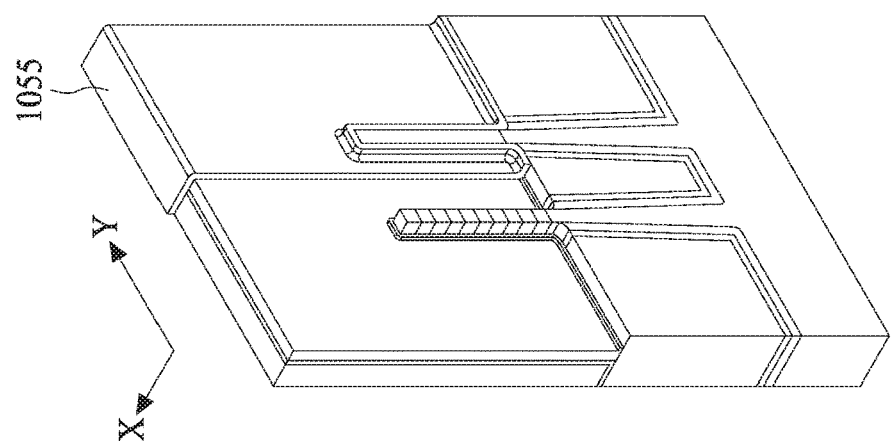
Figure 23D:
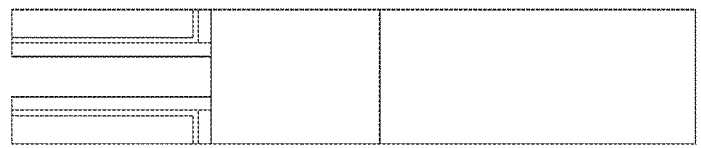
FIG. 23A-23D are various views of a type of hybrid semiconductor structure during an intermediate stage of manufacturing operations, in accordance with some embodiments of the present disclosure.
Figure 23C:
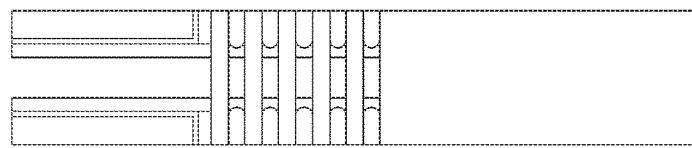
Figure 23B:
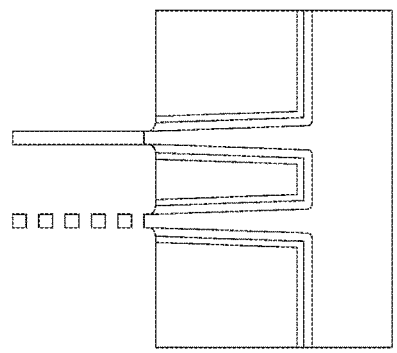
Figure 23B:
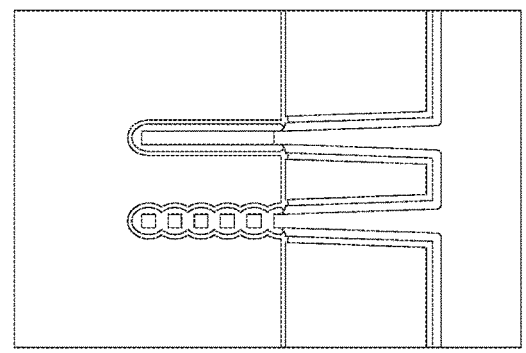
Figure 23A:
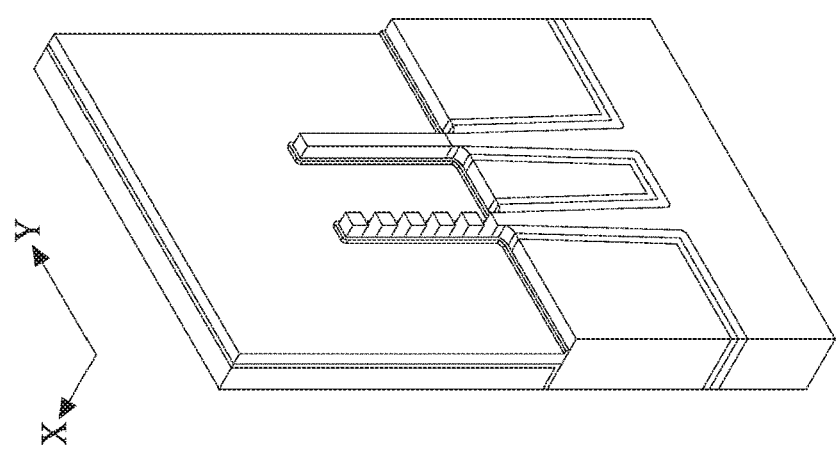
Figure 25D:
FIG. 25A-25D are various views of a type of hybrid semiconductor structure during an intermediate stage of manufacturing operations, in accordance with some embodiments of the present disclosure.
Figure 25C:
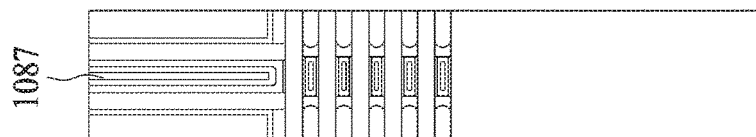
Figure 25B:
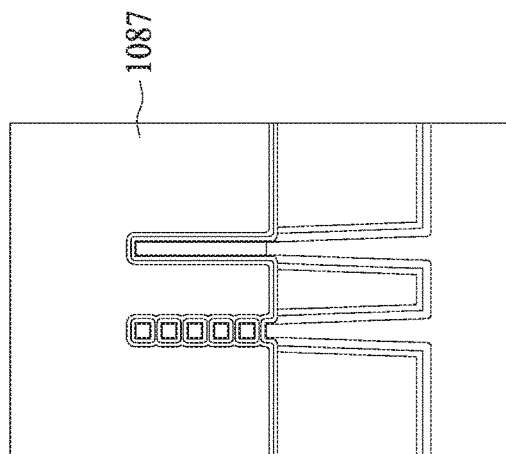
Figure 25A:
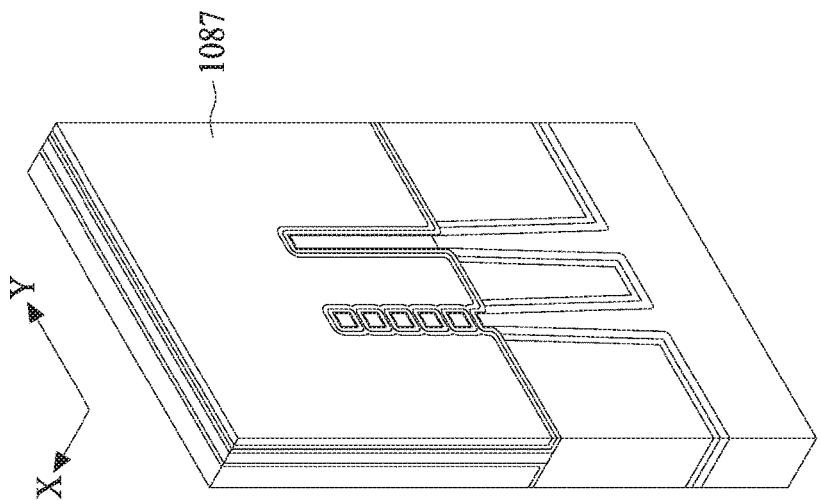

Differences between FIG. 20A and FIG. 10A lie in that, by conducting the annealing or oxidizing operation at the stage illustrated in FIG. 20A, the conversion of the first dummy oxide layer 1003 to the second dummy oxide layer 1003' takes place while only the channel region is exposed to oxide, however, by conducting the annealing or oxidizing operation at the stage illustrated in FIG. 10A, the conversion of the first dummy oxide layer 1003 to the second dummy oxide layer 1003' takes place while only the source/drain region is exposed to oxide. In some embodiments, the annealing or oxidizing operation is conducted in one of the aforesaid stages.

In FIG. 22A to FIG. 22D, a masking layer 1055 is patterned above the first transistor region 600A to cover the first layer fin 1024' for subsequent Si nanowire release operation at the channel region. Note FIG. 22A, FIG. 23A, FIG. 24A, and FIG. 25A illustrate perspective views of the hybrid semiconductor structure by dissecting at the channel region, in order to better show the fin structure at the channel region during the aforesaid intermediate stages.

In FIG. 23A to FIG. 23D, silicon germanium in the stacked fin 1023' in the channel region of the second transistor region 600B is removed and the Si nanowires in the channel region of the second transistor region 600B is released and are free-standing with respect to each other. After Si nanowire in the channel region of the second transistor region 600A is released, the masking layer 1055 covering the first transistor region 600B is removed. In FIG. 24A to FIG. 24D, a high-k/interlayer dielectric 1077 is conformably deposited above the first transistor region 600A and the second transistor region 600B for subsequent replacement gate operations. In FIG. 25A to FIG. 25D, metal gate material 1087 is filled in the channel region and in the space between the adjacent released nanowires. The gate material 1087 is subsequently planarized by a CMP operation. In some embodiments, gate material may include, a titanium nitride capping layer, a work function metal layer, tungsten gate metal, or the like that can be formed around as well as over the plurality of released Si nanowires within the channel region.

Some embodiments of the present disclosure provide a hybrid semiconductor transistor structure, including a substrate, a first transistor on the substrate, a channel of the first transistor including a fin and having a first channel height, a second transistor adjacent to the first transistor, a channel of the second transistor including a nanowire, and a separation laterally spacing the fin from the nanowire. The first channel height is greater than the separation.

Some embodiments of the present disclosure provide a method for manufacturing a semiconductor structure, including (1) providing a substrate; (2) epitaxially forming alternating stacked films over the substrate; (3) forming a trench in the alternating stacked films over a first transistor region; and (4) patterning the alternating stacked films over a second transistor region to obtain an alternating stacked fin.

Some embodiments of the present disclosure provide a method for manufacturing a semiconductor structure, including (1) providing a substrate; (2) epitaxially forming alternating stacked films over the substrate and in a p-type transistor region and an n-type transistor region; (3) forming a trench in the alternating stacked films in the p-type transistor region; and (4) patterning the alternating stacked films over the n-type transistor region to obtain an alternating stacked fin.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Figure 26A:
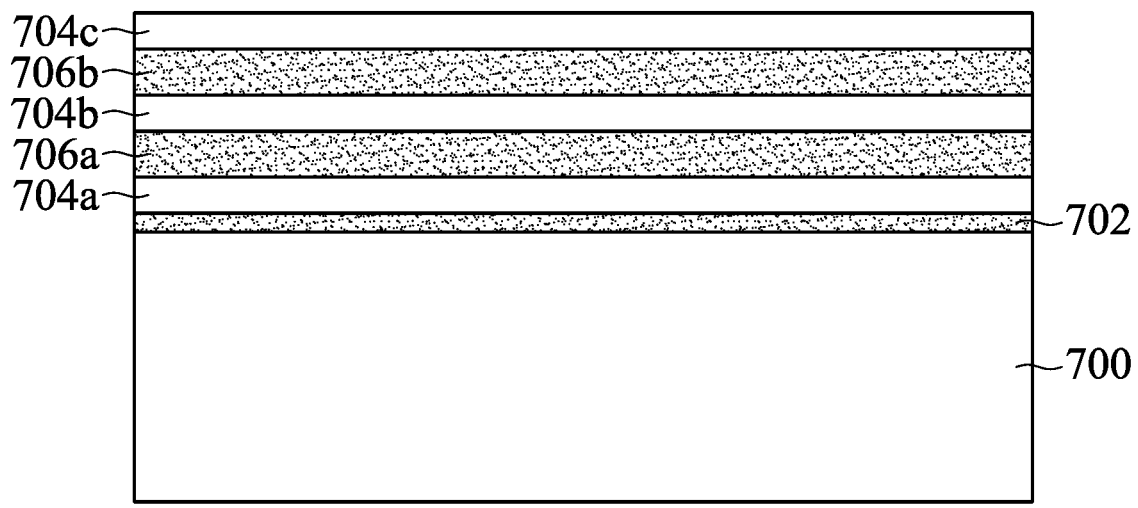
FIGS. 26A-26I are cross-sectional views of various stages of a process for forming a semiconductor device structure, in accordance with some embodiments.

FIGS. 26A-26I are cross-sectional views of various stages of a process for forming a semiconductor device structure, in accordance with some embodiments. As shown in FIG. 26A, a semiconductor substrate 700 is received or provided. In some embodiments, the semiconductor substrate 700 is a bulk semiconductor substrate, such as a semiconductor wafer. For example, the semiconductor substrate 700 includes silicon or other elementary semiconductor materials such as germanium. The semiconductor substrate 700 may be un-doped or doped (e.g., p-type, n-type, or a combination thereof). In some embodiments, the semiconductor substrate 700 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 700 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

As shown in FIG. 26A, a sacrificial layer 702 is deposited over the semiconductor substrate 700, in accordance with some embodiments. The sacrificial layer 702 may be made of or include silicon germanium, germanium, one or more other suitable materials, or a combination thereof. The sacrificial layer 702 may be deposited using an epitaxial growth process, a chemical vapor deposition (CVD) process, an atomic layer deposition (ALD) process, one or more other applicable processes, or a combination thereof. The epitaxial growth process may include a selective epitaxial growth (SEG) process, a vapor-phase epitaxy (VPE) process, a molecular beam epitaxy process, one or more other applicable processes, or a combination thereof.

Afterwards, a semiconductor stack including multiple first semiconductor layers 704a, 704b, and 704c and multiple second semiconductor layers 706a and 706b is formed over the sacrificial layer 702, as shown in FIG. 26A in accordance with some embodiments. In some embodiments, the first semiconductor layers 704*a*, 704*b*, and 704*c* and the second semiconductor layers 706*a* and 706*b* are laid out alternately, as shown in FIG. 26A.

In some embodiments, these first semiconductor layers 704*a*, 704*b*, and 704*c* are made of a first semiconductor material. The first semiconductor layers 704*a*, 704*b*, and 704*c* may be made of or include silicon, germanium, one or more other suitable materials, or a combination thereof. In some embodiments, these second semiconductor layers 706*a* and 706*b* are made of a second semiconductor material that is different than the first semiconductor material. The second semiconductor layers 706*a* and 706*b* may be made of or include silicon germanium, germanium, one or more other suitable materials, or a combination thereof.

In some embodiments, the first semiconductor layers 704*a*-704*c* and the second semiconductor layers 706*a*-706*b* are formed using an epitaxial growth process. Each of first semiconductor layers 704*a*-704*c* and the second semiconductor layers 706*a*-706*b* may be formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof. In some embodiments, the first semiconductor layers 704*a*-704*c* and the second semiconductor layers 706*a*-706*b* are grown in-situ in the same process chamber. In some embodiments, the growth of the first semiconductor layers 704*a*-704*c* and the growth of the second semiconductor layers 706*a*-706*b* are alternately and sequentially performed in the same process chamber to complete the formation the semiconductor stack.

In some embodiments, the sacrificial layer 702 and the semiconductor stack are grown in-situ in the same process chamber. In some embodiments, the sacrificial layer 702 and the second semiconductor layer 706*a* and 706*b* are made of the same material or similar materials. In some embodiments, the sacrificial layer 702 is thinner than each other the second semiconductor layer 706*a* and 706*b*.

Figure 26B:
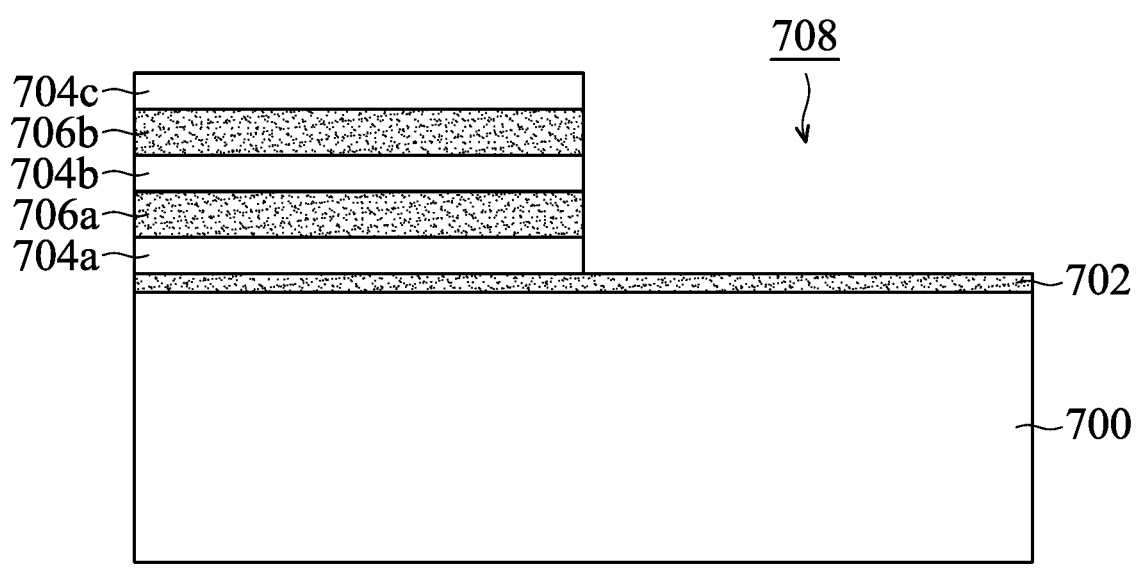

As shown in FIG. 26B, the semiconductor stack is partially removed to form an opening 708 that exposes a portion of the sacrificial layer 702, in accordance with some embodiments. A photolithography process and multiple etching processes may be used to form the opening 708.

Figure 26C:
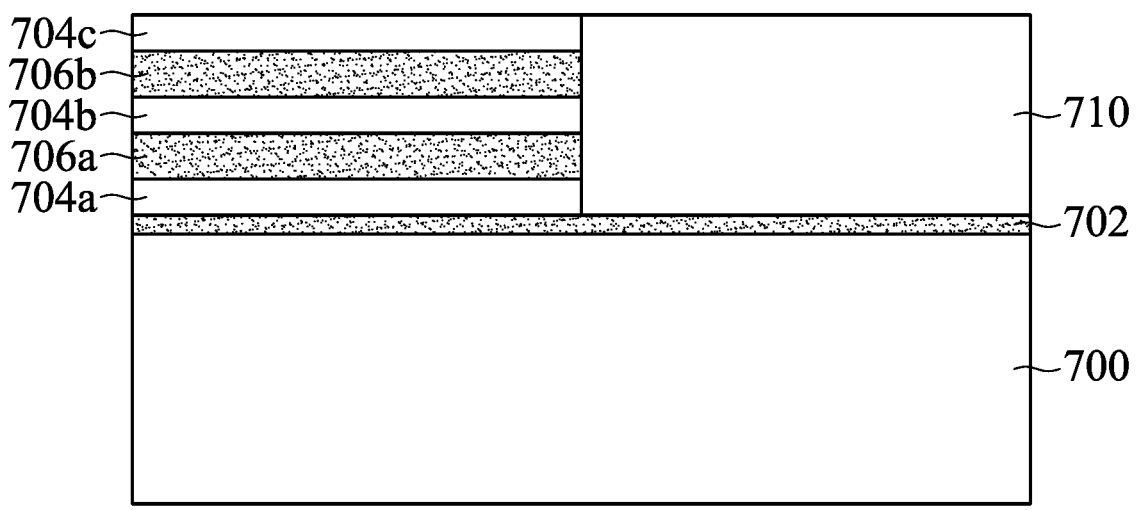

As shown in FIG. 26C, a semiconductor layer 710 is formed over the exposed portion of the sacrificial layer 702, in accordance with some embodiments. The semiconductor layer 710 and the first semiconductor layers 704*a*-704*c* may be made of the same material. The semiconductor layer 710 may be made of silicon, germanium, one or more other suitable materials, or a combination thereof. The semiconductor layer 710 may be formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the top surface of the semiconductor layer 710 is substantially level with the top surface of the semiconductor stack (i.e., the top surface of the first semiconductor layer 704*c*). In some embodiments, the epitaxial growth of the semiconductor layer 710 is carefully controlled to fine-tune the thickness of the semiconductor layer 710. As a result, the top surfaces of the semiconductor layer 710 and the semiconductor stack are substantially coplanar. In some embodiments, a mask element is formed to cover the semiconductor stack during the epitaxial growth of the semiconductor layer 710. After the growth of the semiconductor layer 710, the mask element is removed.

Figure 26D:
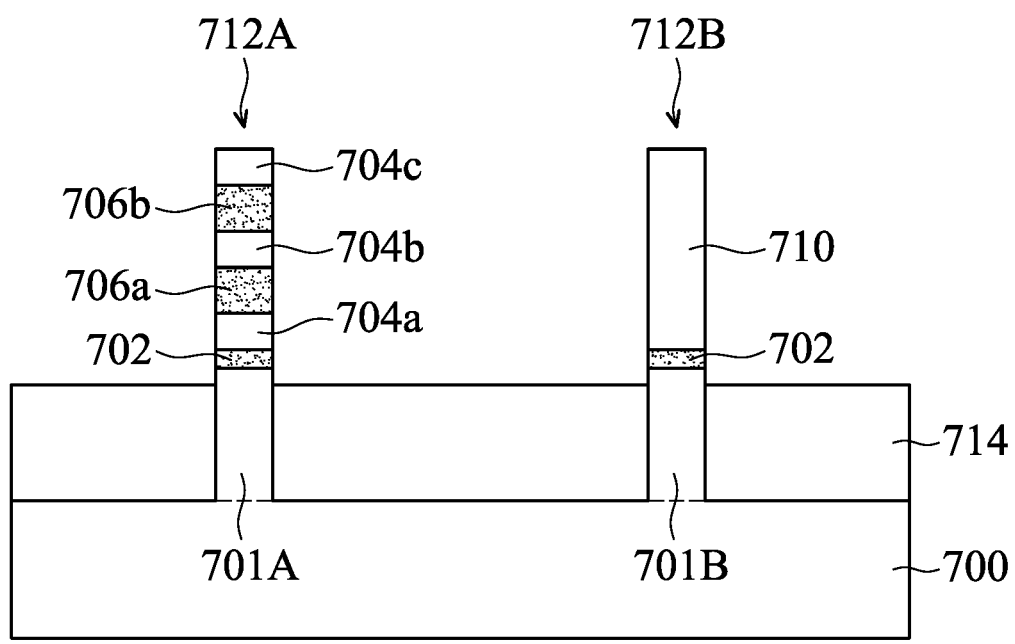

As shown in FIG. 26D, the semiconductor stack, the semiconductor layer 710, the sacrificial layer 702, and the semiconductor substrate 700 are patterned to form fin structures 712A and 712B, in accordance with some embodiments. One or more photolithography process and one or more etching processes may be used to form the fin structures 712A and 712B.

Afterwards, an isolation structure 714 is formed to surround the fin structures 712A and 712B, as shown in FIG. 26D in accordance with some embodiments. The fin structure 712A has an embedded portion 701A surrounded by the isolation structure 714 and a protruding portion extending above the top surface of the isolation structure 714. The protruding portion of the fin structure 712A includes the sacrificial layer 702, the first semiconductor layers 704*a*-704*c*, and the second semiconductor layers 706*a*-706*b*. Similarly, the fin structure 712B has an embedded portion 701B surrounded by the isolation structure 714 and a protruding portion extending above the top surface of the isolation structure 714. The protruding portion of the fin structure 712B includes the sacrificial layer 702 and the second semiconductor layer 710.

In some embodiments, the isolation structure 714 is made of a dielectric material. The dielectric material may include silicon oxide, silicon nitride, silicon oxynitride, fluoride-doped silicate glass (FSG), low-K dielectric material, one or more other suitable materials, or a combination thereof.

In some embodiments, a dielectric material layer is deposited over the semiconductor substrate 100. The dielectric material layer covers the fin structures 712A and 712B. In some embodiments, the dielectric material layer is deposited using a flowable chemical vapor deposition (FCVD) process, a CVD process, an ALD process, a spin coating process, one or more other applicable processes, or a combination thereof.

Afterwards, a planarization process is used to partially remove the dielectric material layer. The planarization process may include a chemical mechanical polishing (CMP) process, a grinding process, a dry polishing process, an etching process, one or more other applicable processes, or a combination thereof. Afterwards, one or more etching processes are used to etch back the dielectric material layer. As a result, the remaining portion of the dielectric material layer forms the isolation structure 714.

Figure 26E:
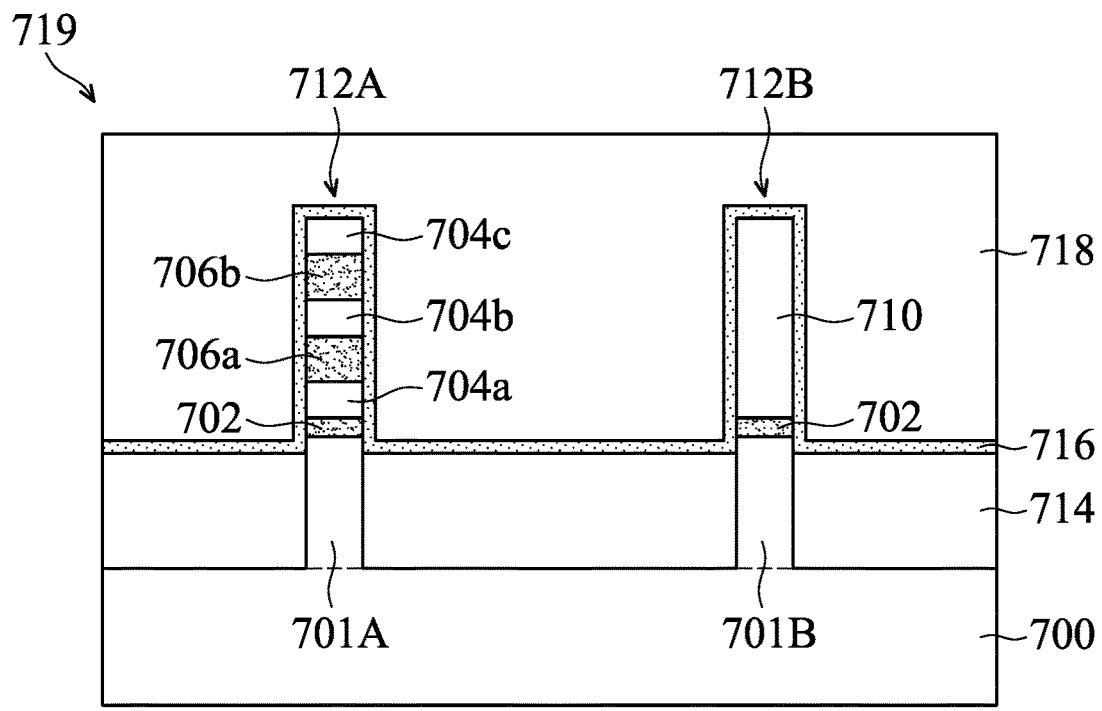

As shown in FIG. 26E, similar to the embodiments illustrated in FIG. 11, a dummy gate stack 719 is formed over the fin structures 712A and 712B, in accordance with some embodiments. In some embodiments, the dummy gate stack 719 partially covers and extends across the fin structures 712A and 712B. In some embodiments, the dummy gate stack 719 wraps around the fin structures 712A and 712B.

In FIG. 26E, the fin structures 712A and 712B are wrapped around by the same dummy gate stack (i.e., the dummy gate stack 719). However, embodiments of the disclosure are not limited thereto. Many variations and/or modifications can be made to embodiments of the disclosure. In some other embodiments, two separate dummy gate stacks are formed to wrap around the respective fin structures 712A and 712B.

In some embodiments, the dummy gate stack 719 includes a dummy gate dielectric layer 716 and a dummy gate electrode 718, as shown in FIG. 26E. The dummy gate dielectric layer 716 may be made of or include silicon oxide.

The dummy gate electrode 718 may be made of or include polysilicon. In some embodiments, a dummy gate dielectric material layer and a dummy gate electrode layer are sequentially deposited over the isolation structure 714 and the fin structures 712A and 712B. Afterwards, the dummy gate dielectric material layer and the dummy gate electrode layer are patterned to form the dummy gate stack 719.

Afterwards, similar to the embodiments illustrated in FIGS. 15-18, epitaxial structures are formed beside the dummy gate stack 719, in accordance with some embodiments. The epitaxial structures may function as source/drain structures. Then, a dielectric layer is formed to surround the dummy gate stack 719, the epitaxial structures, and the fin structures 712A and 712B.

Figure 26F:
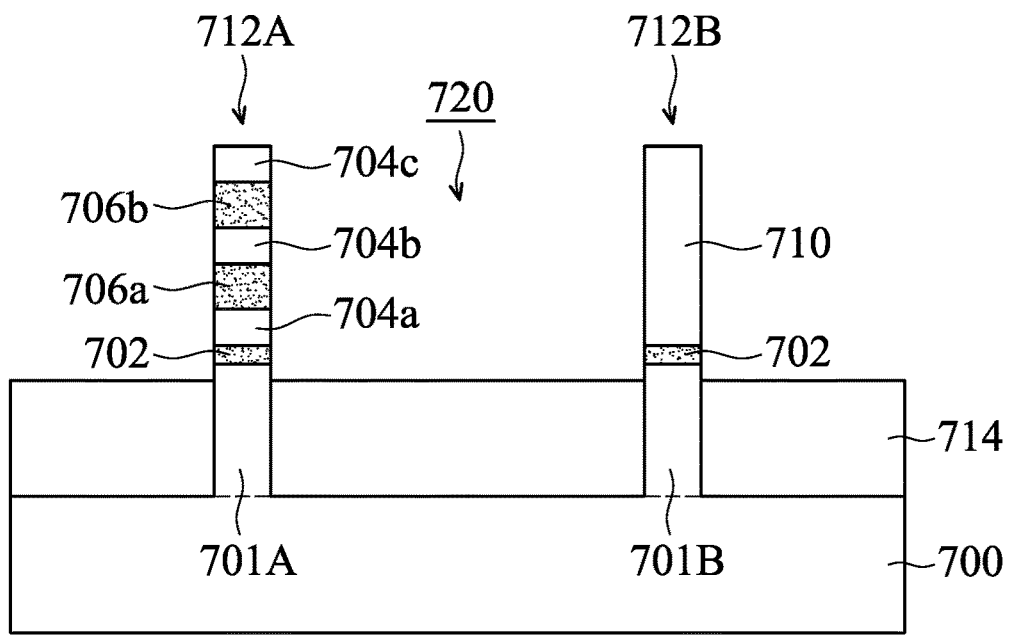

As shown in FIG. 26F, similar to the embodiments illustrated in FIG. 19, the dummy gate stack 719 is removed to form a trench 720, in accordance with some embodiments. The dummy gate stack 719 may be removed using one or more etching processes. The trench 720 partially exposes the fin structures 712A and 712B and the isolation structure 714 while the previously formed epitaxial structures remain covered by the dielectric layer.

Figure 26G:
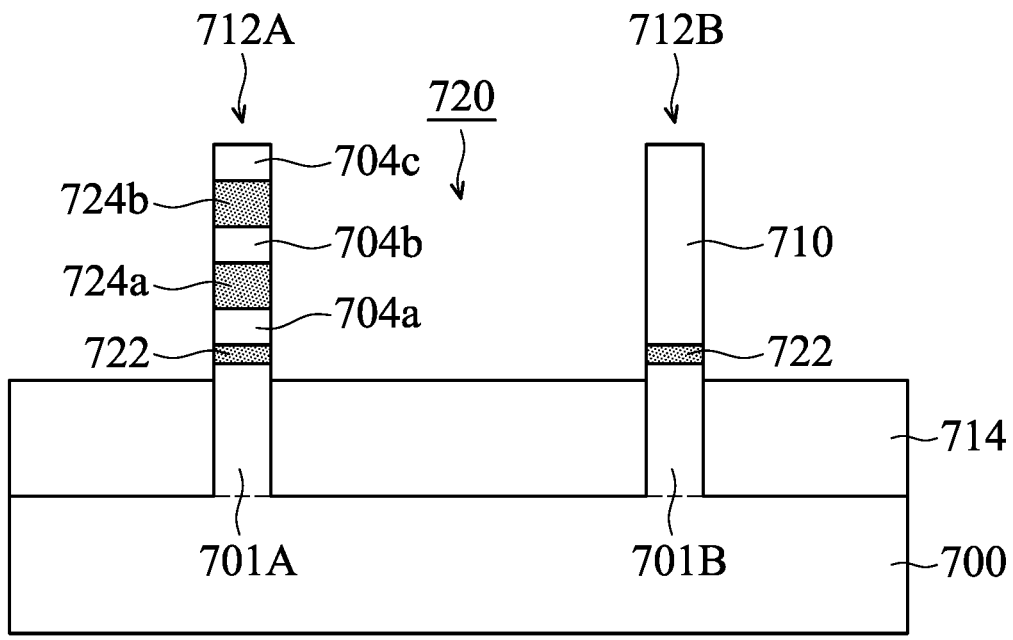

Afterwards, the sacrificial layer 702 and the second semiconductor layers 706a-706b are removed, in accordance with some embodiments. In some embodiments, the sacrificial layer 702 and the second semiconductor layers 706a-706b are oxidized before being removed. As shown in FIG. 26G, an oxidizing operation is used to oxidize the sacrificial layer 702 and the second semiconductor layers 706a-706b into semiconductor oxide layers 722 and 724a-724b, respectively. The semiconductor oxide layers 722 and 724a-724b may be made of or include silicon germanium oxide, germanium oxide, one or more other suitable semiconductor oxide materials, or a combination thereof.

In some embodiments, the sacrificial layer 702 and the second semiconductor layers 706a-706b are oxidized simultaneously. In some embodiments, the sacrificial layer 702 and the second semiconductor layers 706a-706b are oxidized in an oxygen-containing atmosphere at an elevated temperature. The oxygen-containing atmosphere may include a water-containing atmosphere, a hydrogen peroxide-containing atmosphere, an ozone-containing atmosphere, one or more other suitable atmosphere, or a combination thereof.

In some embodiments, the second semiconductor layers 706a-706b and the sacrificial layer 702 are made of a semiconductor material that is more easily oxidized than that of the first semiconductor layers 704a-704c and the semiconductor layer 710 under the same atmosphere for oxidation. Therefore, by fine-tuning the atmosphere for oxidation, the first semiconductor layers 704a-704c and the semiconductor layer 710 are substantially not oxidized or only slightly oxidized even if the second semiconductor layers 706a-706b and the sacrificial layer 702 are oxidized.

Figure 26H:
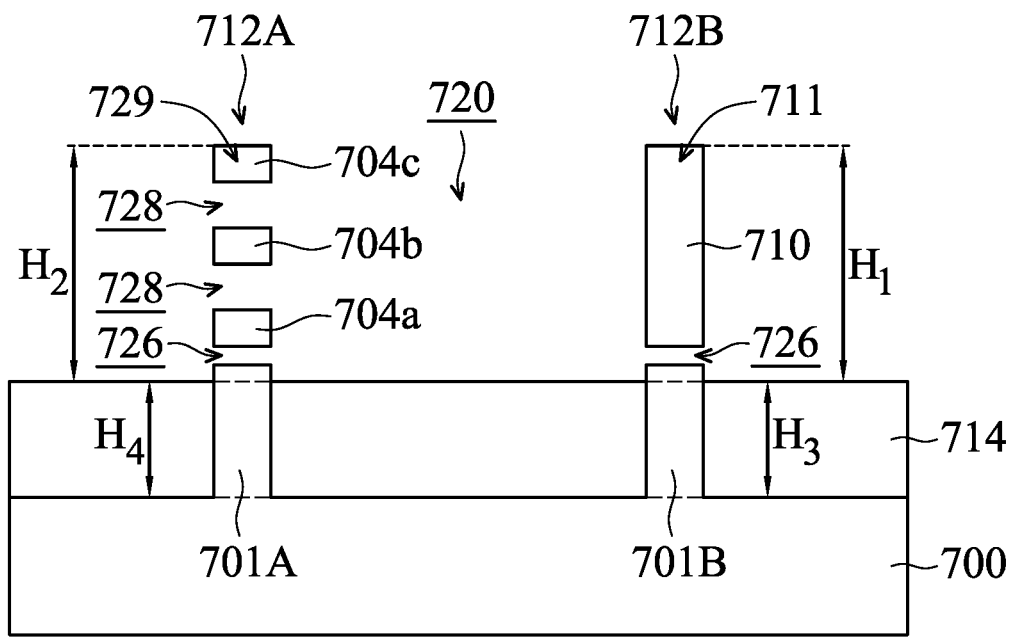

As shown in FIG. 26H, the semiconductor oxide layers 722 and 724a-724b are removed to form openings 726 and 728, in accordance with some embodiments. In some embodiments, the semiconductor oxide layers 722 and 724a-724b are removed simultaneously. In some embodiments, one or more etching processes are used to remove the semiconductor oxide layers 722 and 724a-724b.

Many variations and/or modifications can be made to embodiments of the disclosure. In some other embodiments, the second semiconductor layers 706a-706b and the sacrificial layer 702 are removed directly without being oxidized first. In these cases, one or more etching processes may be used to directly remove the second semiconductor layers 706a-706b and the sacrificial layer 702.

As shown in FIG. 26H, a stack of multiple nanostructures 729 constructed by the first semiconductor layers 704a-704c are formed, in accordance with some embodiments. The nanostructures 729 are released from the semiconductor stack after the removal of the second semiconductor layers 706a-706b. In some embodiments, the nanostructures 729 are separated from each other by the openings 728. In some embodiments, the nanostructures 729 are nanosheets, nanowires, or other nanostructures with different shapes.

The bottommost nanostructure (constructed by the first semiconductor layer 704a) is suspended above the fin structure (i.e., the embedded portion 701A of the fin structure 712A) after the removal of the sacrificial layer 702. Similar to the embodiments illustrated in FIG. 23, due to the support of the previously formed epitaxial structures, the nanostructures 729 are held and supported by the epitaxial structures without falling down.

As shown in FIG. 26H, a semiconductor fin 711 that is constructed by the semiconductor layer 710 is formed, in accordance with some embodiments. The semiconductor fin 711 is released after the removal of the sacrificial layer 702. The bottom surface of the semiconductor fin 711 is suspended above the fin structure (i.e., the embedded portion 701B of the fin structure 712B) after the removal of the sacrificial layer 702. Similarly, due to the support of the previously formed epitaxial structures, the semiconductor fin 711 is held and supported by the epitaxial structures without falling down. In some embodiments, the top surface of the semiconductor fin 711 is substantially level with the top surface of the stack of the nanostructures 729.

As shown in FIG. 26H, the protruding portion of the fin structure 712B (i.e., the semiconductor fin 711) has a total height $H_1$. The total height $H_1$ may be in a range from about 50 nm to about 80 nm. The embedded portion 701B of the fin structure 712B has a total height $H_3$. In some embodiments, the total height $H_1$ is greater than the total height $H_3$. The total height $H_3$ may be in a range from about 30 nm to about 60 nm. In some embodiments, the opening 726 below the semiconductor fin 711 will then be partially or completely filled with a dielectric material that is capable of providing electrical isolation between the semiconductor fin 711 and the embedded portion 701B of the fin structure 712B. Therefore, it may not be required to form the embedded portion 701B with a high thickness to prevent current leakage. The embedded portion 701B may be formed as thin as possible, which may greatly reduce the fabrication cost and improve the quality of the semiconductor device structure.

As shown in FIG. 26H, the stack of the nanostructures 729 has a total height $H_2$. The total height $H_2$ may be in a range from about 50 nm to about 80 nm. The embedded portion 701A has a total height $H_4$. The total height $H_4$ may be in a range from about 30 nm to about 60 nm. In some embodiments, the total height $H2$ is greater than the total height $H_4$. Similarly, in some embodiments, the opening 726 below the stack of the nanostructures 729 will then be partially or completely filled with a dielectric material that is capable of providing electrical isolation between the nanostructures 729 and the embedded portion 701A. Therefore, it may not be required to form the embedded portion 701A with a high thickness to prevent current leakage. The embedded portion 701A may be formed as thin as possible, which may greatly reduce the fabrication cost and improve the quality of the semiconductor device structure.

Figure 26I:
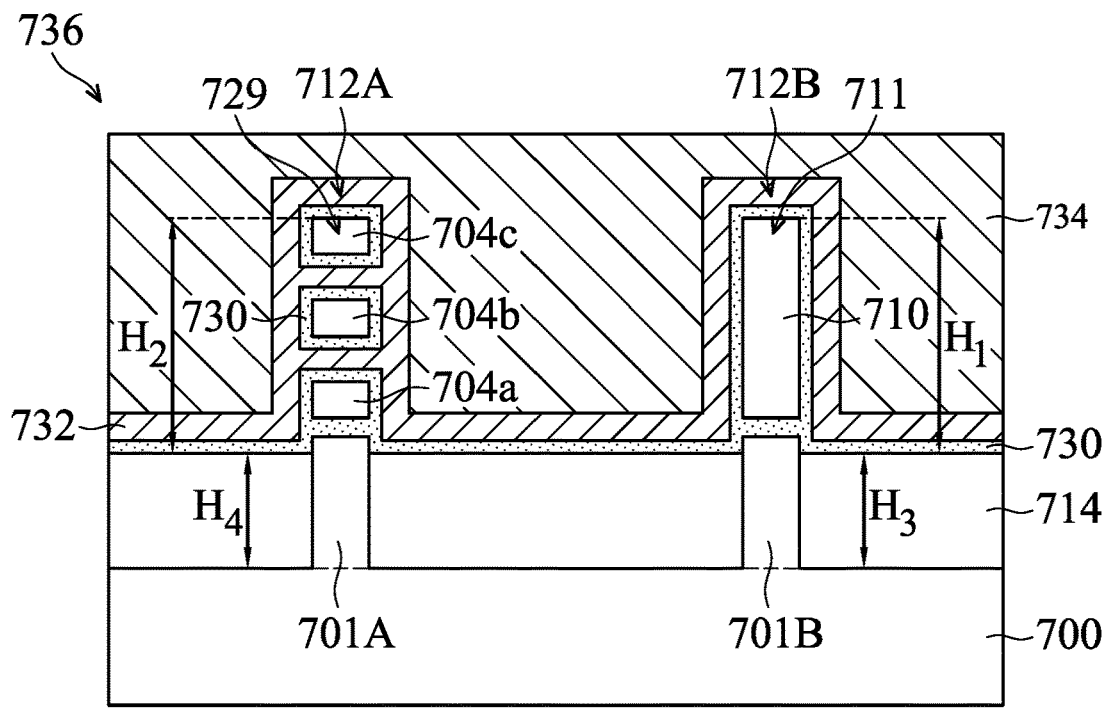

As shown in FIG. 26I, a metal gate stack 736 is formed in the trench 720, in accordance with some embodiments. Similar to the embodiments illustrated in FIG. 25, the metal gate stack 736 wraps around each of the nanostructures 729 and extends across the fin structure 712B. In some embodiments, the metal gate stack 736 wraps around the protruding portion (i.e., the semiconductor fin 711) of the fin structure 712B. In some embodiments, the nanostructures 729 function as channel structures of a first transistor, and the semiconductor fin 711 functions as a channel structure of a second transistor.

In FIG. 26I, the nanostructures 729 and the semiconductor fin 711 are wrapped around by the same metal gate stack (i.e., the metal gate stack 736). However, embodiments of the disclosure are not limited thereto. Many variations and/or modifications can be made to embodiments of the disclosure. In some other embodiments, two separate metal gate stacks are formed, one to wrap around the nanostructures 729 and one to wrap around the semiconductor fin 711.

The metal gate stack 736 includes multiple metal gate stack layers. The metal gate stack 736 may include a gate dielectric layer 730, a work function layer 732, and a conductive filling 734. In some embodiments, the formation of the metal gate stack 736 involves the deposition of multiple metal gate stack layers over the dielectric layer to fill the trench 720. The metal gate stack layers extend into the trench 720 to wrap around each of the nanostructures 729 and the semiconductor fin 711.

In some embodiments, the gate dielectric layer 730 is made of or includes a dielectric material with high dielectric constant (high-K). The gate dielectric layer 730 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 730 may be deposited using an ALD process, a CVD process, one or more other applicable processes, or a combination thereof.

In some embodiments, the gate dielectric layer 730 completely fills the openings 726. The gate dielectric layer 730 separates the bottom of the stack of the nanostructures 729 from the embedded portion 701A. Therefore, the gate dielectric layer 730 may also be used to provide electrical isolation between the nanostructures 729 and the embedded portion 701A and electrical isolation between the semiconductor fin 711 and the embedded portion 701B. The gate dielectric layer 730 may be used to prevent current leakage, which allows the fabrication cost of the formation of the fin structures 712A and 712B and the isolation structure 714 to be significantly reduced.

In some embodiments, before the formation of the gate dielectric layer 730, an interfacial dielectric layer is formed. In some embodiments, an oxidation operation is used to oxidize the surface portions of the nanostructures 729 and the semiconductor fin 711 into the interfacial dielectric layer.

The work function layer 732 (also called a work function adjusting layer) may be used to provide the desired work function for transistors to enhance device performance. In some embodiments, the work function layer 732 is used for forming an NMOS device. The work function layer 732 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 732 is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 732 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 732 may be fine-tuned to adjust the work function level. For example, a titanium nitride layer may be used as a p-type work function layer or an n-type work function layer, depending on the thickness and/or the compositions of the titanium nitride layer.

The work function layer 732 may be deposited over the gate dielectric layer 730 using an ALD process, a CVD process, a PVD process, an electroplating process, an electroless plating process, one or more other applicable processes, or a combination thereof. In some embodiments, the portion of the work function layer 732 wrapping around the nanostructures 729 is made of an n-type work function material, and the portion of the work function layer 732 wrapping around the semiconductor fin 711 is made of a p-type work function material. In these cases, the formation of the work function layer 732 may involve multiple deposition processes and multiple patterning processes.

In some embodiments, a barrier layer is formed before the work function layer 732 to interface the gate dielectric layer 730 with subsequently formed work function layer 732. The barrier layer may also be used to prevent diffusion between the gate dielectric layer 730 and the subsequently formed work function layer 732. The barrier layer 120 may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 734 is made of or includes a metal material. The metal material may include tungsten, aluminum, copper, cobalt, one or more other suitable materials, or a combination thereof. A conductive layer used for forming the conductive filling 734 may be deposited over the work function layer 732 using a CVD process, an ALD process, a PVD process, an electroplating process, an electroless plating process, a spin coating process, one or more other applicable processes, or a combination thereof.

In some embodiments, a blocking layer is formed over the work function layer 732 before the formation of the conductive layer for forming the conductive filling 734. The blocking layer may be used to prevent the subsequently formed conductive layer from diffusing or penetrating into the work function layer 732. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trench 720, in accordance with some embodiments. As a result, the remaining portions of the metal gate stack layers in the trench 720 form the metal gate stack 736, as shown in FIG. 26I.

In some embodiments, the fin structure 712A including the nanostructures 729 is substantially as high as the fin structure 712B including the semiconductor fin 710. However, embodiments of the disclosure are not limited thereto. Many variations and/or modifications can be made to embodiments of the disclosure. In some other embodiments, the fin structures are not as high as each other.

Figure 27A:
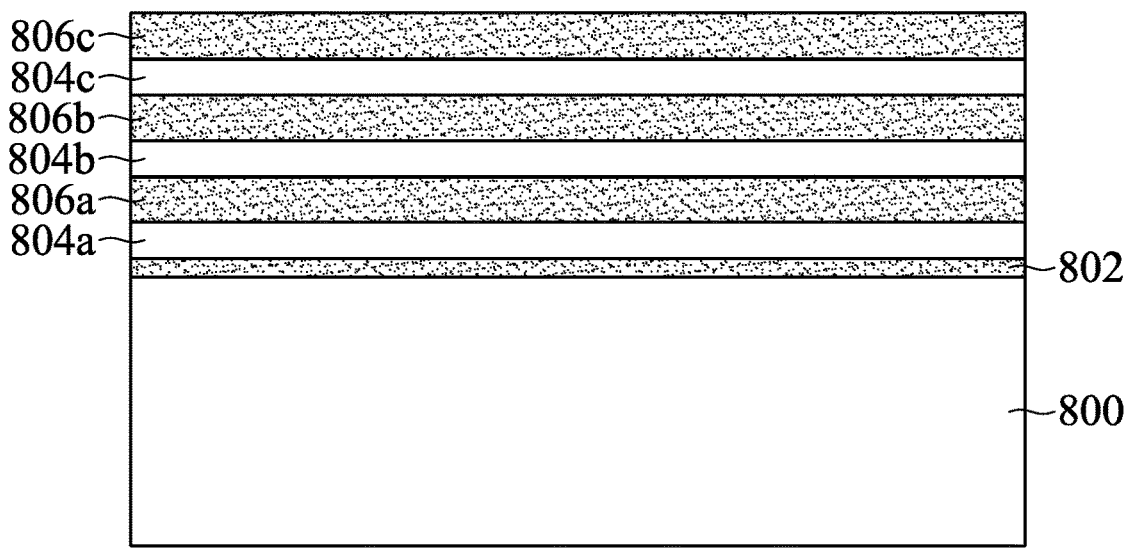
FIGS. 27A-27K are cross-sectional views of various stages of a process for forming a semiconductor device structure, in accordance with some embodiments.

FIGS. 27A-27K are cross-sectional views of various stages of a process for forming a semiconductor device structure, in accordance with some embodiments. As shown in FIG. 27A, a sacrificial layer 802 is formed over a semiconductor substrate 800. The material of the semiconductor substrate 800 may be the same as or similar to that of the semiconductor substrate 700 illustrated in FIG. 26A. The material and formation method of the sacrificial layer 802 may be the same as or similar to those of the sacrificial layer 702 illustrated in FIG. 26A.

Afterwards, a semiconductor stack including multiple first semiconductor layers 804a-804c and multiple second semiconductor layers 806a-806c is formed over the sacrificial layer 802, as shown in FIG. 27A in accordance with some embodiments. In some embodiments, the first semiconductor layers 804a-804c and the second semiconductor layers 806a-806c are laid out alternately, as shown in FIG. 27A. The material and formation method of the first semiconductor layers 804a-804c may be the same as or similar to those of the first semiconductor layers 704a-704c illustrated in FIG. 26A. The material and formation method of the second semiconductor layers 806a-806c may be the same as or similar to those of the second semiconductor layers 706a-706b illustrated in FIG. 26A. In some embodiments, the topmost layer of the semiconductor stack is one of the second semiconductor layers (i.e., the second semiconductor layers 806c).

Figure 27B:
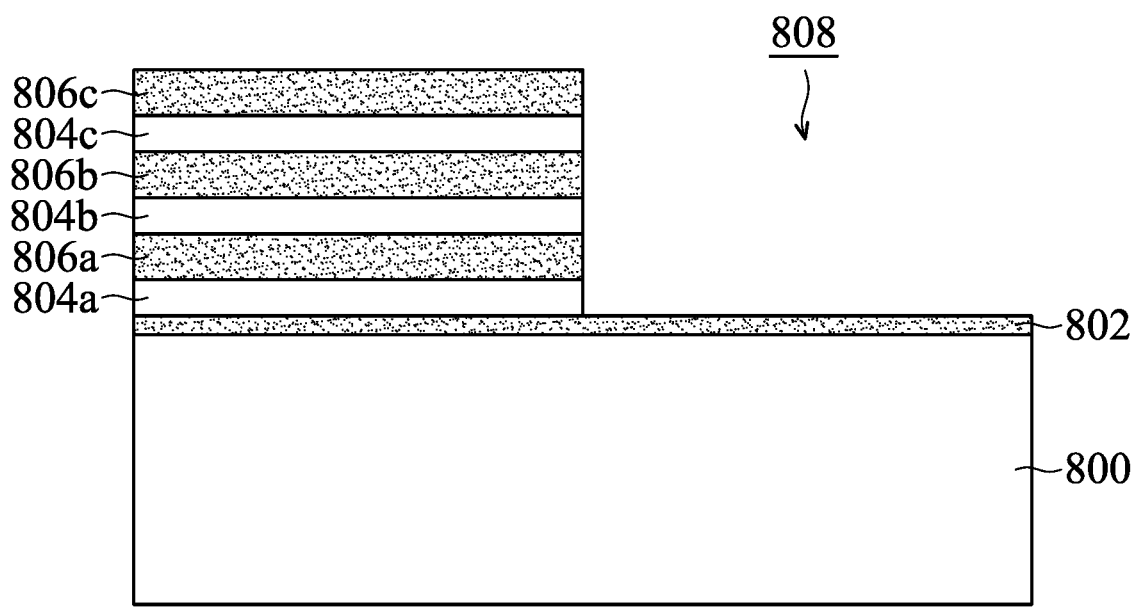

As shown in FIG. 27B, the semiconductor stack is partially removed to form an opening 808 that exposes a portion of the sacrificial layer 802, in accordance with some embodiments. A photolithography process and multiple etching processes may be used to form the opening 808.

Figure 27C:
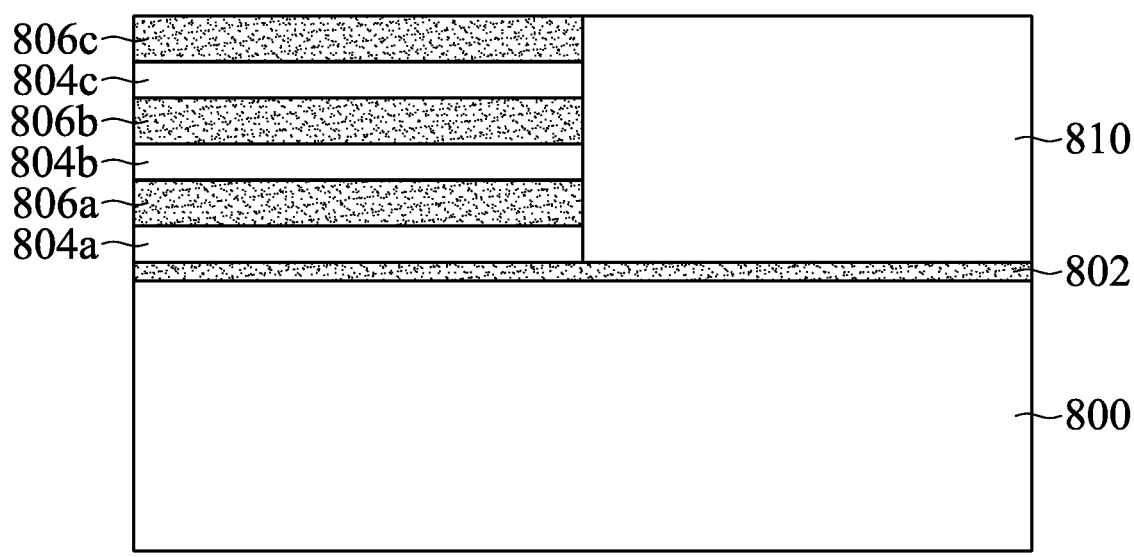

As shown in FIG. 27C, a semiconductor layer 810 is formed over the exposed portion of the sacrificial layer 802, in accordance with some embodiments. In some embodiments, the top surface of the semiconductor layer 810 is substantially level with the top surface of the semiconductor stack (i.e., the top surface of the second semiconductor layer 806c). The material and formation method of the semiconductor layer 810 may be the same as or similar to the semiconductor layer 710 illustrated in FIG. 26C.

Figure 27D:
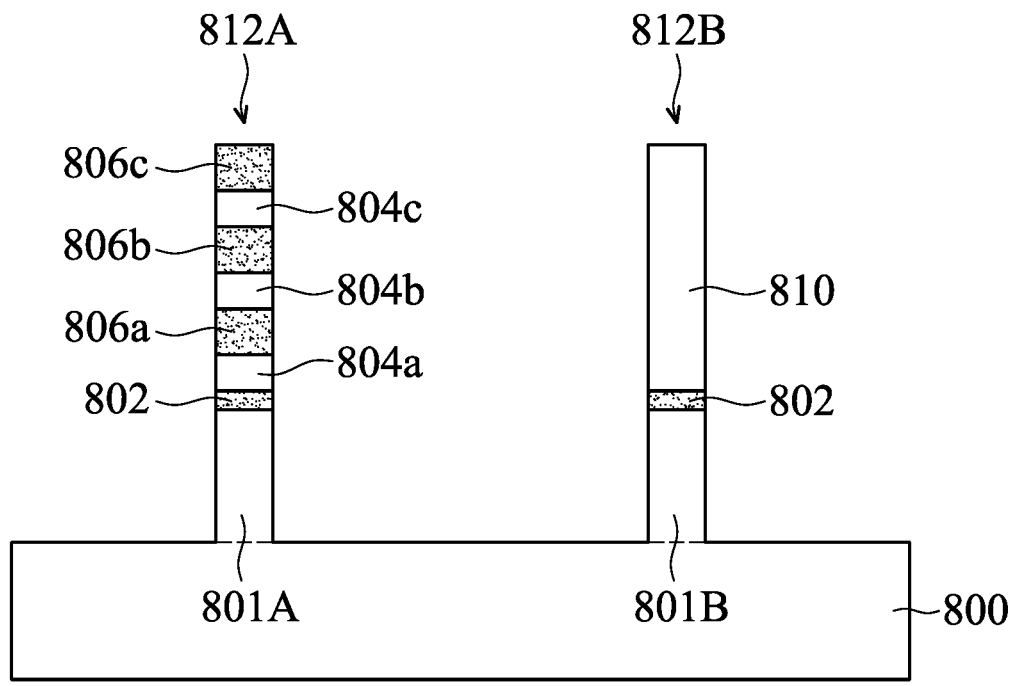

As shown in FIG. 27D, the semiconductor stack, the semiconductor layer 810, the sacrificial layer 802, and the semiconductor substrate 800 are patterned to form fin structures 812A and 812B, in accordance with some embodiments. One or more photolithography process and one or more etching processes may be used to form the fin structures 812A and 812B.

Figure 27E:
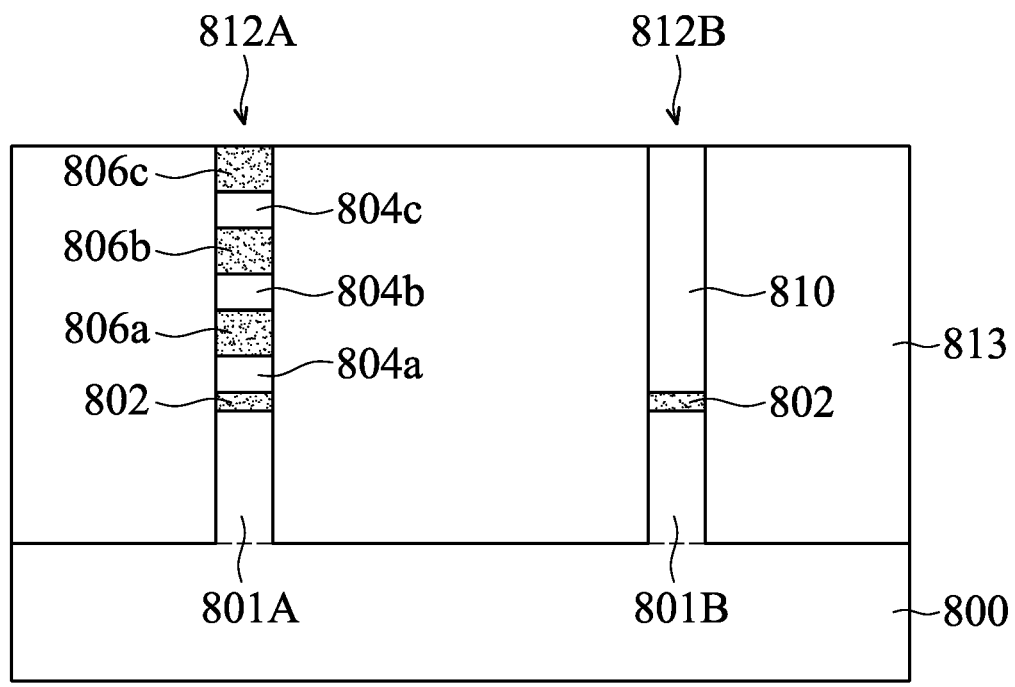
Figure 27F:
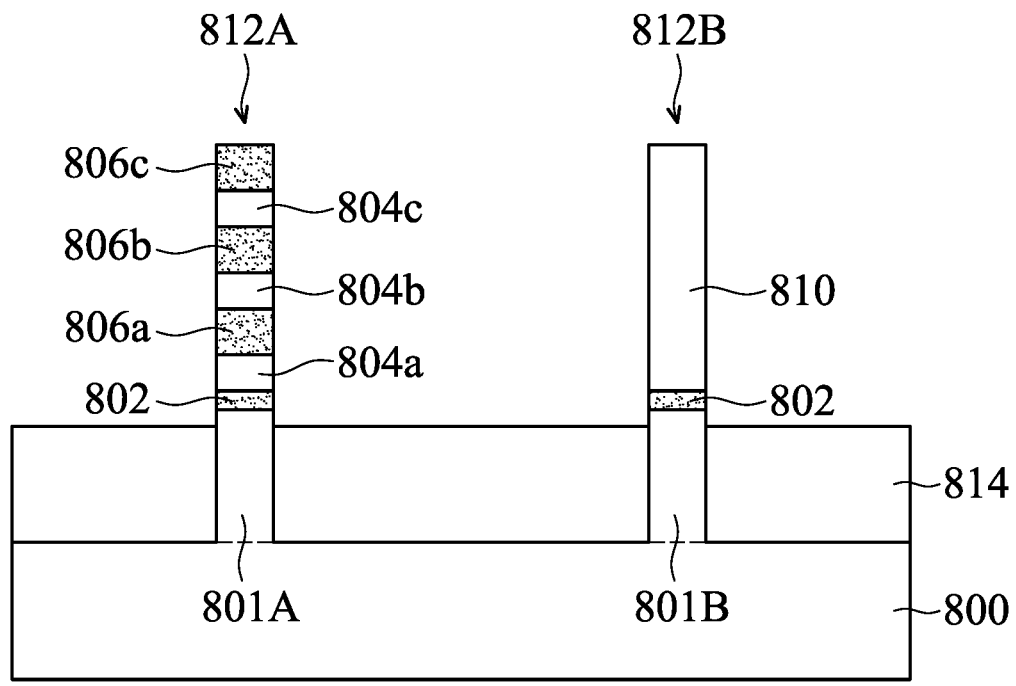

As shown in FIGS. 27E-27F, an isolation structure 814 is formed to surround the fin structures 812A and 812B, in accordance with some embodiments. The fin structure 812A has an embedded portion 801A surrounded by the isolation structure 814 and a protruding portion extending above the top surface of the isolation structure 814. The protruding portion of the fin structure 812A includes the sacrificial layer 802, the first semiconductor layers 804a-804c, and the second semiconductor layers 806a-806c. Similarly, the fin structure 812B has an embedded portion 801B surrounded by the isolation structure 814 and a protruding portion extending above the top surface of the isolation structure 814. The protruding portion of the fin structure 812B includes the sacrificial layer 802 and the second semiconductor layer 810.

In some embodiments, the isolation structure 814 is made of a dielectric material. The dielectric material may include silicon oxide, silicon nitride, silicon oxynitride, fluoride-doped silicate glass (FSG), low-K dielectric material, one or more other suitable materials, or a combination thereof. As shown in FIG. 27E, a dielectric material layer 813 is deposited over the semiconductor substrate 100, in accordance with some embodiments. The dielectric material layer 813 covers the fin structures 812A and 812B. Afterwards, the dielectric material layer 813 is planarized to expose the fin structures 812A and 812B.

In some embodiments, the dielectric material layer 813 is deposited using an FCVD process, a CVD process, an ALD process, a spin coating process, one or more other applicable processes, or a combination thereof. The planarization process may include a chemical mechanical polishing (CMP) process, a grinding process, a dry polishing process, an etching process, one or more other applicable processes, or a combination thereof.

Afterwards, one or more etching processes are used to etch back the dielectric material layer 813. As a result, the remaining portion of the dielectric material layer 813 forms the isolation structure 814, as shown in FIG. 27F.

During the planarization process and the etching back process mentioned above, the topmost layer of the semiconductor stack (i.e., the second semiconductor layer 806c) may function as a protective layer. The second semiconductor layer 806c protects the first semiconductor layer 804c to prevent it from being damaged by the planarization process and/or the etching back process. After subsequent processes, the first semiconductor layer 804c may be used to form a channel structure. Since the semiconductor layer 804c is protected during the fabrication processes, the quality and performance of the channel structure mentioned above may be improved.

Figure 27G:
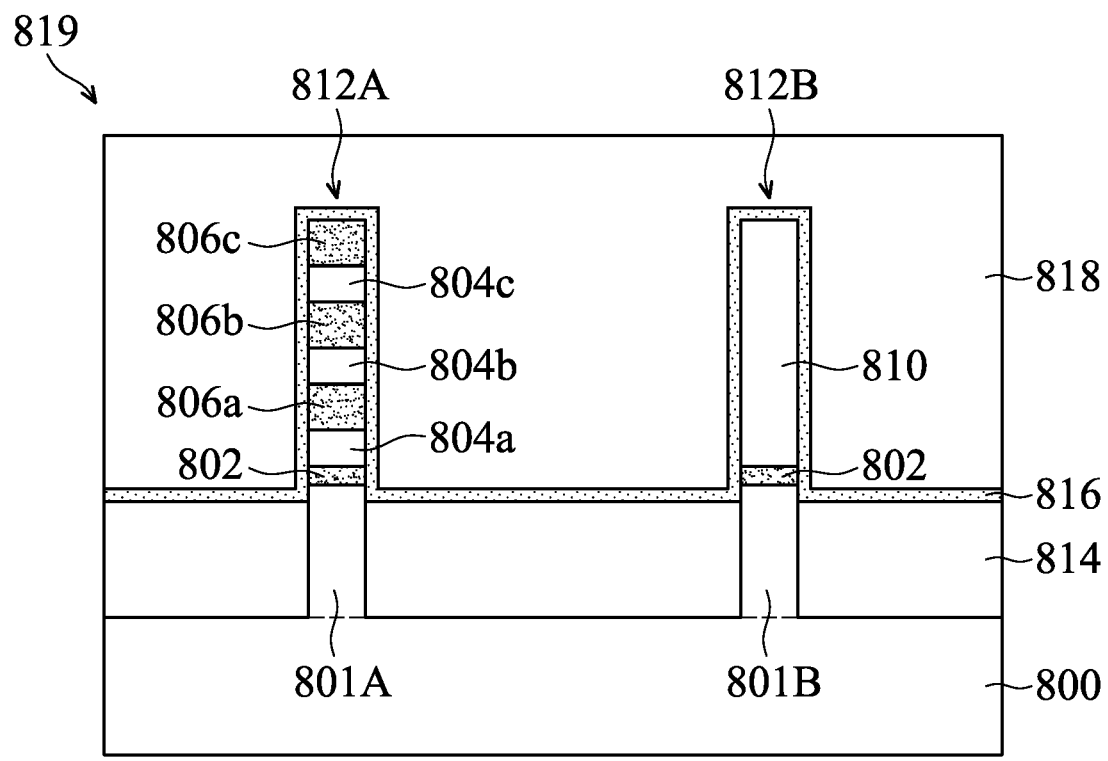

As shown in FIG. 27G, similar to the embodiments illustrated in FIG. 26E, a dummy gate stack 819 is formed over the fin structures 812A and 812B, in accordance with some embodiments. In some embodiments, the dummy gate stack 819 partially covers and extends across the fin structures 812A and 812B. In some embodiments, the dummy gate stack 819 wraps around the fin structures 812A and 812B.

In FIG. 27G, the fin structures 812A and 812B are wrapped around by the same dummy gate stack (i.e., the dummy gate stack 819). However, embodiments of the disclosure are not limited thereto. Many variations and/or modifications can be made to embodiments of the disclosure. In some other embodiments, two separate dummy gate stacks are formed to wrap around the respective fin structures 812A and 812B.

In some embodiments, the dummy gate stack 819 includes a dummy gate dielectric layer 816 and a dummy gate electrode 818, as shown in FIG. 27G. The material and formation method of the dummy gate stack 819 may be the same as or similar to those of the dummy gate stack 719 illustrated in FIG. 26E.

Afterwards, similar to the embodiments illustrated in FIGS. 15-18, epitaxial structures are formed beside the dummy gate stack 819, in accordance with some embodiments. The epitaxial structures may function as source/drain structures. Then, a dielectric layer is formed to surround the dummy gate stack 819, the epitaxial structures, and the fin structures 812A and 812B.

Figure 27H:
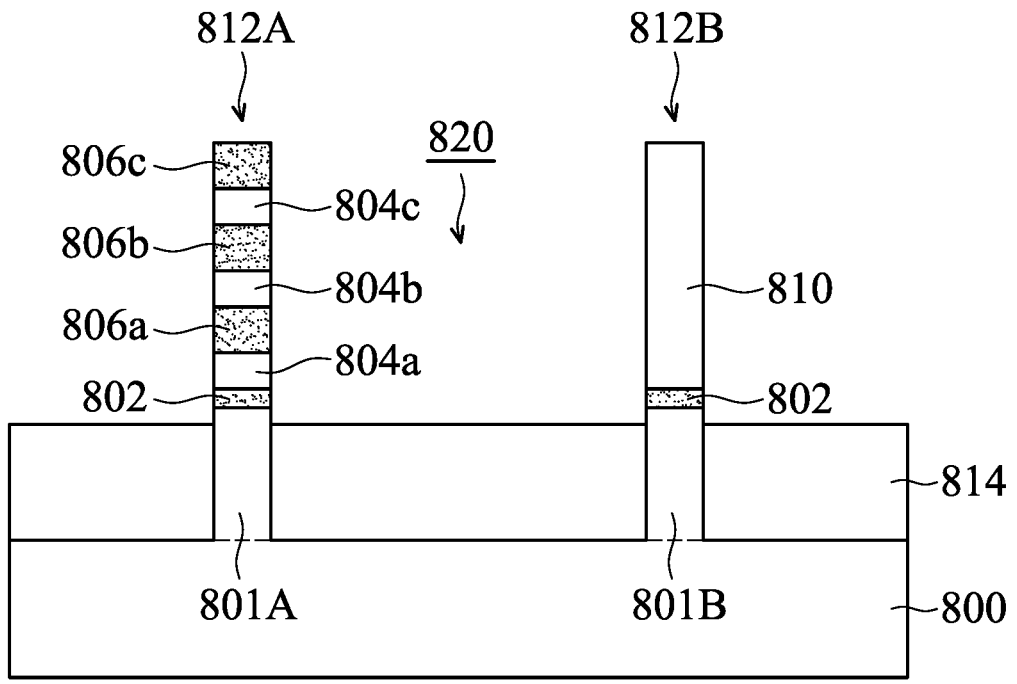

As shown in FIG. 27H, similar to the embodiments illustrated in FIG. 26F, the dummy gate stack 819 is removed to form a trench 820, in accordance with some embodiments. The dummy gate stack 819 may be removed using one or more etching processes. The trench 820 partially exposes the fin structures 812A and 812B and the isolation structure 814 while the previously formed epitaxial structures remain covered by the dielectric layer.

Figure 27I:
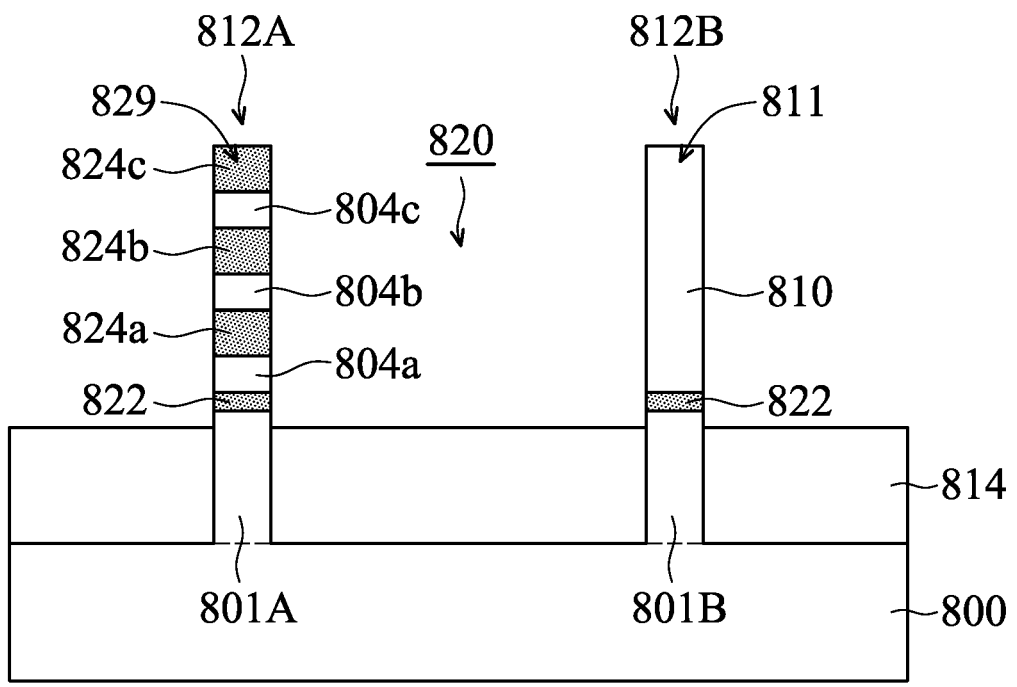

Afterwards, the sacrificial layer 802 and the second semiconductor layers 806a-806c are removed, in accordance with some embodiments. In some embodiments, the sacrificial layer 802 and the second semiconductor layers 806a-806c are oxidized before being removed. As shown in FIG. 27I, an oxidizing operation is used to oxidize the sacrificial layer 802 and the second semiconductor layers 806a-806c into semiconductor oxide layers 822 and 824a-824c, respectively. The semiconductor oxide layers 822 and 824a-824c may be made of or include silicon germanium oxide, germanium oxide, one or more other suitable semiconductor oxide materials, or a combination thereof.

In some embodiments, the sacrificial layer 802 and the second semiconductor layers 806a-806c are oxidized simultaneously. In some embodiments, the sacrificial layer 802 and the second semiconductor layers 806a-806c are oxidized in an oxygen-containing atmosphere at an elevated temperature. The oxygen-containing atmosphere may include a water-containing atmosphere, a hydrogen peroxide-containing atmosphere, an ozone-containing atmosphere, one or more other suitable atmosphere, or a combination thereof.

In some embodiments, the second semiconductor layers 806a-806c and the sacrificial layer 802 are made of a semiconductor material that is more easily oxidized than that of the first semiconductor layers 804a-804c and the semiconductor layer 810 under the same atmosphere for oxidation. Therefore, by fine-tuning the atmosphere for oxidation, the first semiconductor layers 804a-804c and the semiconductor layer 810 are substantially not oxidized or only slightly oxidized even if the second semiconductor layers 806a-806c and the sacrificial layer 802 are oxidized.

Figure 27J:
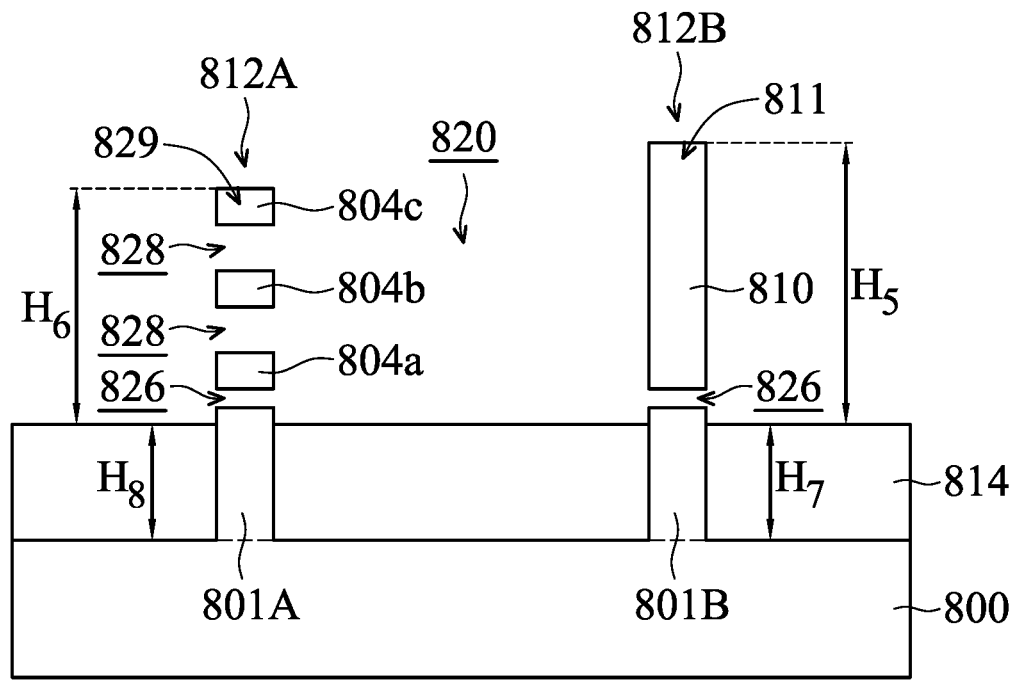

As shown in FIG. 27J, the semiconductor oxide layers 822 and 824a-824c are removed to form openings 826 and 828, in accordance with some embodiments. In some embodiments, the semiconductor oxide layers 822 and 824a-824c are removed simultaneously. In some embodiments, one or more etching processes are used to remove the semiconductor oxide layers 822 and 824a-824c.

Many variations and/or modifications can be made to embodiments of the disclosure. In some other embodiments, the second semiconductor layers 806a-806c and the sacrificial layer 802 are removed directly without being oxidized first. In these cases, one or more etching processes may be used to directly remove the second semiconductor layers 806a-806c and the sacrificial layer 802.

As shown in FIG. 27J, a stack of multiple nanostructures 829 constructed by the first semiconductor layers 804a-804c are formed, in accordance with some embodiments. The nanostructures 829 are released from the semiconductor stack after the removal of the second semiconductor layers 806a-806c. In some embodiments, the nanostructures 829 are separated from each other by the openings 828. In some embodiments, the nanostructures 829 are nanosheets, nanowires, or other nanostructures with different shapes.

The bottommost nanostructure (constructed by the first semiconductor layer 804a) is suspended above the fin structure (i.e., the embedded portion 801A of the fin structure 812A) after the removal of the sacrificial layer 802. Similar to the embodiments illustrated in FIG. 23, due to the support of the previously formed epitaxial structures, the nanostructures 829 are held and supported by the epitaxial structures without falling down.

As shown in FIG. 27J, a semiconductor fin 811 that is constructed by the semiconductor layer 810 is formed, in accordance with some embodiments. The semiconductor fin 811 is released after the removal of the sacrificial layer 802. The bottom surface of the semiconductor fin 811 is suspended above the fin structure (i.e., the embedded portion 801B of the fin structure 812B) after the removal of the sacrificial layer 802. Similarly, due to the support of the previously formed epitaxial structures, the semiconductor fin 811 is held and supported by the epitaxial structures without falling down. In some embodiments, since the top most layer of the semiconductor stack (i.e., the second semiconductor layer 806c) is removed, the top of the nanostructures 829 is positioned at a lower height level than the top of the semiconductor fin 811, as shown in FIG. 27J.

As shown in FIG. 27J, the protruding portion of the fin structure 812B (i.e., the semiconductor fin 811) has a total height $H_5$. The total height $H_5$ may be in a range from about 50 nm to about 80 nm. The embedded portion 801B of the fin structure 812B has a total height $H_7$. The total height $H_7$ may be in a range from about 30 nm to about 60 nm. In some embodiments, the total height $H_5$ is greater than the total height $H_7$. In some embodiments, the opening 826 below the semiconductor fin 811 will then be partially or completely filled with a dielectric material that is capable of providing electrical isolation between the semiconductor fin 811 and the embedded portion 801B of the fin structure 812B. Therefore, it may not be required to form the embedded portion 801B with a high thickness to prevent current leakage. The embedded portion 801B may be formed as thin as possible, which may greatly reduce the fabrication cost and improve the quality of the semiconductor device structure.

As shown in FIG. 27J, the stack of the nanostructures 829 has a total height $H_6$. The total height $H_6$ may be in a range from about 50 nm to about 70 nm. In some embodiments, the total height $H_5$ is greater than the total height $H_6$. The embedded portion 801A has a total height $H_8$. The total height $H_8$ may be in a range from about 30 nm to about 60 nm. In some embodiments, the total height $H_6$ is greater than the total height $H_8$. Similarly, in some embodiments, the opening 826 below the stack of the nanostructures 829 will then be partially or completely filled with a dielectric material that is capable of providing electrical isolation between the nanostructures 829 and the embedded portion 801A. Therefore, it may not be required to form the embedded portion 801A with a high thickness to prevent current leakage. The embedded portion 801A may be formed as thin as possible, which may greatly reduce the fabrication cost and improve the quality of the semiconductor device structure.

Figure 27K:
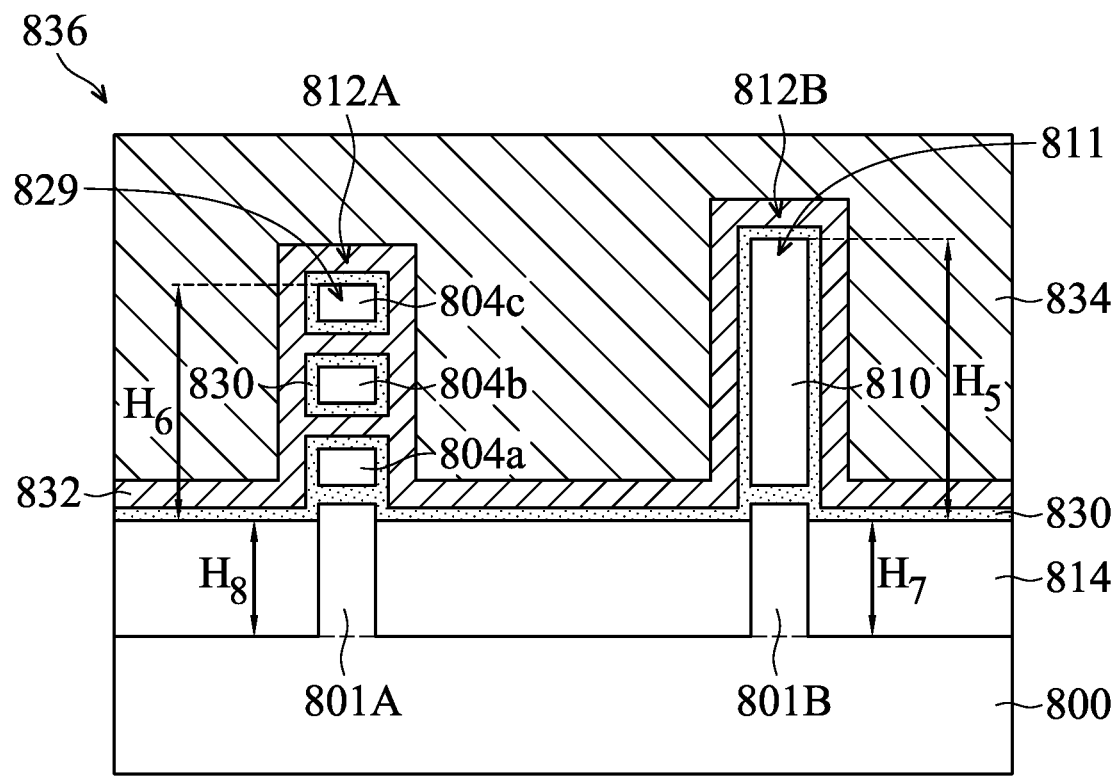

As shown in FIG. 27K, a metal gate stack 836 is formed in the trench 820, in accordance with some embodiments. Similar to the embodiments illustrated in FIG. 26I, the metal gate stack 836 wraps around each of the nanostructures 829 and extends across the fin structure 812B. In some embodiments, the metal gate stack 836 wraps around the protruding portion (i.e., the semiconductor fin 811) of the fin structure 812B. In some embodiments, the nanostructures 829 function as channel structures of a first transistor, and the semiconductor fin 811 functions as a channel structure of a second transistor.

In FIG. 27K, the nanostructures 829 and the semiconductor fin 811 are wrapped around by the same metal gate stack (i.e., the metal gate stack 836). However, embodiments of the disclosure are not limited thereto. Many variations and/or modifications can be made to embodiments of the disclosure. In some other embodiments, two separate metal gate stacks are formed, one to wrap around the nanostructures 829 and one to wrap around the semiconductor fin 811.

The metal gate stack 836 includes multiple metal gate stack layers. The metal gate stack 836 may include a gate dielectric layer 830, a work function layer 832, and a conductive filling 834. In some embodiments, the formation of the metal gate stack 836 involves the deposition of multiple metal gate stack layers over the dielectric layer to fill the trench 820. The metal gate stack layers extend into the trench 820 to wrap around each of the nanostructures 829 and the semiconductor fin 811.

The material and formation method of the gate dielectric layer 830 may be the same as or similar to the gate dielectric layer 730 illustrated in FIG. 26I. In some embodiments, the gate dielectric layer 830 completely fills the openings 826. The gate dielectric layer 830 separates the bottom of the stack of the nanostructures 829 from the embedded portion 801A. Therefore, the gate dielectric layer 830 may also be used to provide electrical isolation between the nanostructures 829 and the embedded portion 801A and electrical isolation between the semiconductor fin 811 and the embedded portion 801B. The gate dielectric layer 830 may be used to prevent current leakage, which allows the fabrication cost of the formation of the fin structures 812A and 812B and the isolation structure 814 to be significantly reduced.

In some embodiments, before the formation of the gate dielectric layer 830, an interfacial dielectric layer is formed. In some embodiments, an oxidation operation is used to oxidize the surface portions of the nanostructures 829 and the semiconductor fin 811 into the interfacial dielectric layer.

The work function layer 832 (also called a work function adjusting layer) may be used to provide the desired work function for transistors to enhance device performance. In some embodiments, the work function layer 832 is used for forming an NMOS device. The work function layer 832 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 832 is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 832 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 832 may be fine-tuned to adjust the work function level. For example, a titanium nitride layer may be used as a p-type work function layer or an n-type work function layer, depending on the thickness and/or the compositions of the titanium nitride layer.

The work function layer 832 may be deposited over the gate dielectric layer 830 using an ALD process, a CVD process, a PVD process, an electroplating process, an electroless plating process, one or more other applicable processes, or a combination thereof. In some embodiments, the portion of the work function layer 832 wrapping around the nanostructures 829 is made of an n-type work function material, and the portion of the work function layer 832 wrapping around the semiconductor fin 811 is made of a p-type work function material. In these cases, the formation of the work function layer 832 may involve multiple deposition processes and multiple patterning processes.

In some embodiments, a barrier layer is formed before the work function layer 832 to interface the gate dielectric layer 830 with subsequently formed work function layer 832. The barrier layer may also be used to prevent diffusion between the gate dielectric layer 830 and the subsequently formed work function layer 832. The barrier layer 120 may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 834 is made of or includes a metal material. The metal material may include tungsten, aluminum, copper, cobalt, one or more other suitable materials, or a combination thereof. A conductive layer used for forming the conductive filling 834 may be deposited over the work function layer 832 using a CVD process, an ALD process, a PVD process, an electroplating process, an electroless plating process, a spin coating process, one or more other applicable processes, or a combination thereof.

In some embodiments, a blocking layer is formed over the work function layer 832 before the formation of the conductive layer for forming the conductive filling 834. The blocking layer may be used to prevent the subsequently formed conductive layer from diffusing or penetrating into the work function layer 832. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trench 820, in accordance with some embodiments. As a result, the remaining portions of the metal gate stack layers in the trench 820 form the metal gate stack 836, as shown in FIG. 27K.

Figure 28:
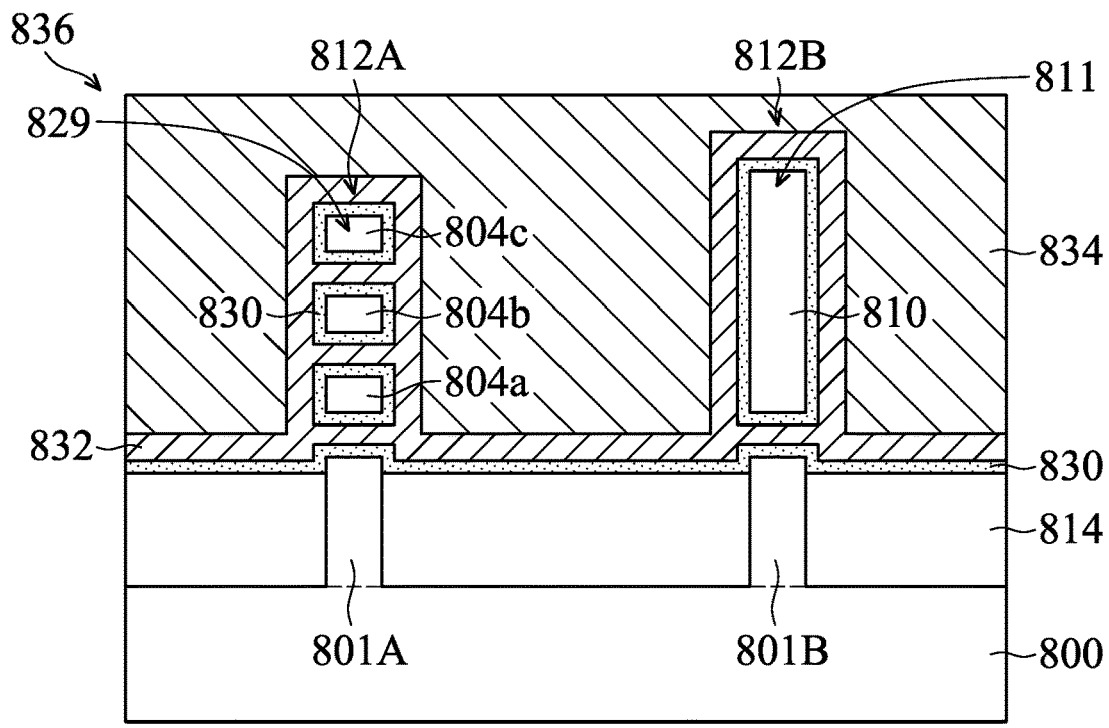
FIG. 28 is a cross-sectional view of a semiconductor device structure, in accordance with some embodiments.

Many variations and/or modifications can be made to embodiments of the disclosure. FIG. 28 is a cross-sectional view of a semiconductor device structure, in accordance with some embodiments. In some embodiments, the sacrificial layer 802 is formed to have a greater thickness that that shown in FIG. 27A. In these cases, after the removal of the sacrificial layer 802, the openings 826 are larger than those shown in FIG. 27J. In some embodiments, not only a portion of the gate dielectric layer 830 but also portions of the work function layer 832 fill into the openings 826. In some embodiments, a first portion of the work function layer 832 is between the bottom of the nanostructures 829 and the embedded portion 801A, as shown in FIG. 28. A second portion of the work function layer 832 is between the bottom of the semiconductor fin 811 and the embedded portion 801B.

Figure 29:
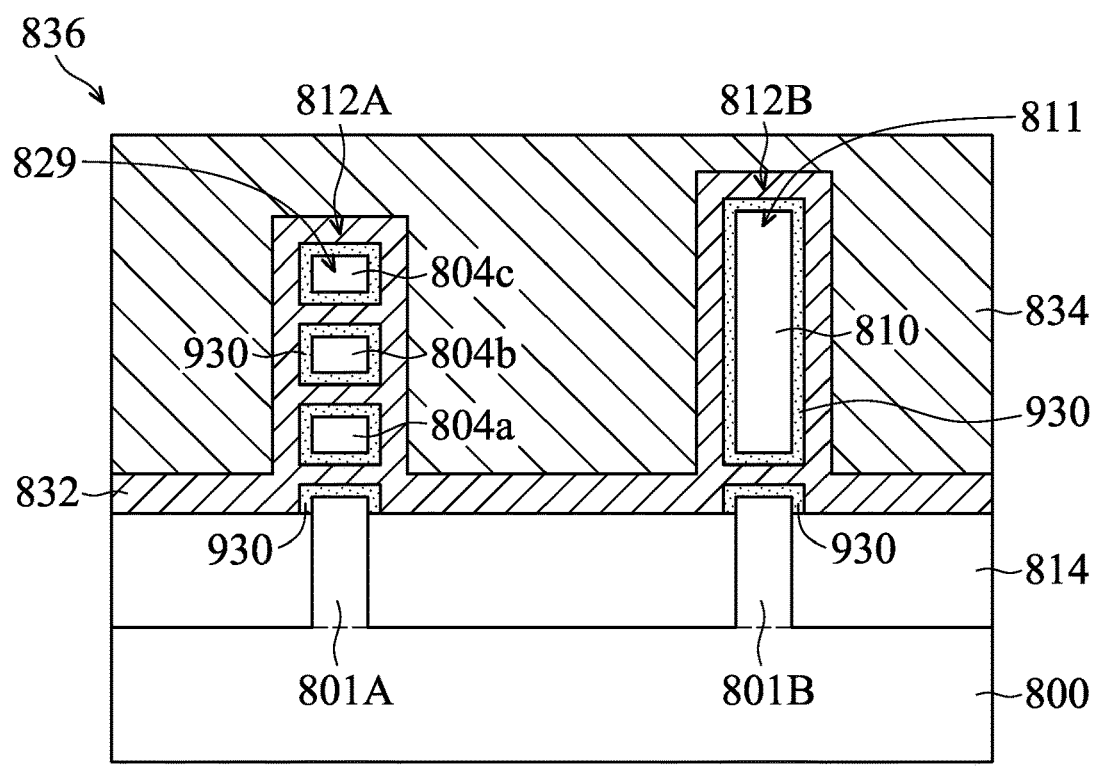
FIG. 29 is a cross-sectional view of a semiconductor device structure, in accordance with some embodiments.

Many variations and/or modifications can be made to embodiments of the disclosure. FIG. 29 is a cross-sectional view of a semiconductor device structure, in accordance with some embodiments. In some embodiments, the metal gate stack 836 includes a gate dielectric layer 930 that is selectively formed only on the surfaces of semiconductor structures including the nanostructures 829 and the semiconductor fin 811. In these cases, the gate dielectric layer 930 occupy smaller space of the trench 820, which may make the filling of other metal gate material layers easier.

In some embodiments, one or more ALD processes are used to selectively form the gate dielectric layer only on the surfaces of semiconductor structures. In some embodiments, an inhibition material is selectively formed on the elements in the trench 820 that are not made of semiconductor materials using a first ALD process. Afterwards, the gate dielectric layer 930 is selectively formed on the surfaces of elements that are made of semiconductor materials. Due to the characteristics of the inhibition material, the gate dielectric layer 930 is substantially prevented from being formed on the surface of the inhibition material that covers the elements that are not made of semiconductor materials. As a result, the gate dielectric layer 930 is selectively formed on the surfaces of the nanostructures 829 and the semiconductor fin 811. In some embodiments, the inhibition material is then removed.

In some embodiments, the semiconductor stack used for forming the nanostructures 729 (or 829) is formed before the semiconductor layer 710 (or 810) used for forming the semiconductor fin 711 (or 811). However, embodiments of the disclosure are not limited thereto. Many variations and/or modifications can be made to embodiments of the disclosure.

Figure 30A:
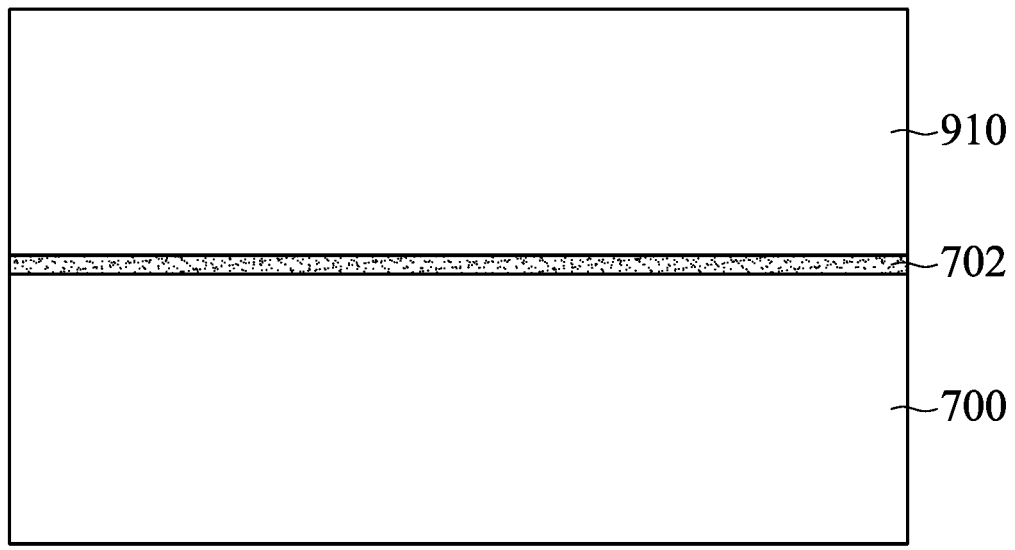
FIGS. 30A-30C are cross-sectional views of various stages of a process for forming a semiconductor device structure, in accordance with some embodiments.
Figure 30B:
Figure 30C:
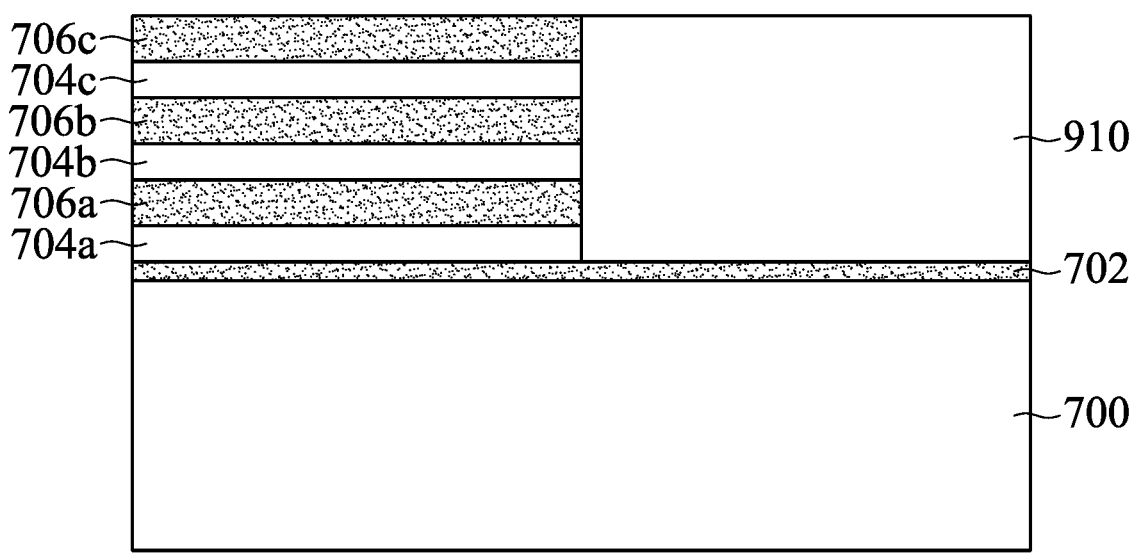

FIGS. 30A-30C are cross-sectional views of various stages of a process for forming a semiconductor device structure, in accordance with some embodiments. As shown in FIG. 30A, a semiconductor layer 910 is formed over the sacrificial layer 702, in accordance with some embodiments. The material and formation method of the semiconductor layer 910 may be the same as or similar to those of the semiconductor layer 710.

As shown in FIG. 30B, the semiconductor layer 910 is patterned to form an opening 908 that exposes the sacrificial layer 702, in accordance with some embodiments.

As shown in FIG. 30C, a semiconductor stack is formed in the opening 908, in accordance with some embodiments. The semiconductor stack may include multiple first semiconductor layers 704a-704c and multiple second semiconductor layers 706a-706c. In some embodiments, the first semiconductor layers 704a-704c and the second semiconductor layers 706a-706c are laid out alternately, as shown in FIG. 30C.

Afterwards, the processes similar to those illustrated in FIGS. 26D-26I, FIG. 27D-27K, 28, or 29 may be performed to form the semiconductor device structure.

Embodiments of the disclosure form a semiconductor device structure with hybrid fin structures. The hybrid fin structure includes a stack of nanostructures and a semiconductor fin. A dielectric layer (such as a gate dielectric layer is formed between the fin structures and the embedded fins. Therefore, the embedded fins may be formed as thin as possible. The associated fabrication cost is therefore reduced. During the formation of the nanostructure, a top sacrificial layer is formed to protect the nanostructures thereunder. The protected nanostructures therefore have good quality to function as, for example, channel structures. The reliability and performance of the semiconductor device structure are greatly improved.

In accordance with some embodiments, a semiconductor device structure is provided. The semiconductor device structure includes a semiconductor substrate and an isolation structure over the semiconductor substrate. The semiconductor device structure also includes a first fin structure over the semiconductor substrate and surrounded by the isolation structure and a stack of nanostructures over the first fin structure. The nanostructures are separated from each other. The semiconductor device structure further includes a second fin structure over the semiconductor substrate. The second fin structure has an embedded portion surrounded by the isolation structure and a protruding portion over the isolation structure. The embedded portion is separated from the protruding portion by a distance.

In accordance with some embodiments, a semiconductor device structure is provided. The semiconductor device structure includes a semiconductor substrate and a stack of nanostructures. The nanostructures are separated from each other. The semiconductor device structure also includes a fin structure over the semiconductor substrate. A top of the fin structure is at a higher height level than a top of the nanostructures.

In accordance with some embodiments, a method for forming a semiconductor device structure is provided. The method includes forming a sacrificial layer over a semiconductor substrate. The method also includes forming a semiconductor stack over a first region of the sacrificial layer. The semiconductor stack has multiple first semiconductor layers and multiple second semiconductor layers laid out alternately. The method further includes forming a third semiconductor layer over a second region of the sacrificial layer. In addition, the method includes patterning the semiconductor stack, the third semiconductor layer, and the sacrificial layer to form a first fin structure and a second fin structure. The first fin structure includes a portion of the semiconductor stack, and the second fin structure includes a portion of the third semiconductor layer. The method also includes removing the sacrificial layer and the second semiconductor layers so that multiple nanostructures constructed by the first semiconductor layers are formed. The method further includes forming a dielectric layer to wrap around each of the nanostructures and to wrap around the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   an isolation structure over the semiconductor substrate;
   a first fin structure over the semiconductor substrate and surrounded by the isolation structure;
   a stack of nanostructures over the first fin structure, wherein the nanostructures are separated from each other;
   a second fin structure over the semiconductor substrate, wherein the second fin structure has an embedded portion surrounded by the isolation structure and a protruding portion over the isolation structure, and the embedded portion is separated from the protruding portion by a distance; and
   a metal gate stack over the nanostructures, wherein the metal gate stack comprises a gate dielectric layer and a work function layer, and the work function layer is prevented from being between a bottom of the nanostructures and the first fin structure by the gate dielectric layer.

2. The semiconductor device structure as claimed in claim 1, wherein a total height of the stack of the nanostructures is greater than a total height of the first fin structure.

3. The semiconductor device structure as claimed in claim 2, wherein a total height of the protruding portion of the second fin structure is greater than a total height of the embedded portion of the second fin structure.

4. The semiconductor device structure as claimed in claim 3, wherein a total height of the protruding portion of the second fin structure is greater than a total height of the stack of the nanostructures.

5. The semiconductor device structure as claimed in claim 1, wherein a total height of the protruding portion of the second fin structure is greater than a total height of the stack of nanostructures.

6. The semiconductor device structure as claimed in claim 1, wherein the metal gate stack wraps around each of the nanostructures.

7. The semiconductor device structure as claimed in claim 6, wherein a portion of the gate dielectric layer separates the bottom of the nanostructures from the first fin structure.

8. The semiconductor device structure as claimed in claim 1, a portion of the gate dielectric layer is between the embedded portion and the protruding portion.

9. The semiconductor device structure as claimed in claim 8, wherein the portion of the gate dielectric layer has a thickness substantially equal to the distance between the embedded portion and the protruding portion.

10. A semiconductor device structure, comprising:
    a semiconductor substrate;
    a stack of nanostructures, wherein the nanostructures are separated from each other;
    a fin structure over the semiconductor substrate, wherein a top of the fin structure is at a higher height level than a top of the nanostructures; and
    a metal gate stack wrapping around each of the nanostructures and extending across the fin structure, wherein the metal gate stack comprises a gate dielectric layer and a work function layer, and the work function layer is prevented from being between a bottom of the nanostructures and the semiconductor substrate by the gate dielectric layer.

11. The semiconductor device structure as claimed in claim 10, wherein a first portion of the gate dielectric layer is between a bottom of the nanostructures and the semiconductor substrate, and a second portion of the gate dielectric layer is between a bottom of the fin structure and the semiconductor substrate.

12. The semiconductor device structure as claimed in claim 10, further comprising:
    an isolation structure over the semiconductor substrate;
    a first embedded fin surrounded by the isolation structure and directly below the stack of the nanostructures, wherein a top of the first embedded fin and a bottom of the nanostructures are separated from each other, and a total height of the nanostructures is greater than a total height of the first embedded fin; and
    a second embedded fin surrounded by the isolation structure and directly below the fin structure, wherein a top of the second embedded fin and a bottom of the fin structure are separated from each other, and a total height of the fin structure is greater than a total height of the second embedded fin.

13. The semiconductor device structure as claimed in claim 1, wherein the gate dielectric layer wraps around a sidewall and a top of the embedded portion of the second fin structure.

14. The semiconductor device structure as claimed in claim 10, wherein the work function layer is prevented from being between a bottom of the fin structure and the semiconductor substrate by the gate dielectric layer.

15. The semiconductor device structure as claimed in claim 10, wherein a first portion of the gate dielectric layer wrapping around the nanostructures is substantially as thick as a second portion of the gate dielectric layer wrapping around the fin structure.

16. A semiconductor device structure, comprising:
    a semiconductor substrate;
    a stack of nanostructures suspended over the semiconductor substrate, wherein the nanostructures are separated from each other;
    a semiconductor structure suspended over the semiconductor substrate, wherein the semiconductor structure is longer than each of the nanostructures; and
    a metal gate stack wrapping around the nanostructures, wherein the metal gate stack comprises a gate dielectric layer and a work function layer, and the work function layer is prevented from being between a bottommost surface of the nanostructures and the semiconductor substrate by the gate dielectric layer.

17. The semiconductor device structure as claimed in claim 16, wherein the work function layer is prevented from being between a bottommost surface of the semiconductor structure and the semiconductor substrate by the gate dielectric layer.

18. The semiconductor device structure as claimed in claim 17, wherein the metal gate stack further wraps around the semiconductor structure.

19. The semiconductor device structure as claimed in claim 18, wherein a first portion of the gate dielectric layer is between the semiconductor substrate and the bottommost surface of the nanostructures, and a second portion of the gate dielectric layer is between the semiconductor substrate and a bottommost surface of the semiconductor structure.

20. The semiconductor device structure as claimed in claim 17, wherein a topmost surface of the nanostructures is closer to the semiconductor substrate than a topmost surface of the semiconductor structure.

* * * * *